US012660476B2

(12) United States Patent
Nakamura et al.

(10) Patent No.: US 12,660,476 B2
(45) Date of Patent: Jun. 16, 2026

(54) DISPLAY DEVICE

(71) Applicant: SEMICONDUCTOR ENERGY LABORATORY CO., LTD., Atsugi (JP)

(72) Inventors: Daiki Nakamura, Atsugi (JP); Sho Kato, Isehara (JP); Kenichi Okazaki, Atsugi (JP); Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 355 days.

(21) Appl. No.: 18/273,070

(22) PCT Filed: Jan. 14, 2022

(86) PCT No.: PCT/IB2022/050282
§ 371 (c)(1),
(2) Date: Jul. 19, 2023

(87) PCT Pub. No.: WO2022/162485
PCT Pub. Date: Aug. 4, 2022

(65) Prior Publication Data
US 2024/0130204 A1 Apr. 18, 2024

(30) Foreign Application Priority Data
Jan. 27, 2021 (JP) .................................. 2021-011385

(51) Int. Cl.
*H10K 59/131* (2023.01)
*H10K 50/13* (2023.01)
(Continued)

(52) U.S. Cl.
CPC ....... *H10K 59/80522* (2023.02); *H10K 50/13* (2023.02); *H10K 50/171* (2023.02);
(Continued)

(58) Field of Classification Search
CPC ....................... H10K 59/131; H10K 59/80522
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001862825 A 11/2006
EP 1722425 A 11/2006
(Continued)

OTHER PUBLICATIONS

International Search Report (Application No. PCT/IB2022/050282) Dated Apr. 26, 2022.
(Continued)

*Primary Examiner* — Christopher M Raabe
(74) *Attorney, Agent, or Firm* — NIXON PEABODY LLP; Jeffrey L. Costellia

(57) ABSTRACT

A display device with both high display quality and high resolution is provided. The display device includes a light-emitting element and a connection portion. The connection portion is provided along an outer periphery of a display region where the light-emitting element is provided. The light-emitting element includes a pixel electrode, a first EL layer over the pixel electrode, a second EL layer over the first EL layer, and a common electrode over the second EL layer. The connection portion includes a connection electrode, a second EL layer over the connection electrode, and the common electrode over the second EL layer. The second EL layer includes a first region in contact with the connection electrode and a second region in contact with the common electrode. The area of a region where the first region and the second region overlap with each other in a top
(Continued)

<u>100</u>

<u>100</u> view is greater than or equal to 40000 square micrometers. The second EL layer includes a region where the film thickness is greater than or equal to 0.5 nm and less than or equal to 1.5 nm. The second EL layer contains a substance with a high electron-injection property.

9 Claims, 31 Drawing Sheets

(51) Int. Cl.

| | |
|---|---|
| *H10K 50/17* | (2023.01) |
| *H10K 59/35* | (2023.01) |
| *H10K 59/80* | (2023.01) |
| *H10K 102/00* | (2023.01) |

(52) U.S. Cl.
CPC ......... *H10K 59/131* (2023.02); *H10K 59/353* (2023.02); *H10K 59/8791* (2023.02); *H10K 2102/351* (2023.02)

(58) Field of Classification Search
USPC ................................................ 313/498–512
See application file for complete search history.

(56) References Cited

U.S. PATENT DOCUMENTS

| | | | | |
|---|---|---|---|---|
| 7,605,536 | B2 | 10/2009 | Kim | |
| 7,915,818 | B2 | 3/2011 | Kim | |
| 2002/0072139 | A1 | 6/2002 | Kashiwabara | |
| 2002/0113546 | A1 | 8/2002 | Seo et al. | |
| 2005/0140279 | A1 | 6/2005 | Park | |
| 2006/0255726 | A1 | 11/2006 | Kim | |
| 2009/0130786 | A1 | 5/2009 | Park | |
| 2009/0261713 | A1 | 10/2009 | Choi et al. | |
| 2011/0148290 | A1 | 6/2011 | Oota | |
| 2012/0007497 | A1 | 1/2012 | Lee et al. | |
| 2012/0104422 | A1* | 5/2012 | Lee | H10K 59/80521 |
| | | | | 438/34 |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2020/0203662 | A1 | 6/2020 | Mollard et al. | |
| 2022/0209162 | A1 | 6/2022 | Seo et al. | |
| 2024/0389430 | A1* | 11/2024 | Liu | H10K 50/11 |

FOREIGN PATENT DOCUMENTS

| | | |
|---|---|---|
| JP | 2000-036385 A | 2/2000 |
| JP | 2002-324673 A | 11/2002 |
| JP | 2003-059663 A | 2/2003 |
| JP | 2006-318910 A | 11/2006 |
| JP | 2008-098106 A | 4/2008 |
| JP | 2008-147072 A | 6/2008 |
| JP | 2008-251270 A | 10/2008 |
| JP | 2012-160473 A | 8/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| KR | 2005-0070388 A | 7/2005 |
| KR | 2006-0117481 A | 11/2006 |
| KR | 2009-0110622 A | 10/2009 |
| KR | 10-1182268 | 9/2012 |

OTHER PUBLICATIONS

Written Opinion (Application No. PCT/IB2022/050282) Dated Apr. 26, 2022.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Papadopoulos.N et al., "AMOLED Displays with In-Pixel Photodetector", Liquid Crystals and Display Technology, Jul. 9, 2020, pp. 1-19.
Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Zakhidov.A et al., "Orthogonal processing: A new strategy for organic electronics", Chem. Sci. (Chemical Science), Apr. 7, 2011, vol. 2, No. 6, pp. 1178-1182.

* cited by examiner

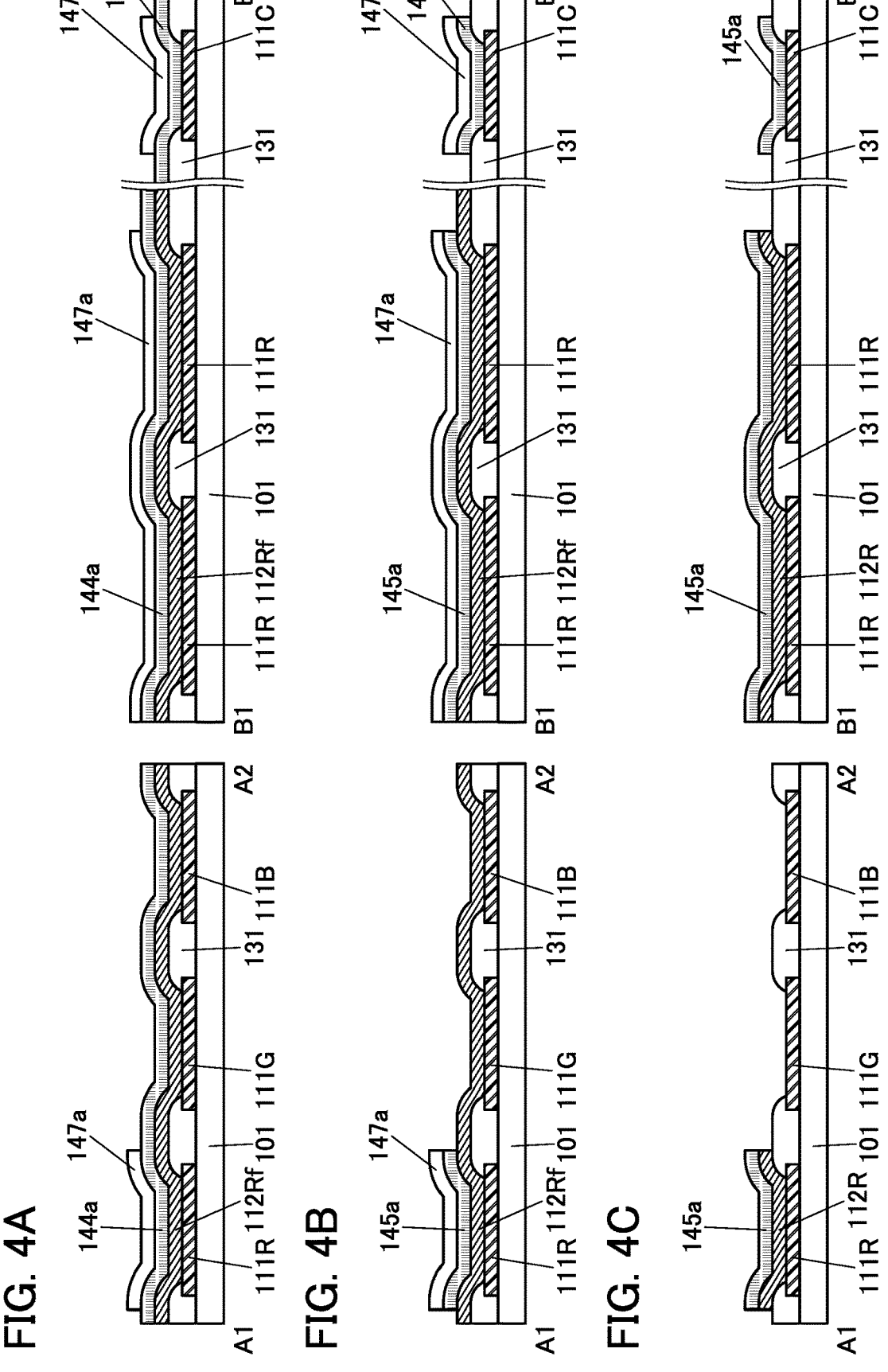

FIG. 7A
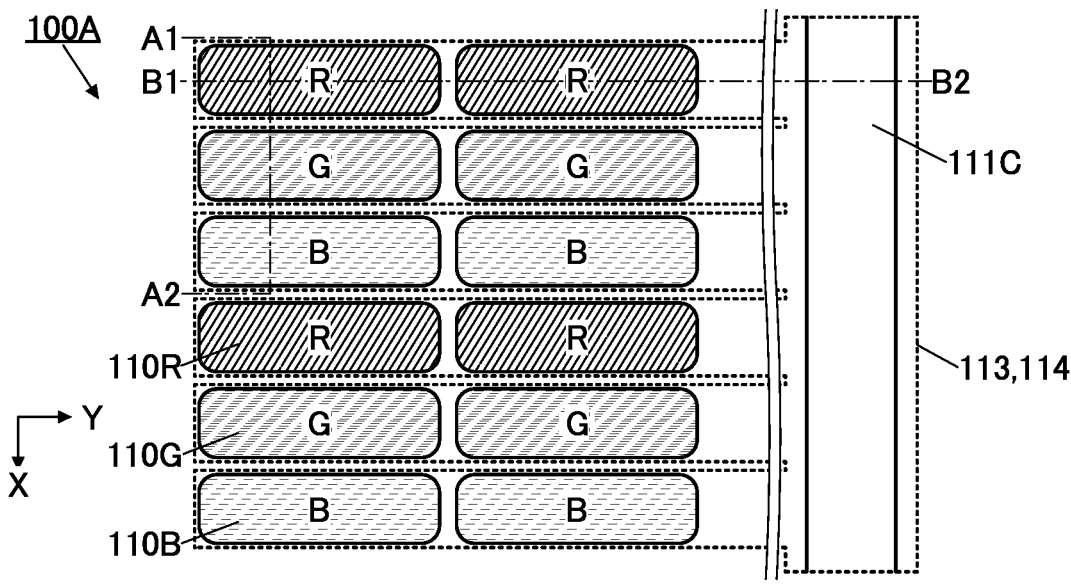
FIG. 7B
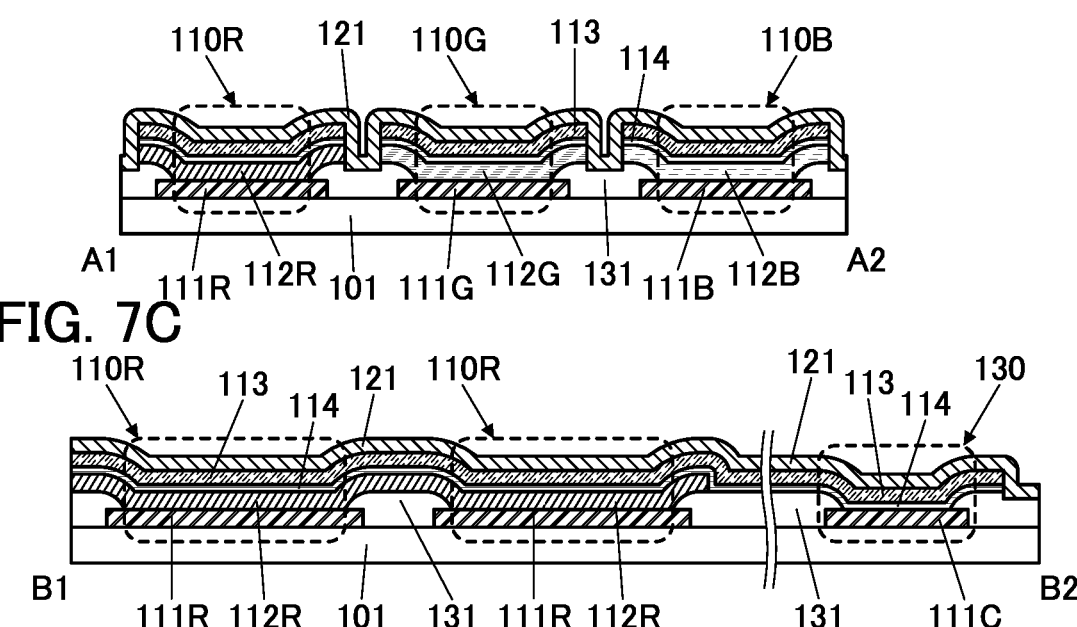
FIG. 7C

FIG. 27A
FIG. 27B
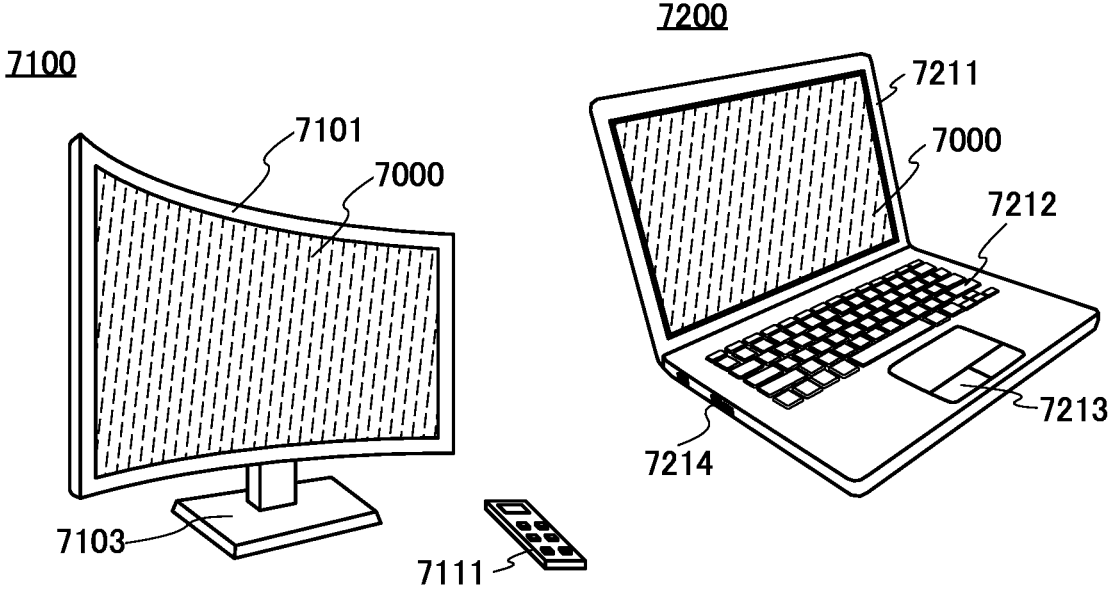
FIG. 27C
FIG. 27D
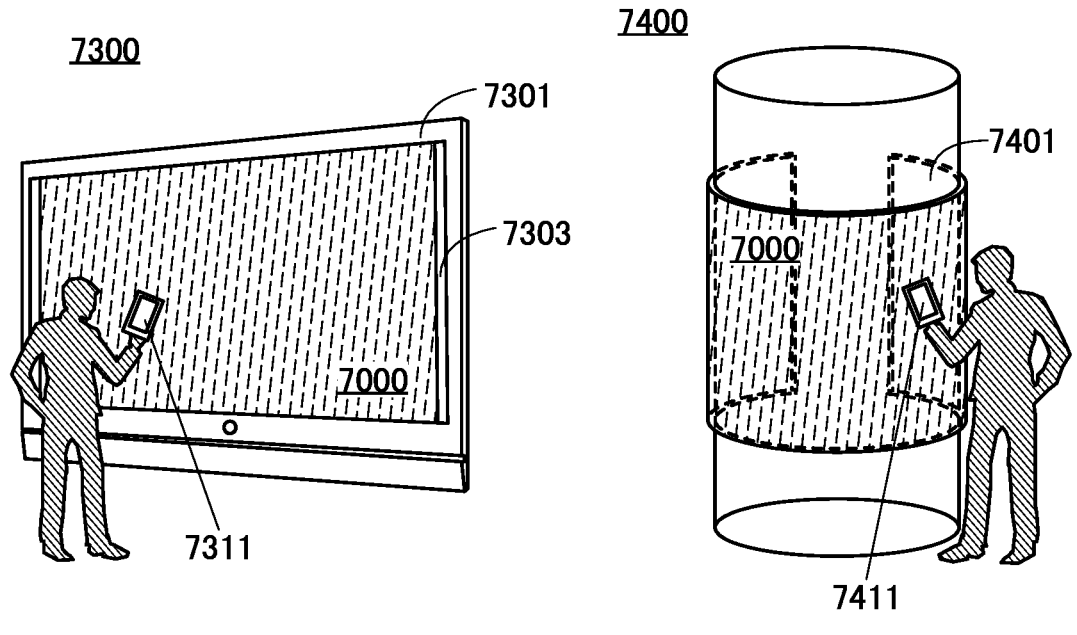

FIG. 28A
8100
8101
8102
8103
8006
8004
8001
8002
8003
8000
FIG. 28B
8200
8201
8202
8206
8205
8203
8204
FIG. 28C
8300
8301
8304
8304
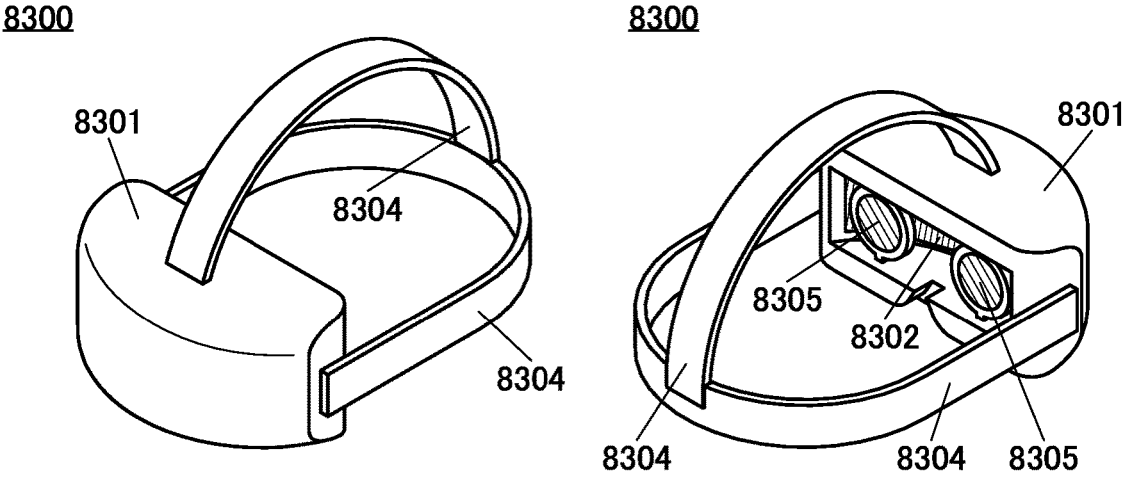
FIG. 28D
8300
8301
8305
8302
8304
8304
8305
FIG. 28E
8300
8305
8301
8302
8305
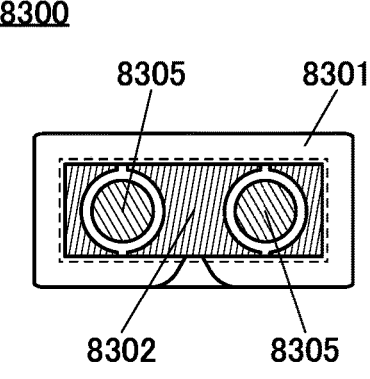
FIG. 28F
8400
8402
8403
8405
8401
8404
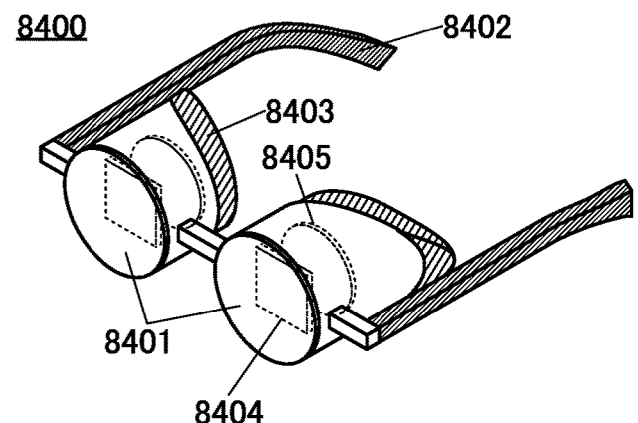

FIG. 29A
9101
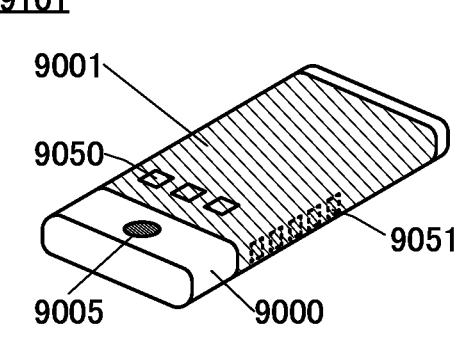
FIG. 29B
9102
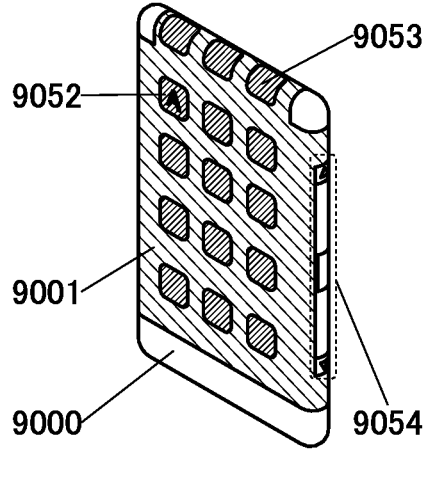
FIG. 29C
9200
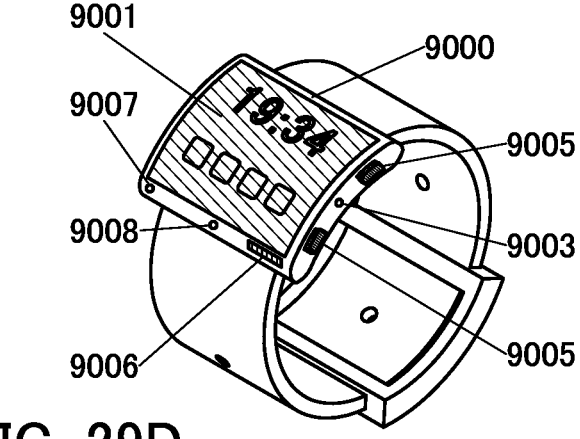
FIG. 29D
9201
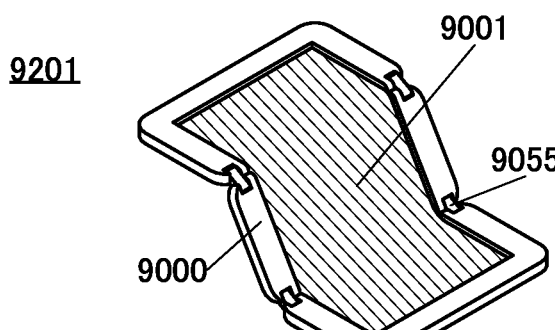
FIG. 29E
9201
FIG. 29F
9201
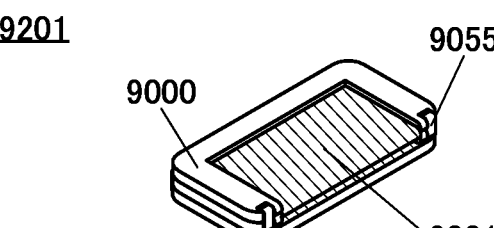

900

DISPLAY DEVICE

TECHNICAL FIELD

One embodiment of the present invention relates to a display device. One embodiment of the present invention relates to a method for manufacturing a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic apparatus, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop computer. Furthermore, higher resolution has been required for a stationary display device such as a television device or a monitor device along with an increase in definition. Furthermore, a device for virtual reality (VR) or augmented reality (AR) is given as an example of a device required to have the highest resolution.

Examples of a display device that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By applying a voltage to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

An object of one embodiment of the present invention is to provide a display device that can easily achieve a higher resolution and a manufacturing method thereof. An object of one embodiment of the present invention is to provide a display device with both high display quality and high resolution. An object of one embodiment of the present invention is to provide a display device with high contrast.

An object of one embodiment of the present invention is to provide a highly reliable display device.

An object of one embodiment of the present invention is to provide a display device having a novel structure or a manufacturing method of the display device. An object of one embodiment of the present invention is to provide a method for manufacturing the above-described display device with high yield. An object of one embodiment of the present invention is to reduce at least one of problems of the conventional technique.

Note that the description of these objects does not preclude the existence of other objects. Note that one embodiment of the present invention does not have to achieve all the objects. Objects other than these can be derived from the description of the specification, the drawings, the claims, and the like.

Means for Solving the Problems

One embodiment of the present invention is a display device including a light-emitting element and a connection portion. The connection portion is provided along an outer periphery of a display region where the light-emitting element is provided. The light-emitting element includes a pixel electrode, a first EL layer over the pixel electrode, a second EL layer over the first EL layer, and a common electrode over the second EL layer. The connection portion includes a connection electrode, the second EL layer over the connection electrode, and the common electrode over the second EL layer. The second EL layer includes a first region in contact with the connection electrode and a second region in contact with the common electrode. The area of a region where the first region and the second region overlap with each other in a top view is greater than or equal to 40000 $\mu m^2$. The second EL layer includes a region where the film thickness is greater than or equal to 0.5 nm and less than or equal to 1.5 nm. The second EL layer contains a substance with a high electron-injection property.

One embodiment of the present invention is a display device including a light-emitting element and a connection portion. The connection portion is provided along an outer periphery of a display region where the light-emitting element is provided. The light-emitting element includes a pixel electrode, an insulating layer over the pixel electrode, a first EL layer over the pixel electrode and over the insulating layer, a second EL layer over the first EL layer, and a common electrode over the second EL layer. The connection portion includes a connection electrode, the insulating layer over the connection electrode, the second EL layer over the connection electrode and over the insulating layer, and the common electrode over the second EL layer. The second EL layer includes a third region and a second region that are respectively in contact with the connection electrode and the common electrode through a first opening included in the insulating layer. The area of a region where the third region and the second region overlap with each other in a top view is greater than or equal to 40000 $\mu m^2$. The second EL layer includes a region where the film thickness is greater than or equal to 0.5 nm and less than or equal to 1.5 nm. The second EL layer contains a substance with a high electron-injection property.

In the above display device, the first EL layer preferably includes a region in contact with the pixel electrode through a second opening included in the insulating layer. In the above display device, the first EL layer preferably contains a light-emitting compound, and the second EL layer preferably contains lithium fluoride.

In the above display device, the connection portion preferably has a top surface shape with a comb-like shape or a slit.

Effect of the Invention

According to one embodiment of the present invention, a display device that can easily achieve a higher resolution and a manufacturing method thereof can be provided. A display device with both high display quality and high resolution can be provided. A display device with high contrast can be provided. A highly reliable display device can be provided.

According to one embodiment of the present invention, a display device having a novel structure or a manufacturing method of the display device can be provided. A method for manufacturing the above display device with high yield can be provided. According to one embodiment of the present invention, at least one of problems of the conventional technique can be at least reduced.

Note that the description of these effects does not preclude the existence of other effects. Note that one embodiment of the present invention does not need to have all the effects. Effects other than these can be derived from the description of the specification, the drawings, the claims, and the like.

BRIEF DESCRIPTION OF THE DRAWINGS

FIG. 3A to FIG. 3C are diagrams illustrating an example of a method for manufacturing a display device.

FIG. 4A to FIG. 4C are diagrams illustrating an example of a method for manufacturing a display device.

FIG. 7A to FIG. 7C are diagrams illustrating a structure example of a display device.

FIG. 10A and FIG. 10B are diagrams illustrating an example of a method for manufacturing a display device.

FIG. 12 is a diagram illustrating a structure example of a display device.

FIG. 27A to FIG. 27D are diagrams illustrating examples of electronic apparatuses.

FIG. 28A to FIG. 28F are diagrams illustrating examples of electronic apparatuses.

FIG. 29A to FIG. 29F are diagrams illustrating examples of electronic apparatuses.

MODE FOR CARRYING OUT THE INVENTION

Figure 1A:
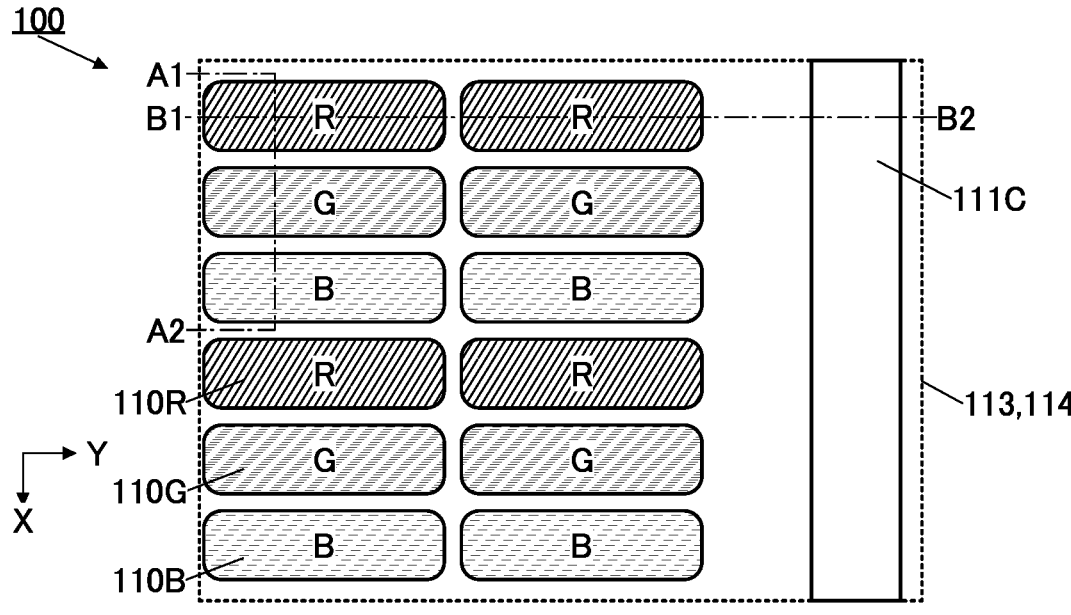
FIG. 1A to FIG. 1C are diagrams illustrating a structure example of a display device.

Hereinafter, embodiments are described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments. Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

In each drawing described in this specification, the size, the layer thickness, or the region of each component is exaggerated for clarity in some cases. Therefore, they are not limited to the illustrated scale.

In this specification and the like, the ordinal numbers such as "first" and "second" are used in order to avoid confusion among components and do not limit the number.

In this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a structure in which light-emitting layers in light-emitting devices of different colors (here, blue (B), green (G), and red (R)) are separately formed or separately patterned may be referred to as a SBS (Side By Side) structure. In this specification and the like, a light-emitting device capable of emitting white light may be referred to as a white-light-emitting device. Note that a combination of white-light-emitting devices with coloring layers (e.g., color filters) enables full-color display devices.

Structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more of light-emitting layers are selected such that their emission colors are complementary to each other. For example, when emission color of a first light-emitting layer and emission color a second light-emitting layer are complementary colors, the light-emitting device can be configured to emit white light as a whole. The same applies to a light-emitting device including three or more light-emitting layers.

A device having a tandem structure includes two or more light-emitting units between a pair of electrode, and each light-emitting unit preferably includes one or more light-emitting layers. To obtain white light emission, the structure is made so that light from light-emitting layers of the light-emitting units can be combined to be white light. Note that a structure for obtaining white light emission is similar to that in the case of a single structure. In the device having a tandem structure, it is preferable that an intermediate layer such as a charge-generation layer is provided between a plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, the light-emitting device having an SBS structure is suitably used. Meanwhile, the white-light-emitting device is suitable in terms of lower manufacturing cost or higher manufacturing yield because the manufacturing process of the white-light-emitting device is simpler than that of the light-emitting device having an SBS structure.

In this specification, in the case where the maximum value and the minimum value are specified, a structure in which the maximum value and the minimum value are freely combined is also disclosed.

Embodiment 1

In this embodiment, a structure example of a display device of one embodiment of the present invention and an example of a method for manufacturing the display device are described.

One embodiment of the present invention is a display device including a light-emitting element (also referred to as a light-emitting device). The display device includes at least two light-emitting elements which emit light of different colors. The light-emitting elements each include a pair of electrodes and an EL layer therebetween. The light-emitting elements are preferably organic EL elements (organic electroluminescent elements). The two or more light-emitting elements emitting different colors include respective EL layers containing different materials. For example, three kinds of light-emitting elements emitting red (R), green (G), and blue (B) light are included, whereby a full-color display device can be obtained.

Here, in the case where the EL layers are separately formed for light-emitting elements of different colors, an evaporation method using a shadow mask such as a metal mask is known. However, this method causes a deviation from the designed shape and position of an island-shaped organic film due to various influences such as the low accuracy of the metal mask, the positional deviation between the metal mask and a substrate, a warp of the metal mask, and the vapor-scattering-induced expansion of outline of the deposited film; accordingly, it is difficult to achieve high resolution and high aperture ratio of the display device. Thus, a measure has been taken for pseudo improvement in resolution (also referred to as pixel density) by employing a unique pixel arrangement such as a PenTile pattern.

In one embodiment of the present invention, fine patterning of an EL layer is performed without a shadow mask such as a metal mask. Thus, a display device with high resolution and a high aperture ratio, which has been difficult to achieve, can be obtained. Moreover, the EL layers can be formed separately, enabling the display device to perform extremely clear display with high contrast and high display quality.

Here, a description is made on a case where EL layers are separately formed for light-emitting elements exhibiting two colors, for simplicity. First, a stack of a first EL film and a first sacrificial film (also referred to as a mask film) is formed to cover two pixel electrodes. Next, a resist mask is formed over the first sacrificial film in a position overlapping with one pixel electrode (a first pixel electrode). Then, the resist mask, part of the first sacrificial film, and part of the first EL film are etched. At this time, the etching is stopped at the time when the other pixel electrode (a second pixel electrode) is exposed. Thus, part of the first EL film processed into a belt-like or island shape (also referred to as a first EL layer) can be formed over the first pixel electrode, and part of the sacrificial film (also referred to as a first sacrificial layer) can be formed thereover. Note that in this specification and the like, the term "island shape" refers to a state where two or more layers formed using the same material in the same step are physically separated from each other.

Next, a stack of a second EL film and a second sacrificial film is formed. Then, a resist mask is formed in a position overlapping with the second pixel electrode. Subsequently, part of the second sacrificial film and part of the second EL film which do not overlap with the resist mask are etched in a manner similar to the above. As a result, the first EL layer and the first sacrificial layer (also referred to as a mask layer) are provided over the first pixel electrode, and a second EL layer and a second sacrificial layer are provided over the second pixel electrode. In this manner, the first EL layer and the second EL layer can be formed separately. Finally, the first sacrificial layer and the second sacrificial layer are removed to expose the first EL layer and the second EL layer, and then the common electrode is formed, so that the light-emitting elements of two colors can be formed separately.

Furthermore, by repeating the above-described steps, EL layers in light-emitting elements of three or more colors can be separately formed, so that a display device including light-emitting elements of three or four or more colors can be achieved.

Here, an electrode (also referred to as a first electrode, a connection electrode, or the like) can be formed on the same plane as the pixel electrode in order to supply a potential to the common electrode, whereby the connection electrode is electrically connected to the common electrode. The connection electrode is placed outside the display portion where the pixels are provided. Here, in order to prevent a top surface of the connection electrode from being exposed in etching of the first EL film, it is preferable that the first sacrificial layer be also provided over the connection electrode. Also in etching of the second EL film, the second sacrificial layer is preferably provided over the connection electrode. The first sacrificial layer and the second sacrificial layer provided over the connection electrode can be removed by etching at the same time as the first sacrificial layer over the first EL layer and the second sacrificial layer over the second EL layer.

Although it is difficult to set the distance between the EL layers of different colors to be less than 10 μm by a formation method using a metal mask, for example, the above method can shorten the distance to be less than or equal to 3 μm, less than or equal to 2 μm, or less than or equal to 1 μm. For example, with use of an exposure tool for LSI, the distance can be decreased to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio lower than 100% but higher than or equal to 50%, higher than or equal to 60%, higher than or equal to 70%, higher than or equal to 80%, or higher than or equal to 90% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern; thus, an effective area that can be used as a light-emitting region with respect to the entire pattern area is reduced. In contrast, in the above manufacturing method, a pattern is formed by processing a film which has been deposited with a uniform thickness, which enables a uniform thickness in the pattern; thus, almost the entire area can be used as a light-emitting region even in the case of a fine pattern. Therefore, the above manufacturing method makes it possible to obtain a display device with both high resolution and a high aperture ratio.

As described above, the above manufacturing method enables a display device in which 15 minute light-emitting elements are integrated; accordingly, it is not necessary to conduct a pseudo improvement in resolution with a unique pixel arrangement such as a PenTile pattern. Therefore, it is possible to achieve a display device employing what is called a stripe arrangement in which R, G, and B are arranged in one direction and having resolution higher than or equal to 500 ppi, higher than or equal to 1000 ppi, higher than or equal to 2000 ppi, higher than or equal to 3000 ppi, or higher than or equal to 5000 ppi.

More specific structure examples and manufacturing method examples of the display device of one embodiment of the present invention are described below with reference to drawings.

Structure Example 1

FIG. 1A illustrates a schematic top view of a display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A illustrates what is called a stripe arrangement, in which the light-emitting elements of the same color are arranged in one direction. Note that the arrangement method of the light-emitting elements is not limited thereto; another arrangement method such as a delta arrangement, a zigzag arrangement, or a PenTile arrangement may also be used.

The light-emitting elements 110R, the light-emitting elements 110G, and the light-emitting elements 110B are arranged in the X direction. The light-emitting elements of the same color are arranged in the Y direction intersecting with the X direction.

As each of the light-emitting element 110R, the light-emitting element 110G, and the light-emitting element 110B, an EL element such as an OLED (Organic Light Emitting Diode) or a QLED (Quantum-dot Light Emitting Diode) is preferably used. As a light-emitting substance contained in the EL element, a substance that emits fluorescent light (a fluorescent material), a substance that emits phosphorescent light (a phosphorescent material), a substance that exhibits thermally activated delayed fluorescence (a thermally activated delayed fluorescent (TADF) material), and the like can be given. Examples of the light-emitting substance contained in the EL element include not only organic compounds but also inorganic compounds (e.g., quantum dot materials).

FIG. 1A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged. In FIG. 1A, the common electrode 113 is denoted by dashed line.

Figure 1B:
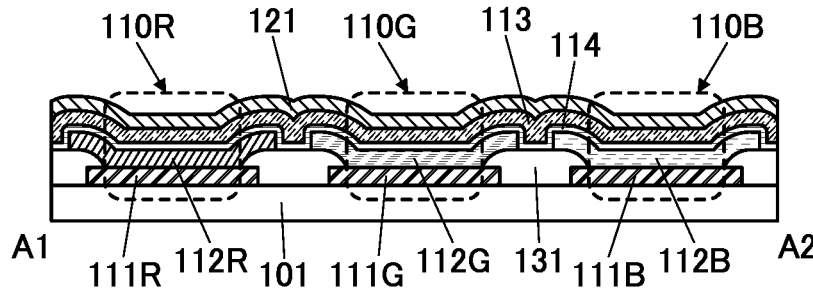
Figure 1C:
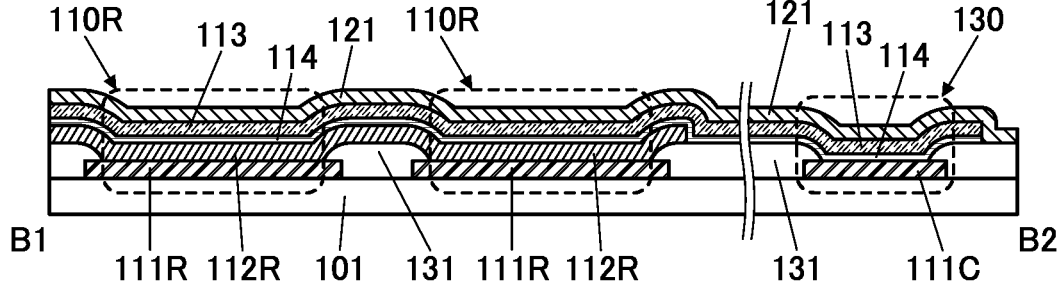

FIG. 1B is a cross-sectional schematic view taken along dashed-dotted line A1-A2 in FIG. 1A, and FIG. 1C is a cross-sectional schematic view taken along dashed-dotted line B1-B2 in FIG. 1A.

FIG. 1B illustrates cross sections of the light-emitting element 110R, the light-emitting element 110G, and the light-emitting element 110B. The light-emitting element 110R includes a pixel electrode 111R, an EL layer 112R, an EL layer 114, and the common electrode 113. The light-emitting element 110G includes a pixel electrode 111G, an EL layer 112G, the EL layer 114, and the common electrode 113. The light-emitting element 110B includes a pixel electrode 111B, an EL layer 112B, the EL layer 114, and the common electrode 113. The EL layer 114 and the common electrode 113 are shared by the light-emitting element 110R, the light-emitting element 110G, and the light-emitting element 110B. The EL layer 114 can also be referred to as a common layer.

The EL layer 112R included in the light-emitting element 110R contains at least a light-emitting organic compound that emits light with intensity in a red wavelength range. The EL layer 112G included in the light-emitting element 110G contains at least a light-emitting organic compound that emits light with intensity in a green wavelength range. The EL layer 112B included in the light-emitting element 110B contains at least a light-emitting organic compound that emits light with intensity in a blue wavelength range.

The EL layer 112R, the EL layer 112G, and the EL layer 112B may each include one or more of an electron-injection layer, an electron-transport layer, a hole-injection layer, and a hole-transport layer in addition to the layer containing a light-emitting organic compound (the light-emitting layer). The EL layer 114 does not necessarily include the light-emitting layer. For example, the EL layer 114 includes one or more of an electron-injection layer, an electron-transport layer, a hole-injection layer, and a hole-transport layer.

The pixel electrode 111R, the pixel electrode 111G, and the pixel electrode 111B are provided for the respective light-emitting elements. Each of the common electrode 113 and the EL layer 114 is provided as a continuous layer shared by the light-emitting elements. A conductive film having a light-transmitting property with respect to visible light is used for either the respective pixel electrodes or the common electrode 113, and a conductive film having a reflective property is used for the other. When the pixel electrodes have a light-transmitting property and the common electrode 113 has a reflective property, a bottom-emission display device can be provided; whereas when the pixel electrodes have a reflective property and the common electrode 113 has a light-transmitting property, a top-emission display device can be provided. Note that when both respective pixel electrodes and the common electrode 113 transmit light, a dual-emission display device can be obtained.

An insulating layer 131 is provided to cover the end portions of the pixel electrode 111R, the pixel electrode 111G, and the pixel electrode 111B. The end portions of the insulating layer 131 are preferably tapered. In this specification and the like, a tapered shape indicates a shape in which at least part of a side surface of a structure is inclined to a substrate surface. For example, a tapered shape preferably includes a region where the angle between the inclined side surface and the substrate surface (the angle is also referred to as a taper angle) is less than 90°. Note that the insulating layer 131 is not necessarily provided when not needed.

The EL layer 112R, the EL layer 112G, and the EL layer 112B each include a region in contact with a top surface of the pixel electrode and a region in contact with a surface of the insulating layer 131. End portions of the EL layer 112R, the EL layer 112G, and the EL layer 112B are positioned over the insulating layer 131.

Note that hereafter, in the description common to the light-emitting element 110R, the light-emitting element 110G, and the light-emitting element 110B, the alphabets are omitted from the reference numerals and the term "light-emitting element 110" is used in some cases. Similarly, the pixel electrode 111R, the pixel electrode 111G, and the pixel electrode 111B are also described using the term "pixel electrode 111" in some cases. Similarly, the EL layer 112R, the EL layer 112G, and the EL layer 112B are also described using the term "EL layer 112" in some cases.

The combination of colors of light emitted by the light-emitting elements 110 is not limited to the above examples, and cyan, magenta, yellow, or the like may also be used. Although the example where three colors of red (R), green (G), and blue (B) is shown in the above, the number of colors of light emitted by the light-emitting elements 110 included in the display device 100 may be two or four or more.

As illustrated in FIG. 1B, there is a gap between two EL layers 112 of light-emitting elements of different colors. In this manner, the EL layer 112R, the EL layer 112G, and the EL layer 112B are preferably provided so as not to be in contact with each other. This suitably prevents unintentional light emission from being caused by a current flowing through the two adjacent EL layers 112. As a result, the contrast can be increased to achieve a display device with high display quality.

As illustrated in FIG. 1C, the EL layer 112R is formed in a belt-like shape to be continuous in the Y direction in a display region. When the EL layer 112R and the like are formed in a belt-like shape, no space for dividing the layer is needed and thus the area of a non-light-emitting region between the light-emitting elements can be reduced, resulting in a higher aperture ratio. FIG. 1C illustrates the cross section of the light-emitting element 110R as an example; the light-emitting element 110G and the light-emitting element 110B can have a similar shape.

FIG. 1C also illustrates a connection portion 130 in which the connection electrode 111C is electrically connected to the common electrode 113. In the connection portion 130, the EL layer 114 is provided over and in contact with the connection electrode 111C, and the common electrode 113 is provided over and in contact with the EL layer 114. In other words, in the connection portion 130, the EL layer 114 is interposed between the connection electrode 111C and the common electrode 113. In other words, the EL layer 114 includes a first region in contact with the connection electrode 111C and a second region in contact with the common electrode 113. In addition, the insulating layer 131 is provided to cover end portions of the connection electrode 111C.

It is preferable to form the EL layer 114 as thin as possible, in which case the electric resistance of the EL layer 114 in the thickness direction can be reduced. For example, a material with an electron-injection property or a hole-injection property having a thickness of greater than or equal to 0.1 nm and less than 2 nm, preferably greater than or equal to 0.5 nm and less than or equal to 1.5 nm, typically approximately 1.0 nm is used for the EL layer 114. Note that the EL layer 114 may have a stacked-layer structure of an electron-injection layer and an electron-transport layer or a stacked-layer structure of a hole-injection layer and a hole-transport layer.

Furthermore, an increase in the electric resistance between the connection electrode 111C and the common electrode 113 is preferably inhibited by increasing the area of a region where the connection electrode 111C and the common electrode 113 overlap with each other with the EL layer 114 therebetween. For example, the area of the region where the connection electrode 111C and the common electrode 113 overlap with each other with the EL layer 114 therebetween is greater than or equal to 10000 $\mu m^2$ (0.01 $mm^2$), preferably greater than or equal to 20000 $\mu m^2$ (0.02 $mm^2$), further preferably greater than or equal to 40000 $\mu m^2$ (0.04 $mm^2$). Note that there is no particular limitation on the upper limit value of the area of the region where the connection electrode 111C and the common electrode 113 overlap with each other with the EL layer 114 therebetween.

In addition, the area of the region where the connection electrode 111C and the common electrode 113 overlap with each other with the EL layer 114 therebetween is referred to as the contact area in some cases. In addition, the area of the region where the connection electrode 111C and the common electrode 113 overlap with each other with the EL layer 114 therebetween can also be referred to as the area where the first region (the region where the EL layer 114 and the connection electrode 111C are in contact with each other) and the second region (the region where the EL layer 114 and the common electrode 113 are in contact with each other) overlap with each other.

In this manner, the electric resistance between the connection electrode 111C and the common electrode 113 can be made small enough to be negligible. Thus, the connection electrode 111C and the common electrode 113 are electrically connected to each other. Note that in the case where the EL layer 114 is formed using a material with low electric resistance, the electric resistance between the connection electrode 111C and the common electrode 113 can be made small to be negligible by satisfying either the above-described favorable film thickness of the EL layer 114 or the above-described favorable area where the connection electrode 111C and the common electrode 113 overlap with each other with the EL layer 114 therebetween.

Note that the film thickness of the EL layer 114 can be measured by observing a cross-sectional shape of the EL layer 114 and its vicinity with a transmission electron microscope (TEM) or the like in some cases. In addition, the thickness of the EL layer 114 can be measured by secondary ion mass spectrometry (SIMS), EDX line analysis, or the like in some cases. For example, in the case where the EL layer 114 includes an electron-injection layer and lithium fluoride (LiF) is used for the electron-injection layer, the film thickness of the EL layer 114 can be measured by using the concentration (the concentration obtained by SIMS) of lithium or fluorine at the interface between the EL layer 112 and the common electrode 113 and the vicinity thereof. Alternatively, the thickness of the EL layer 114 can be measured by using the concentration of lithium or fluorine at the interface between the connection electrode 111C and the common electrode 113 and the vicinity thereof (the concentration obtained by SIMS).

The area of the region where the connection electrode 111C and the common electrode 113 overlap with each other with the EL layer 114 therebetween can be measured by observing flat shapes of the connection portion and its vicinity with the use of a scanning transmission electron microscope (STEM) or the like in some cases.

A protective layer 121 is provided over the common electrode 113 so as to cover the light-emitting element 110R, the light-emitting element 110G, and the light-emitting element 110B. The protective layer 121 has a function of preventing diffusion of impurities such as water into the light-emitting elements from above.

The protective layer 121 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

As the protective layer 121, a stacked film of an inorganic insulating film and an organic insulating film can be used.

For example, a structure in which an organic insulating film is interposed between a pair of inorganic insulating films is preferable. Furthermore, the organic insulating film preferably functions as a planarization film. Thus, a top surface of the organic insulating film can be flat, and accordingly, coverage with the inorganic insulating film thereover can be improved, leading to an improvement in barrier properties. Moreover, a top surface of the protective layer 121 is flat, which is preferable because the influence of uneven shape due to the lower structure can be reduced in the case where a component (e.g., a color filter, an electrode of a touch sensor, a lens array, or the like) is provided over the protective layer 121.

FIG. 2A to FIG. 2J each illustrate a schematic top view of the display device 100 of one embodiment of the present invention. Note that FIG. 1A can also be referred to as an enlarged view of a region surrounded by dashed-dotted line in FIG. 2A. The display device 100 includes a display region 105 and a connection portion provided outside the display region 105.

The display region 105 includes a light-emitting element. The light-emitting element includes the common electrode 113.

The connection portion includes the common electrode 113 and the connection electrode 111C. The connection portion (the connection electrode 111C) is provided along the outer periphery of the display region 105. For example, the connection portion may be provided along one side of the outer periphery of the display region 105 or two or more sides of the outer periphery of the display region 105.

For example, in the case where a top surface shape of the display region 105 is a rectangle (including a square), a top surface shape of the connection portion (the connection electrode 111C) can be a rectangle (FIG. 2A), a belt-like shape (FIG. 2B), an L-like shape (FIG. 2C), or a square bracket shape (FIG. 2D), or the like. Note that the top surface shape of the display region 105 is not limited to the rectangle and may be a quadrangle excluding the rectangle. In the case where the top surface shape of the display region 105 is the quadrangle excluding the rectangle, the connection portion may be provided along the outer periphery of the display region 105. At this time, the top surface shape of the connection portion can be a belt-like shape, an L-like shape, a square bracket shape, a V-like shape, or the like.

Figure 2A:
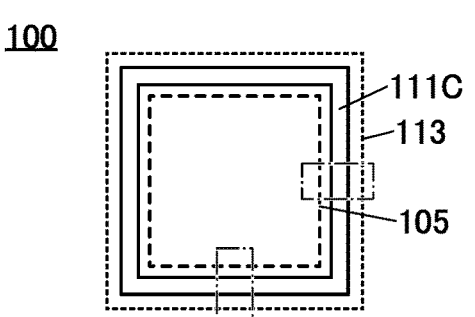
FIG. 2A to FIG. 2J are diagrams illustrating a structure example of a display device.
Figure 2B:
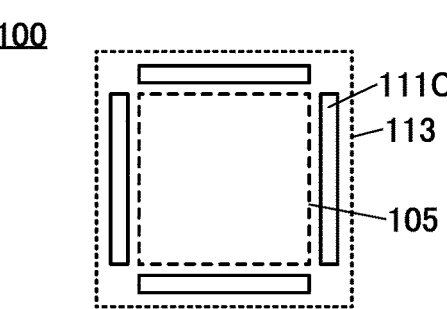
Figure 2C:
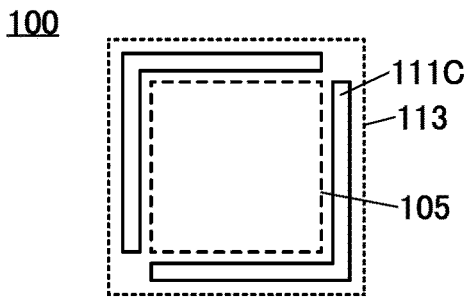
Figure 2D:
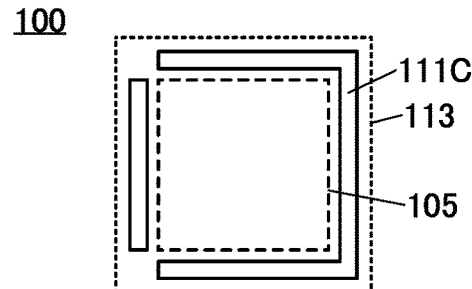
Figure 2E:
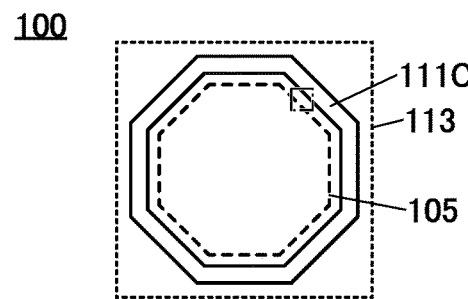
Figure 2F:
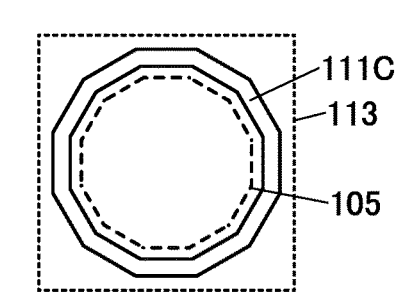
Figure 2G:
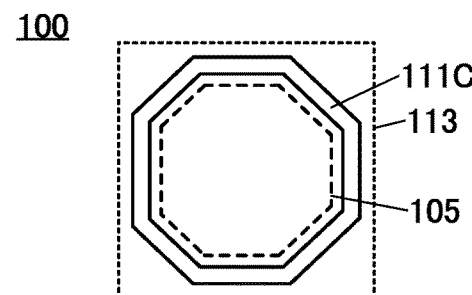

The top surface shape of the display region 105 may be a shape other than the above. For example, the top surface shape of the display region 105 may be a polygon other than the rectangle. FIG. 2E illustrates an example in which the top surface shape of the display region 105 is a regular octagon and FIG. 2F illustrates an example in which the top surface shape of the display region 105 is a regular dodecagon. Note that although FIG. 2E and FIG. 2F each illustrate an example in which the top surface shape of the display region 105 is a regular polygon, a polygon other than a regular polygon, a regular polygon with rounded corners, or a polygon with rounded corners may be employed. FIG. 2G illustrates an example in which the top surface shape of the display region 105 is an octagon. In the case where the top surface shape of the display region 105 is a polygon, the connection portion (the connection electrode 111C) may be provided along the outer periphery of the display region 105. At this time, the top surface shape of the connection portion can be a belt-like shape, an L-like shape, a square bracket shape, a V-like shape, or the like.

Figure 2H:
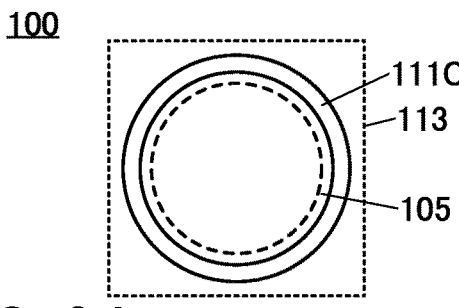

The top surface shape of the display region 105 may be a shape with a curve (including a circle, an ellipse, an oval, and the like). FIG. 2H illustrates an example in which the top surface shape of the display region 105 is a circle. In the case where the top surface shape of the display region 105 is a polygon, the connection portion (the connection electrode 111C) may be provided along the outer periphery of the display region 105. At this time, the top surface shape of the connection portion can be a circle, a C-like shape, a U-like shape, a belt-like shape, an L-like shape, a square bracket shape, a V-like shape, or the like.

Figure 2I:
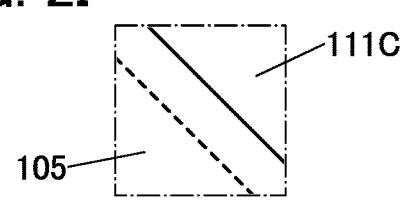
Figure 2J:
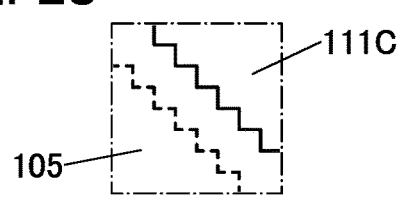

FIG. 2I and FIG. 2J each illustrate an enlarged view of a region surrounded by dashed-dotted line in FIG. 2E. In the case where the top surface shape of the display region 105 is a quadrangle other than a rectangle, a polygon, a shape with a curve, or the like, each of end portions of the display region 105 and the connection electrode 111C may be a straight line or a curved line illustrated in FIG. 2I, or may be a staircase-like shape illustrated in FIG. 2J.

The common electrode 113 included in the light-emitting element and the connection portion are preferably provided so as to include the display region 105 and the connection electrode 111C. At this time, the common electrode 113 includes a region overlapping with the connection electrode 111C.

Manufacturing Method Example 1

Figures 3A, 3B, 3C:
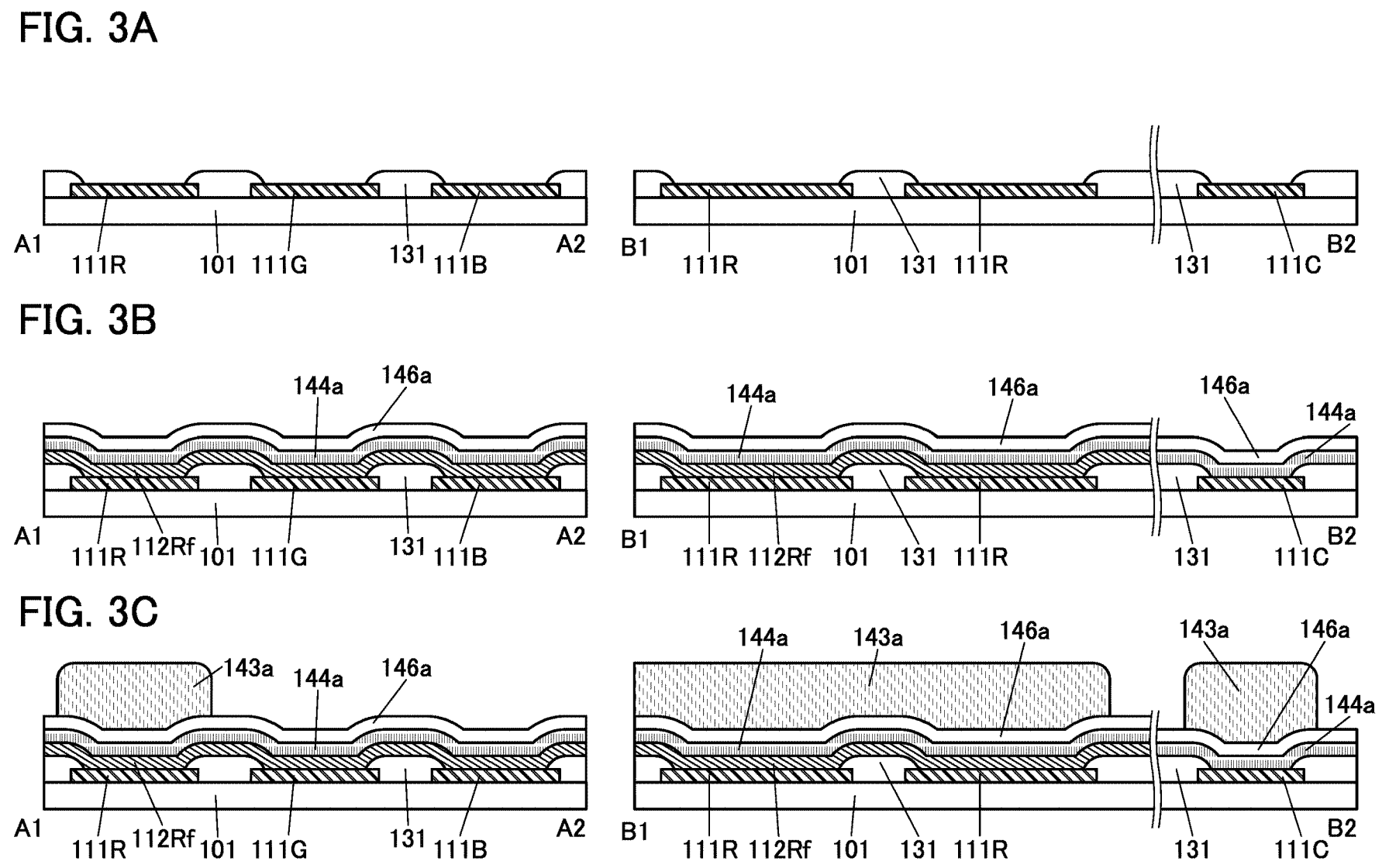

An example of a method for manufacturing the display device of one embodiment of the present invention is described below with reference to the drawings. Here, description is made with use of the display device 100 illustrated in the above structure example. FIG. 3A to FIG. 6D are each a cross-sectional schematic view of a step in a manufacturing method of a display device described below. In FIG. 3A and the like, the cross-sectional schematic view of the portion taken along dashed-dotted line A1-A2 in FIG. 1A is illustrated on the left side, and the cross-sectional schematic view of the portion taken along dashed-dotted line B1-B2 in FIG. 1A is illustrated on the right side.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method is a metal organic CVD (MOCVD) method.

Alternatively, thin films included in the display device (e.g., insulating films, semiconductor films, and conductive films) can be formed by a method such as spin coating, dipping, spray coating, ink-jetting, dispensing, screen printing, offset printing, a doctor knife method, a slit coater, a roll coater, a curtain coater, or a knife coater.

Thin films included in the display device can be processed by a photolithography method or the like. Besides, a nano-imprinting method, a sandblasting method, a lift-off method, or the like may be used to process thin films. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then the thin film is processed into a desired shape by performing light exposure and development.

As light for exposure in a photolithography method, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV, X-rays, or an electron beam because extremely minute processing can be performed. Note that a photomask is not needed when exposure is performed by scanning with a beam such as an electron beam.

For etching of thin films, a dry etching method, a wet etching method, a sandblast method, or the like can be used.

[Preparation for Substrate 101]

A substrate that has heat resistance high enough to withstand at least heat treatment performed later can be used as the substrate 101. When an insulating substrate is used as the substrate 101, a glass substrate, a quartz substrate, a sapphire substrate, a ceramic substrate, an organic resin substrate, or the like can be used. Alternatively, a semiconductor substrate such as a single crystal semiconductor substrate or a polycrystalline semiconductor substrate of silicon, silicon carbide, or the like; a compound semiconductor substrate of silicon germanium or the like; an SOI substrate; or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of Pixel Electrode 111R, Pixel Electrode 111G, Pixel Electrode 111B, and Connection Electrode 111C]

Next, the pixel electrode 111R, the pixel electrode 111G, the pixel electrode 111B, and the connection electrode 111C are formed over the substrate 101. First, a conductive film to be a pixel electrode and a connection electrode is formed, a resist mask is formed by a photolithography method, and an unnecessary portion of the conductive film is removed by etching. After that, the resist mask is removed to form the pixel electrode 111R, the pixel electrode 111G, the pixel electrode 111B, and the connection electrode 111C.

In the case where a conductive film with a property of reflecting visible light is used as each pixel electrode, it is preferable to use a material (e.g., silver or aluminum) having reflectance as high as possible in the whole wavelength range of visible light. This can increase both light extraction efficiency and color reproducibility of the light-emitting elements.

[Formation of Insulating Layer 131]

Next, the insulating layer 131 is formed to cover end portions of the pixel electrode 111R, the pixel electrode 111G, the pixel electrode 111B, and the connection electrode 111C (FIG. 3A). An organic insulating film or an inorganic insulating film can be used as the insulating layer 131. The end portions of the insulating layer 131 are preferably tapered to improve step coverage with an EL film described later. In particular, when an organic insulating film is used, a photosensitive material is preferably used, in which case the shape of the end portions can be easily controlled by the conditions of light exposure and development.

[Formation of EL Film 112Rf]

Subsequently, an EL film 112Rf to be the EL layer 112R is formed over the pixel electrode 111R, the pixel electrode 111G, the pixel electrode 111B, and the insulating layer 131.

The EL film 112Rf includes at least a film containing a light-emitting compound. A structure may be employed in which one or more films functioning as an electron-injection layer, an electron-transport layer, a charge-generation layer, a hole-transport layer, and a hole-injection layer are stacked in addition to the above. The EL film 112Rf can be formed by, for example, an evaporation method, a sputtering method, an ink-jet method, or the like. Without limitation to this, the above-described film formation method can be used as appropriate.

For example, the EL film 112Rf is preferably a stacked film in which a hole-injection layer, a hole-transport layer, a light-emitting layer, and an electron-transport layer are stacked in this order. In that case, a film including the electron-injection layer can be used as the EL layer 114 formed later. In particular, by providing an electron-transport layer to cover the light-emitting layer, damage to the light-emitting layer caused by a subsequent photolithography step or the like can be inhibited; thus, the light-emitting element with high reliability can be manufactured. Furthermore, by using layers containing the same organic compound for an electron-transport layer used for the EL film 112Rf or the like and an electron-injection layer used for the EL layer 114 formed later, these bonding can be favorable and a light-emitting element with high emission efficiency and high reliability can be obtained. For example, an organic compound with an electron-transport property can be used for the electron-transport layer, and a material containing the organic compound and a metal can be used for an electron-injection layer.

The EL film 112Rf is preferably formed so as not to be provided over the connection electrode 111C. For example, in the case where the EL film 112Rf is formed by an evaporation method (or a sputtering method), it is preferable that the EL film 112Rf be formed using a shielding mask so as not to be formed over the connection electrode 111C.

[Formation of Sacrificial Film 144a]

Next, a sacrificial film 144a is formed to cover the EL film 112Rf. The sacrificial film 144a is provided in contact with a top surface of the connection electrode 111C.

As the sacrificial film 144a, it is possible to use a film highly resistant to etching treatment performed on various EL films such as the EL film 112Rf, i.e., a film having high etching selectivity with respect to the EL films. Furthermore, as the sacrificial film 144a, it is possible to use a film having high etching selectivity with respect to a protective film such as a protective film 146a described later. Moreover, as the sacrificial film 144a, it is possible to use a film that can be removed by a wet etching method that is less likely to cause damage to the EL film.

The sacrificial film 144a can be formed using an inorganic film such as a metal film, an alloy film, a metal oxide film, a semiconductor film, or an inorganic insulating film, for example. The sacrificial film 144a can be formed by any of a variety of film formation methods such as a sputtering method, an evaporation method, a CVD method, and an ALD method. The sacrificial film 144a is preferably formed by a method that causes damage to a base (especially the EL film 112Rf or the like) as little as possible. For example, an ALD method or a vacuum evaporation method can be suitably used for the formation of the sacrificial film 144a. The ALD method causes less deposition damage to the base than the sputtering method.

For the sacrificial film 144a, for example, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

For the sacrificial film 144a, a metal oxide such as an indium-gallium-zinc oxide (In—Ga—Zn oxide, also referred to as IGZO) can be used. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Indium tin oxide containing silicon, or the like can also be used.

An element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium described above. In particular, M is preferably one or more kinds selected from gallium, aluminum, and yttrium.

For the sacrificial film 144a, an inorganic insulating material such as aluminum oxide, hafnium oxide, or silicon oxide can be used. In particular, aluminum oxide is favorably used for the sacrificial film 144a since the manufacturing cost can be reduced. Furthermore, an aluminum oxide film formed by an ALD method is suitable as the sacrificial film 144a because damage to the base (especially the EL film 112Rf or the like) can be reduced.

Alternatively, the sacrificial film 144a may have a single-layer structure or a stacked-layer structure of two or more layers. As typical examples of the stacked-layer structure, a two-layer structure of an In—Ga—Zn oxide formed by a sputtering method and a silicon nitride film formed by a sputtering method, a two-layer structure of an In—Ga—Zn oxide formed by a sputtering method and an aluminum oxide formed by an ALD method, a two-layer structure of an aluminum oxide formed by an ALD method and an In—Ga—Zn oxide formed by a sputtering method, or the like can be given.

Note that in formation of the sacrificial film 144a by an ALD method or a sputtering method, thermal deposition may be performed. In the case of the structure, the range where the base material (here, the EL film 112Rf) does not deteriorate is preferable, and the substrate temperature at the time of forming the sacrificial film 144a may be higher than or equal to room temperature and lower than or equal to 200° C., preferably higher than or equal to 50° C. and lower than or equal to 150° C., further preferably higher than or equal to 70° C. and lower than or equal to 100° C., typically a temperature in the vicinity of 80° C. With the above structure, adhesion between the base material and the sacrificial film 144a can be improved.

For the sacrificial film 144a, a material that can be dissolved in a solvent chemically stable with respect to at least the uppermost film of the EL film 112Rf is preferably used. Specifically, a material that will be dissolved in water or alcohol can be suitably used for the sacrificial film 144a. In formation of the sacrificial film 144a, it is preferable that application of such a material dissolved in a solvent such as water or alcohol be performed by a wet deposition method and followed by heat treatment for evaporating the solvent. At this time, the heat treatment is preferably performed under a reduced-pressure atmosphere, in which case the solvent can be removed at a low temperature in a short time and thermal damage to the EL film 112Rf can be accordingly minimized.

As a wet deposition method for forming the sacrificial film 144a, spin coating, dipping, spray coating, ink-jetting, dispensing, screen printing, offset printing, a doctor knife method, a slit coater, a roll coater, a curtain coater, a knife coater, or the like can be given.

For the sacrificial film 144a, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

[Formation of Protective Film 146a]

Next, the protective film 146a is formed over the sacrificial film 144a (FIG. 3B).

The protective film 146a is a film used as a hard mask when the sacrificial film 144a is etched later. In a later step of processing the protective film 146a, the sacrificial film 144a is exposed. Thus, the combination of films having high etching selectivity therebetween is selected for the sacrificial film 144a and the protective film 146a. It is thus possible to select a film that can be used for the protective film 146a depending on an etching condition of the sacrificial film 144a and an etching condition of the protective film 146a.

For example, in the case where dry etching using a gas containing fluorine (also referred to as a fluorine-based gas) is performed for the etching of the protective film 146a, the protective film 146a can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a metal oxide film using IGZO, ITO, or the like is given as a film having high etching selectivity (that is, enabling low etching rate) in dry etching using the fluorine-based gas, and such a film can be used as the sacrificial film 144a.

Without being limited to the above, a material of the protective film 146a can be selected from a variety of materials depending on the etching condition of the sacrificial film 144a and the etching condition of the protective film 146a. For example, any of the films that can be used for the sacrificial film 144a can be used.

As the protective film 146a, a nitride film can be used, for example. Specifically, a nitride film such as silicon nitride, aluminum nitride, hafnium nitride, titanium nitride, tantalum nitride, tungsten nitride, gallium nitride, or germanium nitride can be used.

As the protective film 146a, an oxide film or an oxynitride film can also be used. Typically, it is possible to use an oxide film or an oxynitride film such as silicon oxide, silicon oxynitride, aluminum oxide, aluminum oxynitride, hafnium oxide, or hafnium oxynitride.

Alternatively, as the protective film 146a, an organic film that can be used for the EL film 112Rf or the like can be used. For example, the protective film 146a can be formed using the same film as the organic film that is used for the EL film 112Rf, an EL film to be the EL layer 112G, or an EL film to be the EL layer 112B. The use of such an organic film is preferable, in which case the deposition apparatus for the EL film 112Rf or the like can be used in common.

[Formation of Resist Mask 143a]

Then, a resist mask 143a is formed in a position being over the protective film 146a and overlapping with the pixel electrode 111R and a position being over the protective film 146a and overlapping with the connection electrode 111C (FIG. 3C).

For the resist mask 143a, a resist material containing a photosensitive resin such as a positive type resist material or a negative type resist material can be used.

On the assumption that the resist mask 143a is formed over the sacrificial film 144a without the protective film 146a therebetween, there is a risk of dissolving the EL film 112Rf due to a solvent of the resist material if a defect such as a pinhole exists in the sacrificial film 144a. Such a defect can be prevented by using the protective film 146a.

In the case where a film that is unlikely to cause a defect such as a pinhole is used as the sacrificial film 144a, the resist mask 143a may be formed directly on the sacrificial film 144a without the protective film 146a therebetween.

[Etching of Protective Film 146a]

Next, part of the protective film 146a that is not covered with the resist mask 143a is removed by etching, so that a protective layer 147a is formed. At that time, the protective layer 147a is formed also over the connection electrode 111C.

In the etching of the protective film 146a, an etching condition with high selectively is preferably employed so that the sacrificial film 144a is not removed by the etching. Either wet etching or dry etching can be performed as the etching of the protective film 146a; however, a reduction in a pattern of the protective film 146a can be inhibited with use of dry etching.

[Removal of Resist Mask 143a]

Then, the resist mask 143a is removed (FIG. 4A).

The removal of the resist mask 143a can be performed by wet etching or dry etching. It is particularly preferable to perform dry etching (also referred to as plasma ashing) using an oxygen gas as an etching gas to remove the resist mask 143a.

At this time, the removal of the resist mask 143a is performed in a state where the EL film 112Rf is covered with the sacrificial film 144a; thus, the EL film 112Rf is less likely to be affected by the removal. In particular, when the EL film 112Rf is exposed to oxygen, the electrical characteristics of the light-emitting device are adversely affected in some cases; thus, it is preferable that the EL film 112Rf be covered with the sacrificial film 144a when etching using an oxygen gas, such as plasma ashing, is performed.

[Etching of Sacrificial Film 144a]

Next, part of the sacrificial film 144a that is not covered with the protective layer 147a is removed by etching with use of the protective layer 147a as a mask, so that a sacrificial layer 145a is formed (FIG. 4B). At that time, the sacrificial layer 145a is formed also over the connection electrode 111C.

Either wet etching or dry etching can be performed for the etching of the sacrificial film 144a; however, a dry etching method is preferably used because a reduction in a pattern of the sacrificial film 144a can be inhibited.

[Etching of EL Film 112Rf and Protective Layer 147a]

Next, the protective layer 147a and part of the EL film 112Rf that is not covered with the sacrificial layer 145a are removed by etching at the same time, so that the band-shaped EL layer 112R is formed (FIG. 4C). At that time, the protective layer 147a over the connection electrode 111C is also removed.

The EL film 112Rf and the protective layer 147a are preferably etched by the same treatment so that the process can be simplified to reduce the manufacturing cost of the display device.

For the etching of the EL film 112Rf, it is particularly preferable to perform dry etching using an etching gas that does not contain oxygen as its main component. This is because the alteration of the EL film 112Rf is inhibited, and a highly reliable display device can be achieved. Examples of the etching gas that does not contain oxygen as its main component include $CF_4$, $C_4F_8$, $SF_6$, $CHF_3$, $Cl_2$, $H_2O$, $BCl_3$, Hz, or a rare gas such as He. Alternatively, a mixed gas of the above gas and a dilution gas that does not contain oxygen can be used as the etching gas.

Note that the etching of the EL film 112Rf and the etching of the protective layer 147a may be performed separately. In that case, either the etching of the EL film 112Rf or the etching of the protective layer 147a may be performed first.

At this step, the EL layer 112R and the connection electrode 111C are covered with the sacrificial layer 145a.

[Formation of EL Film 112Gf]

Subsequently, an EL film 112Gf, which is to be the EL layer 112G, is formed over the sacrificial layer 145a, the insulating layer 131, the pixel electrode 111G, and the pixel electrode 111B. In that case, similarly to the EL film 112Rf, the EL film 112Gf is preferably not provided over the connection electrode 111C.

For the formation method of the EL film 112Gf, the above description of the EL film 112Rf can be referred to.

[Formation of Sacrificial Film 144b]

Then, a sacrificial film 144b is formed over the EL film 112Gf. The sacrificial film 144b can be formed in a manner similar to that for the sacrificial film 144a. In particular, the sacrificial film 144b and the sacrificial film 144a are preferably formed using the same material.

At that time, the sacrificial film 144b is formed also over the connection electrode 111C so as to cover the sacrificial layer 145a.

[Formation of Protective Film 146b]

Next, a protective film 146b is formed over the sacrificial film 144b. The protective film 146b can be formed in a manner similar to that for the protective film 146a. In particular, the protective film 146b and the protective film 146a are preferably formed using the same material.

[Formation of Resist Mask 143b]

Figures 5A, 5B, 5C:
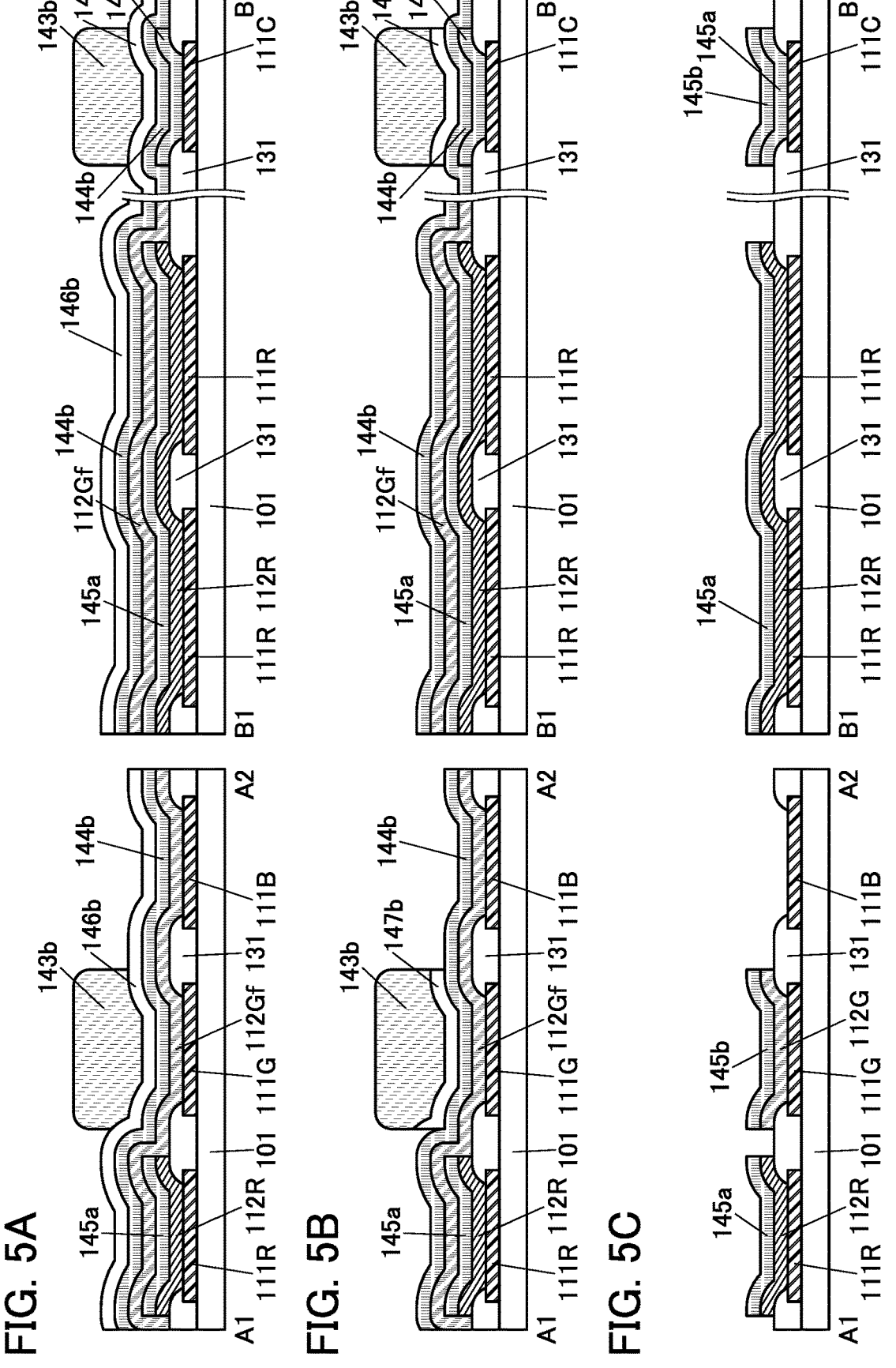
FIG. 5A to FIG. 5C are diagrams illustrating an example of a method for manufacturing a display device.

Then, a resist mask 143b is formed in a region being over the protective film 146b and overlapping with the pixel electrode 111G and a region being over the protective film 146b and overlapping with the connection electrode 111C (FIG. 5A).

The resist mask 143b can be formed in a manner similar to that for the resist mask 143a.

[Etching of Protective Film 146b]

Next, part of the protective film 146b that is not covered with the resist mask 143b is removed by etching, so that a protective layer 147b is formed (FIG. 5B). At that time, the protective layer 147b is formed also over the connection electrode 111C.

For the etching of the protective film 146b, the above description of the protective film 146a can be referred to.

[Removal of Resist Mask 143b]

Then, the resist mask 143b is removed. For the removal of resist mask 143b, the above description of the resist mask 143a can be referred to.

[Etching of Sacrificial Film 144b]

Next, part of the sacrificial film 144b that is not covered with the protective layer 147b is removed by etching with use of the protective layer 147b as a mask, so that a sacrificial layer 145b is formed. At that time, the sacrificial layer 145b is formed also over the connection electrode 111C. The sacrificial layer 145a and the sacrificial layer 145b are stacked over the connection electrode 111C.

For the etching of the sacrificial film 144b, the above description of the sacrificial film 144a can be referred to.

[Etching of EL Film 112Gf and Protective Layer 147b]

Next, the protective layer 147b and part of the EL film 112Gf that is not covered with the sacrificial layer 145b are removed by etching at the same time, so that the band-shaped EL layer 112G is formed (FIG. 5C). At that time, the protective layer 147b over the connection electrode 111C is also removed.

For the etching of the EL film 112Gf and the protective layer 147b, the above description of the EL film 112Rf and the protective layer 147a can be referred to. At this time, the EL layer 112R is protected by the sacrificial layer 145a, and thus damage due to the etching step of the EL film 112Gf can be prevented.

In the above manner, the band-shaped EL layer 112R and the band-shaped EL layer 112G can be separately formed with highly accurate alignment.

[Formation of EL Layer 112B]

Figures 6A, 6B, 6C, 6D:
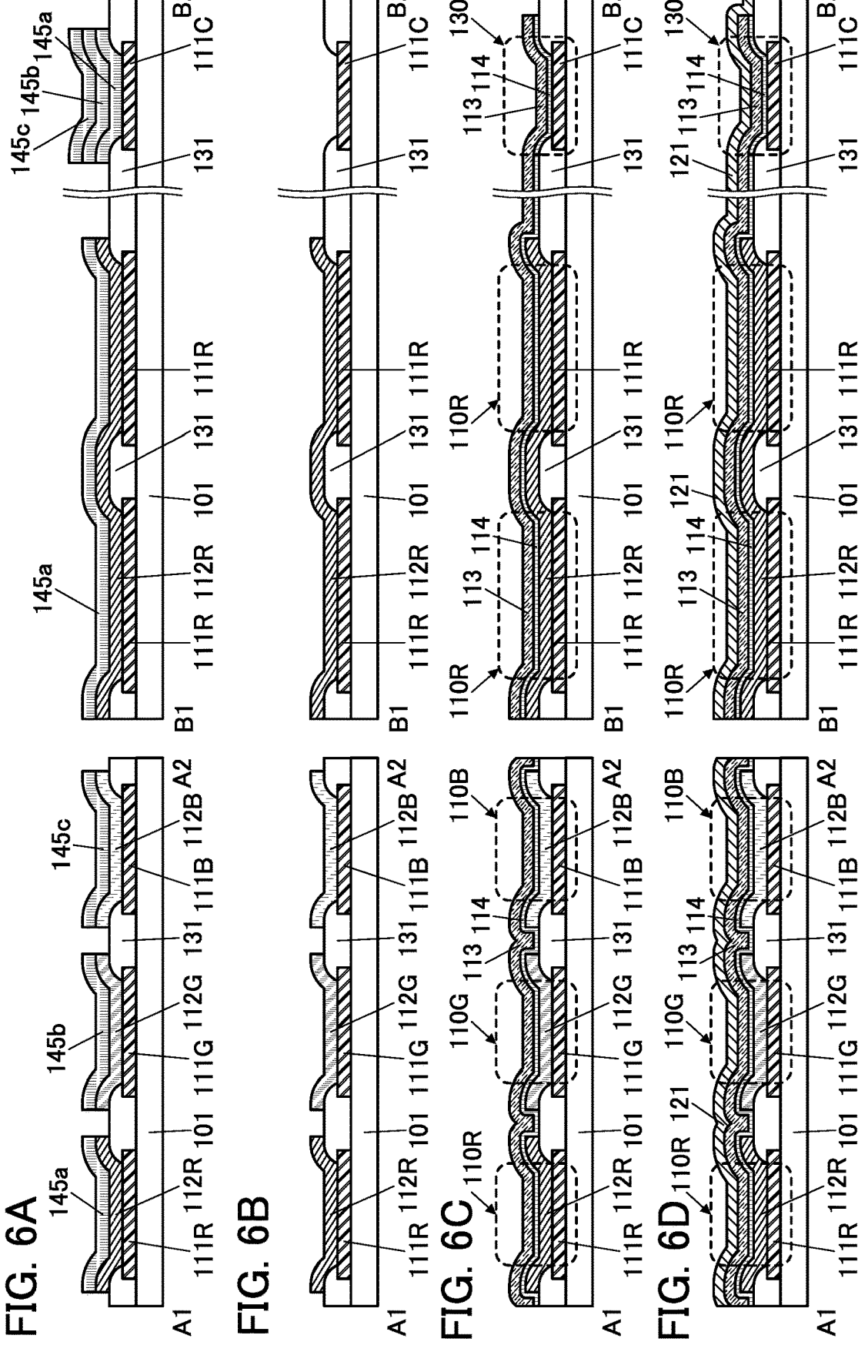
FIG. 6A to FIG. 6D are diagrams illustrating an example of a method for manufacturing a display device.

The above steps are performed on an EL film to be the EL layer 112B, whereby the island-shaped EL layer 112B and an island-shaped sacrificial layer 145c can be formed (FIG. 6A). That is, after the formation of the EL layer 112G, an EL film to be the EL layer 112B, a sacrificial film to be the sacrificial layer 145c, a protective film, and a resist mask are sequentially formed. After that, the protective film is etched to form a protective layer; then, the resist mask is removed. Subsequently, the sacrificial film is etched to form the sacrificial layer 145c. Then, the protective layer and the EL film are etched to form the band-shaped EL layer 112B.

After the EL layer 112B is formed, the sacrificial layer 145c is formed also over the connection electrode 111C at the same time. The sacrificial layer 145a, the sacrificial layer 145b, and the sacrificial layer 145c are stacked over the connection electrode 111C.

[Removal of Sacrificial Layer]

Next, the sacrificial layer 145a, the sacrificial layer 145b, and the sacrificial layer 145c are removed, whereby top surfaces of the EL layer 112R, the EL layer 112G, and the EL layer 112B are exposed (FIG. 6B). At that time, the top surface of the connection electrode 111C is also exposed.

The sacrificial layer 145a, the sacrificial layer 145b, and the sacrificial layer 145c can be removed by wet etching or dry etching. At this time, a method that causes damage to the EL layer 112R, the EL layer 112G, and the EL layer 112B as little as possible is preferably employed. In particular, a wet etching method is preferably used. For example, wet etching using a tetramethyl ammonium hydroxide (TMAH) solution, diluted hydrofluoric acid, oxalic acid, phosphoric acid, acetic acid, nitric acid, or a mixed solution thereof is preferably performed.

Alternatively, the sacrificial layer 145a, the sacrificial layer 145b, and the sacrificial layer 145c are preferably removed by being dissolved in a solvent such as water or alcohol. Examples of the alcohol in which the sacrificial layer 145a, the sacrificial layer 145b, and the sacrificial layer 145c can be dissolved include ethyl alcohol, methyl alcohol, isopropyl alcohol (IPA), and glycerin.

After the sacrificial layer 145a, the sacrificial layer 145b, and the sacrificial layer 145c are removed, drying treatment is preferably performed in order to remove water contained in the EL layer 112R, the EL layer 112G, and the EL layer 112B and water adsorbed on the surfaces of the EL layer 112R, the EL layer 112G, and the EL layer 112B. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere because drying at a lower temperature is possible.

In the above manner, the EL layer 112R, the EL layer 112G, and the EL layer 112B can be separately formed.

[Formation of EL Layer 114 and Common Electrode 113]

Next, the EL layer 114 and the common electrode 113 are sequentially formed to cover the EL layer 112R, the EL layer 112G, and the EL layer 112B (FIG. 6C). At this time, the EL layer 114 and the common electrode 113 are formed using the same blocking mask or without using a blocking mask. Thus, manufacturing cost can be reduced as compared to the case of using a different blocking mask. Note that the EL layer 114 and the common electrode 113 are formed also over the connection electrode 111C.

The EL layer 114 can be formed in a manner similar to that of the EL film 112Rf or the like.

The common electrode 113 can be formed by a deposition method such as an evaporation method or a sputtering method. Alternatively, a film formed by an evaporation method and a film formed by a sputtering method may be stacked.

At this time, in the connection portion 130, the EL layer 114 is interposed between the connection electrode 111C and the common electrode 113 as illustrated in FIG. 6C. At this time, the thickness of the EL layer 114 is, for example, greater than or equal to 0.1 nm and less than 2 nm, preferably greater than or equal to 0.5 nm and less than or equal to 1.5 nm, typically, approximately 1.0 nm as described above, whereby the electric resistance in the thickness direction of the EL layer 114 can be reduced.

Furthermore, the area of the region where the connection electrode 111C and the common electrode 113 overlap with each other with the EL layer 114 therebetween is enlarged, an increase in the electric resistance between the connection electrode 111C and the common electrode 113 can be inhibited as described above.

Accordingly, the electric resistance between the connection electrode 111C and the common electrode 113 can be made small enough to be negligible. Thus, the connection electrode 111C and the common electrode 113 are electrically connected to each other.

[Formation of Protective Layer 121]

Next, the protective layer 121 is formed over the common electrode 113. At this time, the protective layer 121 is preferably provided to cover end portions of the common electrode 113 and end portions of the EL layer 114 as illustrated in FIG. 6D. Accordingly, diffusion of impurities such as water or oxygen from the outside to the EL layer 114 and the interface between the EL layer 114 and the common electrode 113 can be effectively prevented.

An inorganic insulating film used for the protective layer 121 is preferably formed by a sputtering method, a PECVD method, or an ALD method. In particular, an ALD method is preferable because a film deposited by ALD method has excellent step coverage and is less likely to cause a defect such as pinhole. An organic insulating film is preferably formed by an ink-jet method because a uniform film can be formed in a desired area.

Through the above steps, the display device 100 illustrated in FIG. 1B and FIG. 1C can be manufactured.

Note that although the case where the common electrode 113 and the EL layer 114 are formed in the same region is described above, they may be formed to have different top surface shapes.

The above is the description of an example of the method for manufacturing the display device.

Structure Example 2

A structure example of a display device whose structure is partly different from that of the above-described structure example 1 is described below. Description of the portions similar to those described above is omitted below in some cases.

A display device 100A illustrated in FIG. 7A to FIG. 7C is different from the display device 100 mainly in the shapes of the EL layer 114 and the common electrode 113.

In a cross section in the X direction, each of the EL layer 114 and the common electrode 113 is separated between two light-emitting elements 110 emitting light of different colors as illustrated in FIG. 7B. In other words, each of the EL layer 114 and the common electrode 113 has end portions in portions overlapping with the insulating layer 131.

The protective layer 121 is provided to cover side surfaces of each of the EL layer 112, the EL layer 114, and the common electrode 113 in a region overlapping with the insulating layer 131.

As illustrated in FIG. 7B, a depressed portion may be formed in part of a top surface of the insulating layer 131. At this time, the protective layer 121 is preferably provided along and in contact with surfaces of the depressed portion of the insulating layer 131. This is preferable because the contact area between the insulating layer 131 and the protective layer 121 is increased and the adhesion between them is improved.

In FIG. 7A, the outline of the common electrode 113 and the EL layer 114 is denoted by dotted line. The common electrode 113 and the EL layer 114 each have a top surface shape with a comb-like shape or a slit as illustrated in FIG. 7A.

Figure 8:
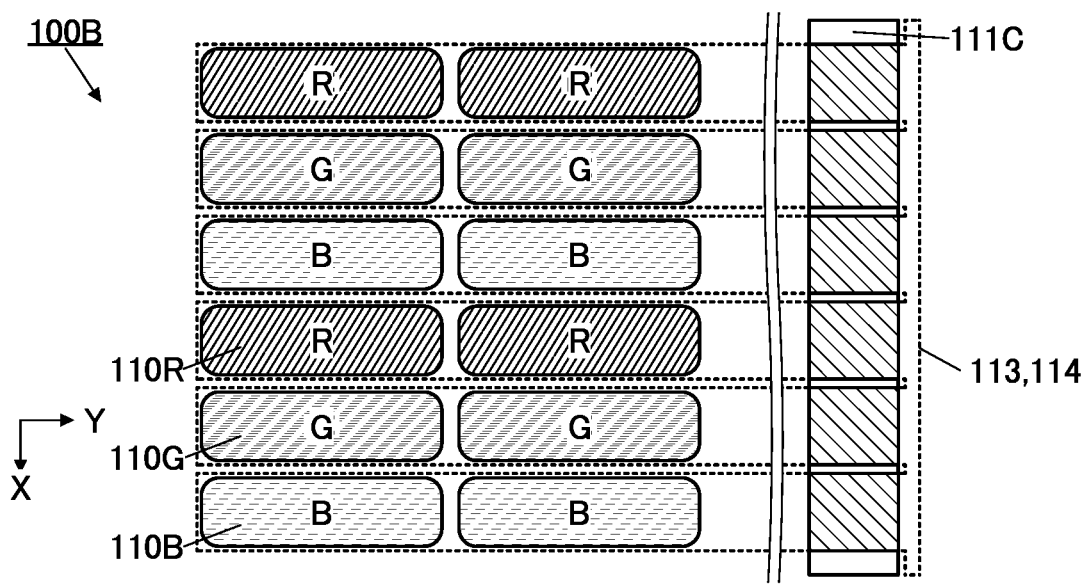
FIG. 8 is a diagram illustrating a structure example of a display device.

Note that although the display device 100A illustrated in FIG. 7A has a structure in which the common electrode 113 and the EL layer 114 are provided so as to overlap with the connection electrode 111C, one embodiment of the present invention is not limited thereto. For example, a structure in which part of the common electrode 113 and part of the EL layer 114 may be provided so as to overlap with the connection electrode 111C as a display device 100B illustrated in FIG. 8. The region where the common electrode 113, the EL layer 114, and the connection electrode 111C overlap with one another is indicated by oblique lines in FIG. 8.

Manufacturing Method Example 2

An example of a method for manufacturing the above-described display device 100A is described below. Note that the above-described manufacturing method example 1 is referred to for portions similar to those described in manufacturing method example 1, and description of the portions is omitted below. The manufacturing method example described here is different from the above-described manufacturing method example 1 in steps after the formation step of the common electrode 113.

Figures 9A, 9B, 9C:
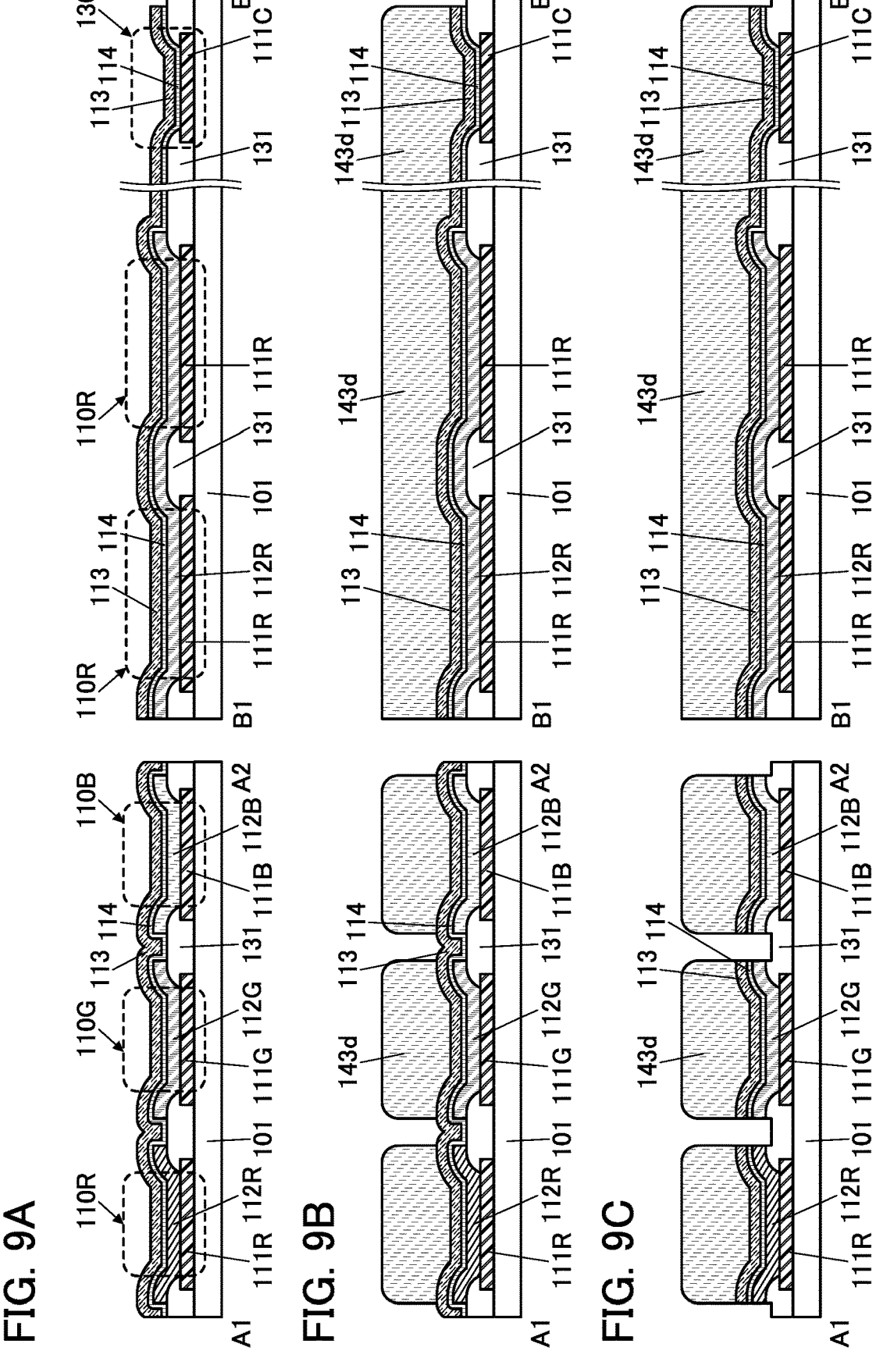
FIG. 9A to FIG. 9C are diagrams illustrating an example of a method for manufacturing a display device.

FIG. 9A to FIG. 10A each illustrate a schematic cross-sectional view of a step described below as an example. In FIG. 9A and the like, a cross-sectional schematic view of a portion taken along dashed-dotted line A1-A2 in FIG. 7A is illustrated on the left side, and a cross-sectional schematic view of a portion taken along dashed-dotted line B1-B2 in FIG. 7A is illustrated on the right side.

The steps are performed sequentially up to the formation of the common electrode 113 as in the manufacturing method example 1 (FIG. 9A).

Next, a plurality of resist masks 143*d* are formed over the common electrode 113 (FIG. 9B). The resist mask 143*d* is formed to have a top surface shape with a comb-like shape or a slit. The resist mask 143*d* overlaps with the pixel electrode 111R, the pixel electrode 111G, the pixel electrode 111B, and the connection electrode 111C. End portions of the resist mask 143*d* are provided over the insulating layer 131.

Next, portions of the common electrode 113 and the EL layer 114, which are not covered with the resist mask 143*d*, are removed by etching (FIG. 9C). Accordingly, a slit is formed by the etching in the common electrode 113 and the EL layer 114 that are continuously provided to cover all the pixel electrodes and the connection electrodes, whereby the common electrode 113 and the EL layer 114 having a top surface shape with a comb-like shape or a slit is formed.

Etching is preferably performed by dry etching. For example, the common electrode 113, the EL layer 114, and the like are preferably etched successively in this order without exposure to the air by changing an etching gas. Furthermore, a gas that does not contain oxygen as its main component is preferably used as the etching gas.

Part of the insulating layer 131 may be etched at the time of the etching of the common electrode 113, the EL layer 114, and the like, so that a depressed portion is formed on the upper portion of the insulating layer 131 as illustrated in FIG. 9C. Alternatively, portions of the insulating layer 131 that are not covered with the resist mask 143*d* are etched and divided into two in some cases.

Next, the resist masks 143*d* are removed. The removal of the resist masks 143*d* can be performed by wet etching or dry etching.

Figures 10A, 10B:
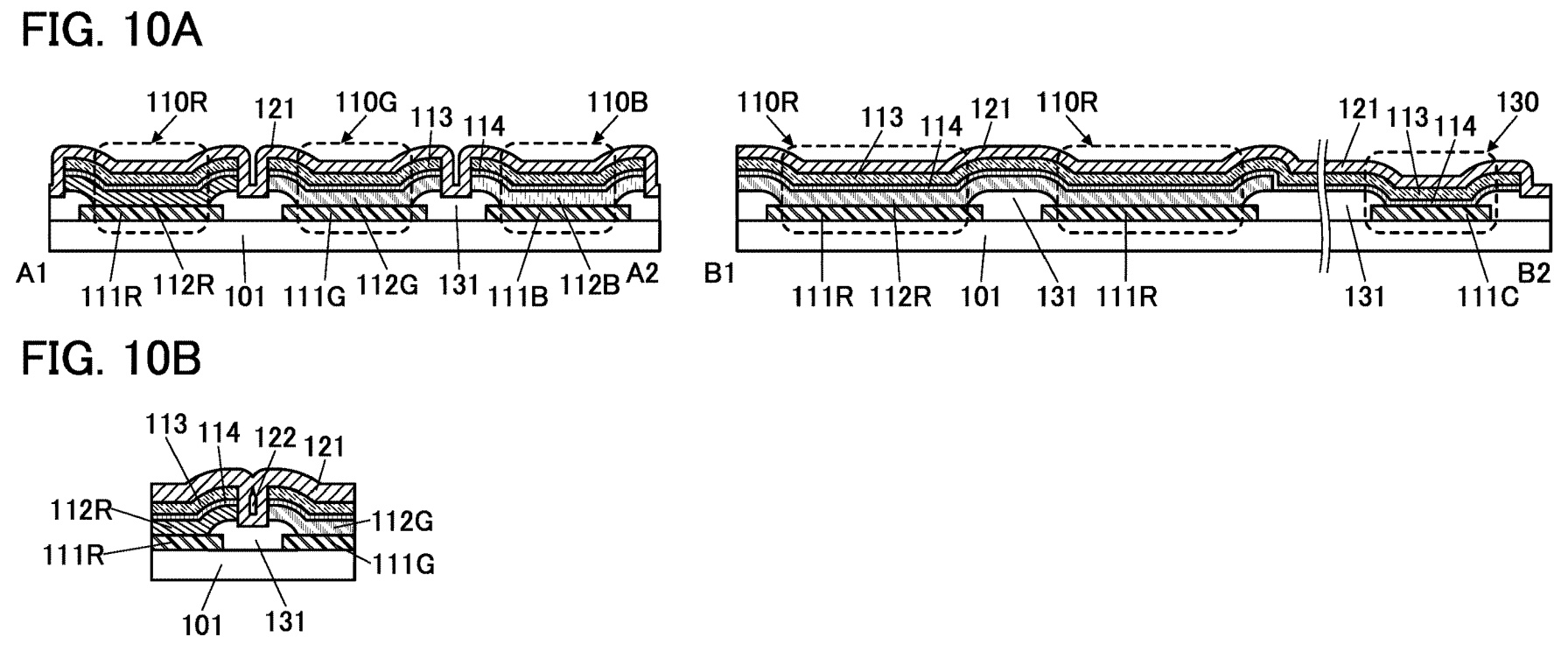

Next, the protective layer 121 is formed (FIG. 10A). The protective layer 121 is provided to cover the side surfaces of the common electrode 113, the side surfaces of the EL layer 114, and the side surfaces of the EL layer 112. The protective layer 121 is preferably provided in contact with the top surface of the insulating layer 131.

As illustrated in FIG. 10B, a void (also referred to as a gap, a space, or the like) 122 is sometimes formed over the insulating layer 131 at the time of forming the protective layer 121. The void 122 may be in a reduced pressure state or in an atmospheric pressure. Furthermore, the void 122 may contain air, nitrogen, a gas such as a noble gas, or a deposition gas used for depositing the protective layer 121.

The above is the description of the manufacturing method example of the display device 100A.

Note that although the resist mask 143*d* is directly formed over the common electrode 113, a film functioning as a hard mask may be provided over the common electrode 113. At this time, a hard mask is formed using the resist mask 143*d* as a mask, and the common electrode 113, the EL layer 114, and the like can be etched using the hard mask as a mask after removing the resist mask. Note that the hard mask may be removed or left at this time.

Structure Example 3

Figure 11A:
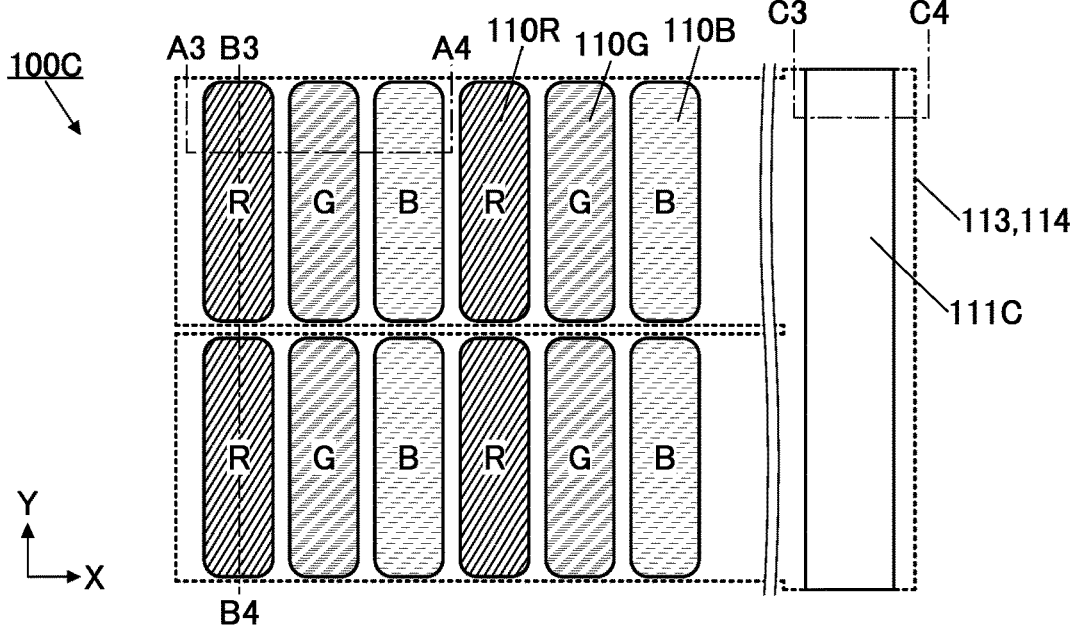
FIG. 11A to FIG. 11D are diagrams illustrating a structure example of a display device.

A display device 100C illustrated in FIG. 11A to FIG. 11D is different from the display device 100 mainly in the shapes of the EL layer 114 and the common electrode 113. Note that FIG. 11A is a schematic top view of the display device in a region surrounded by dashed double-dotted line in FIG. 2A.

Figure 11B:
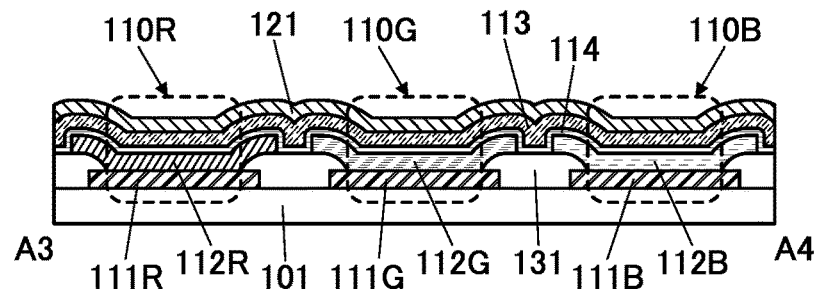
Figure 11C:
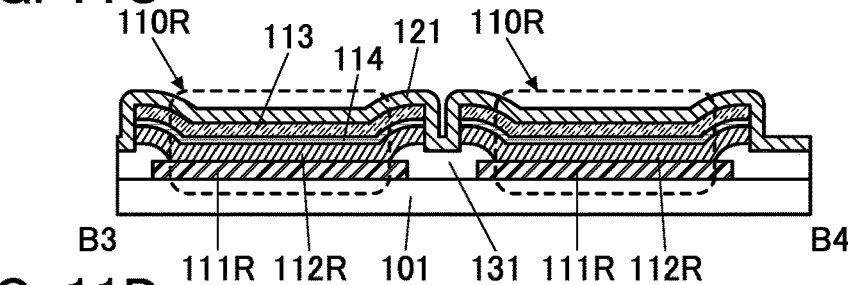

In a cross section in the Y direction, each of the EL layer 112R, the EL layer 114, and the common electrode 113 is separated between two light-emitting elements 110R as illustrated in FIG. 11C. In other words, each of the EL layer 112R, the EL layer 114, and the common electrode 113 has end portions in portions overlapping with the insulating layer 131.

In addition, the protective layer 121 is provided to cover side surfaces of each of the EL layer 112R, the EL layer 114, and the common electrode 113 in the region overlapping with the insulating layer 131.

As illustrated in FIG. 11C, a depressed portion may be formed in part of the top surface of the insulating layer 131. At this time, the protective layer 121 is preferably provided along and in contact with the surface of the depressed portion of the insulating layer 131. This is preferable because the contact area between the insulating layer 131 and the protective layer 121 is increased and the adhesion between them is improved.

Figure 11D:
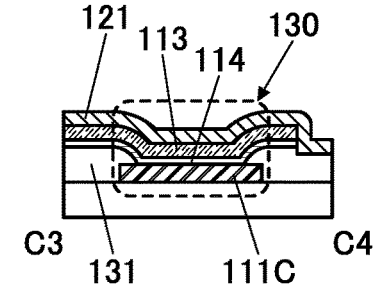

In FIG. 11A, the outline of the common electrode 113 and the EL layer 114 is denoted by dashed line. The common electrode 113 and the EL layer 114 each have a top surface shape with a comb-like shape or a slit as illustrated in FIG. 11A. On the other hand, the EL layer 112R has an island shape as illustrated in FIG. 11B and FIG. 11C. Note that the connection portion 130 has the same structure as the connection portion 130 included in the display device 100 as illustrated in FIG. 11D.

Figure 12:
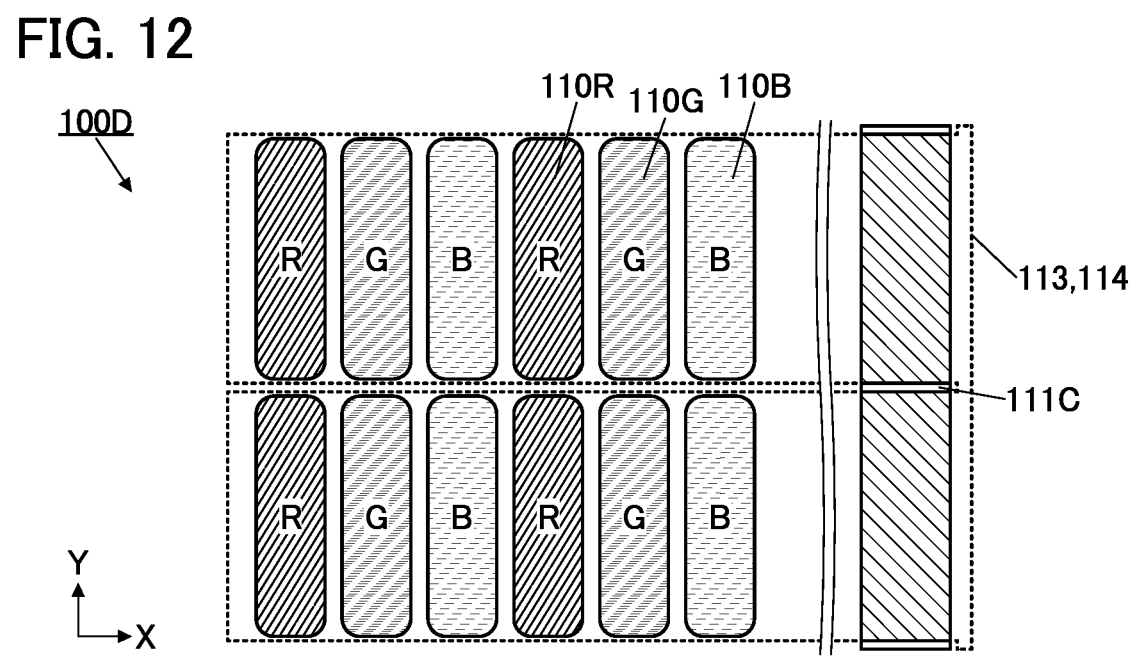

Note that although the display device 100C illustrated in FIG. 11A has a structure in which the common electrode 113 and the EL layer 114 are provided so as to overlap with the connection electrode 111C, one embodiment of the present invention is not limited thereto. For example, part of the common electrode 113 and part of the EL layer 114 may be provided so as to overlap with the connection electrode 111C as a display device 100D illustrated in FIG. 12. A region where the common electrode 113, the EL layer 114, and the connection electrode 111C overlap with each other is indicated by oblique lines in FIG. 12.

Note that although not illustrated here, the light-emitting element 110G and the light-emitting element 110B can have a similar structure.

Modification Example

An example that is partly different from the above-described example is described below. Note that in the description below, the above description is referred to for portions similar to those described above and the portions are not described.

Modification Example 1

Figure 13A:
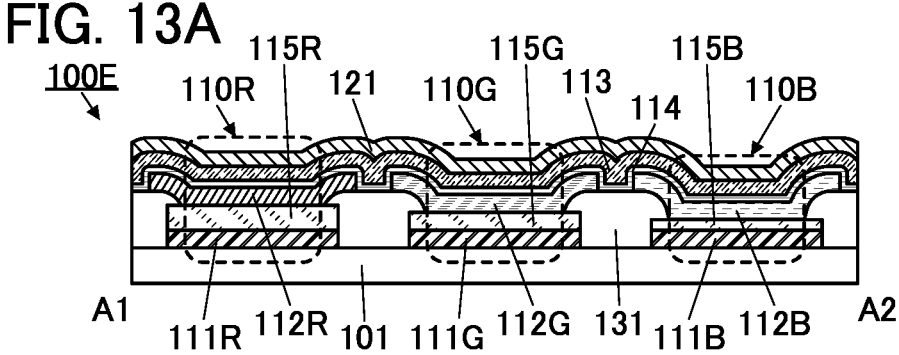
FIG. 13A to FIG. 13C are diagrams illustrating structure examples of display devices.
Figure 13B:
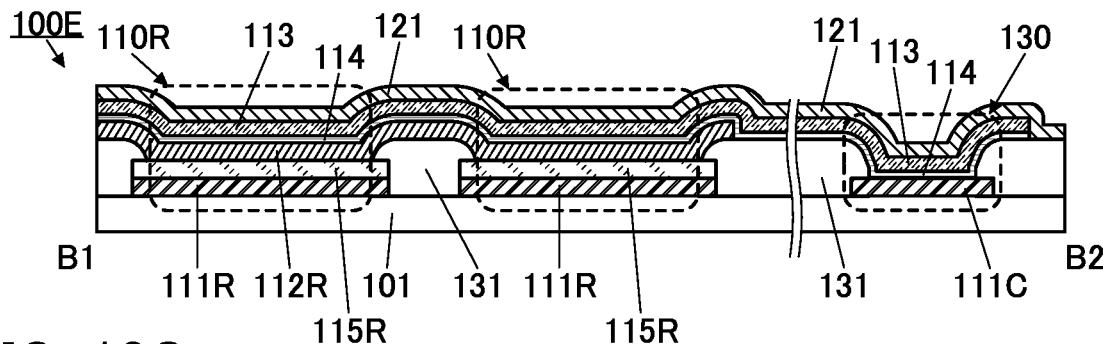

A display device 100E illustrated in FIG. 13A and FIG. 13B is different from the display device 100 mainly in the structure of light-emitting elements.

The light-emitting element 110R includes an optical adjustment layer 115R between the pixel electrode 111R and the EL layer 112R. The light-emitting element 110G includes an optical adjustment layer 115G between the pixel electrode 111G and the EL layer 112G. The light-emitting element 110B includes an optical adjustment layer 115B between the pixel electrode 111B and the EL layer 112B.

Furthermore, the optical adjustment layer 115R, the optical adjustment layer 115G, and the optical adjustment layer 115B each have a light-transmitting property with respect to visible light. The optical adjustment layer 115R, the optical adjustment layer 115G, and the optical adjustment layer 115B have different thicknesses. Thus, the optical path lengths of the light-emitting elements can differ from one another.

Here, a conductive film that has a reflective property with respect to visible light is used for the pixel electrode 111R, the pixel electrode 111G, and the pixel electrode 111B, and a conductive film that has a reflective property and a transmitting property with respect to visible light is used for the common electrode 113. Thus, each of the light-emitting elements has what is called a microcavity structure and intensifies light with a specific wavelength. Accordingly, a display device with high color purity can be achieved.

A conductive material that has a light-transmitting property with respect to visible light can be used for each of the optical adjustment layers. For example, a conductive oxide such as indium oxide, indium tin oxide, indium zinc oxide, zinc oxide, zinc oxide containing gallium, indium tin oxide containing silicon, or indium zinc oxide containing silicon can be used.

The optical adjustment layers can be formed after the formation of the pixel electrode 111R, the pixel electrode 111G, and the pixel electrode 111B and before the formation of the EL film 112Rf or the like. The optical adjustment layers may be formed using conductive films with different thicknesses or may have a single-layer structure, a two-layer structure, a three-layer structure, or the like from the smallest thickness to the largest thickness.

Figure 13C:
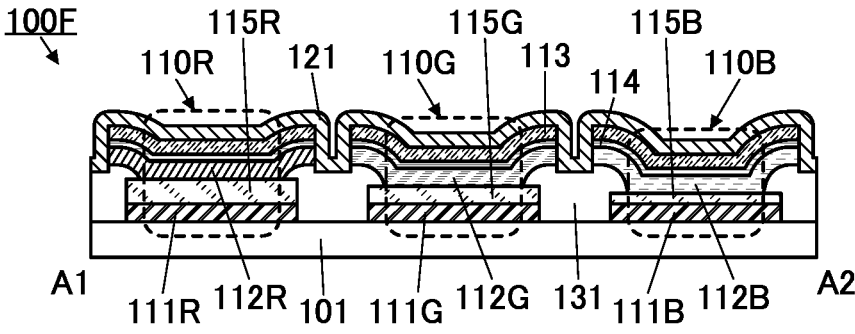

A display device 100F illustrated in FIG. 13C is an example in which the optical adjustment layer is used in the display device 100A. FIG. 13C illustrates cross sections of three light-emitting elements (the light-emitting element 110R, the light-emitting element 110G, and the light-emitting element 110B) arranged in the X direction.

Modification Example 2

Figure 14A:
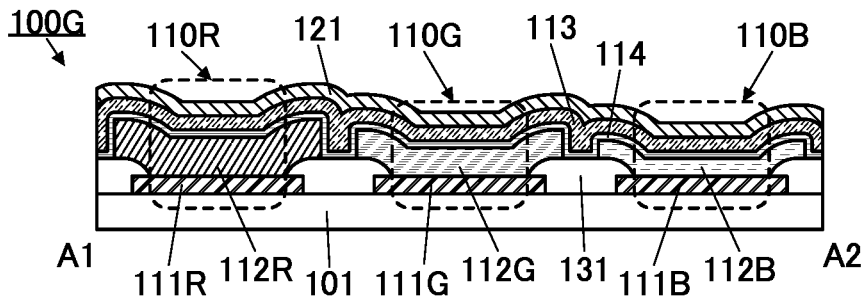
FIG. 14A to FIG. 14C are diagrams illustrating structure examples of display devices.
Figure 14B:
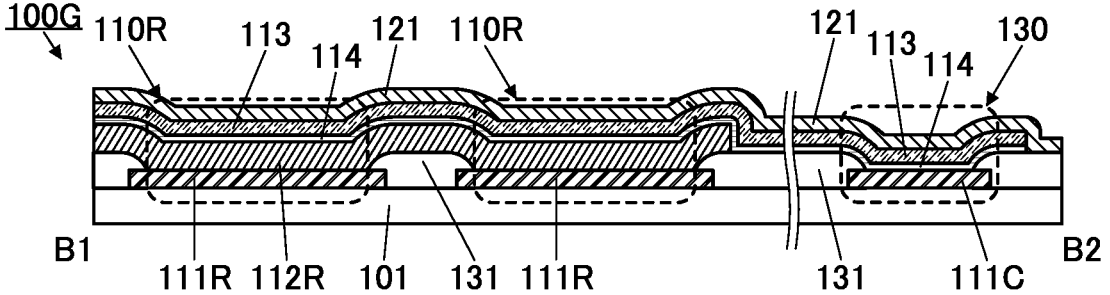

A display device 100G illustrated in FIG. 14A and FIG. 14B is different from the display device 100E mainly in not including an optical adjustment layer.

The display device 100G is an example where a microcavity structure is achieved with the thicknesses of the EL layer 112R, the EL layer 112G, and the EL layer 112B. With such a structure, an optical adjustment layer does not need to be provided additionally, leading to simplification of the process.

For example, in the display device 100G, the EL layer 112R of the light-emitting element 110R emitting light whose wavelength is longest has the largest thickness, and the EL layer 112B of the light-emitting element 110B emitting light whose wavelength is shortest has the smallest thickness. Note that without limitation to this, the thickness of the EL layer can be adjusted in consideration of the wavelength of light emitted by the light-emitting elements, the optical characteristics of the layer included in the light-emitting element, the electrical characteristics of the light-emitting element, and the like.

Figure 14C:
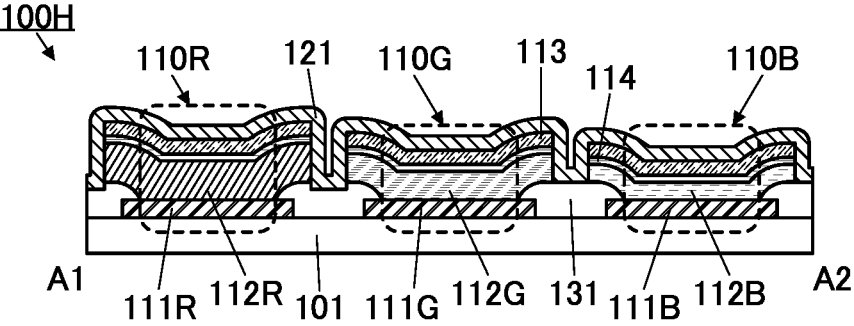
Figure 15A:
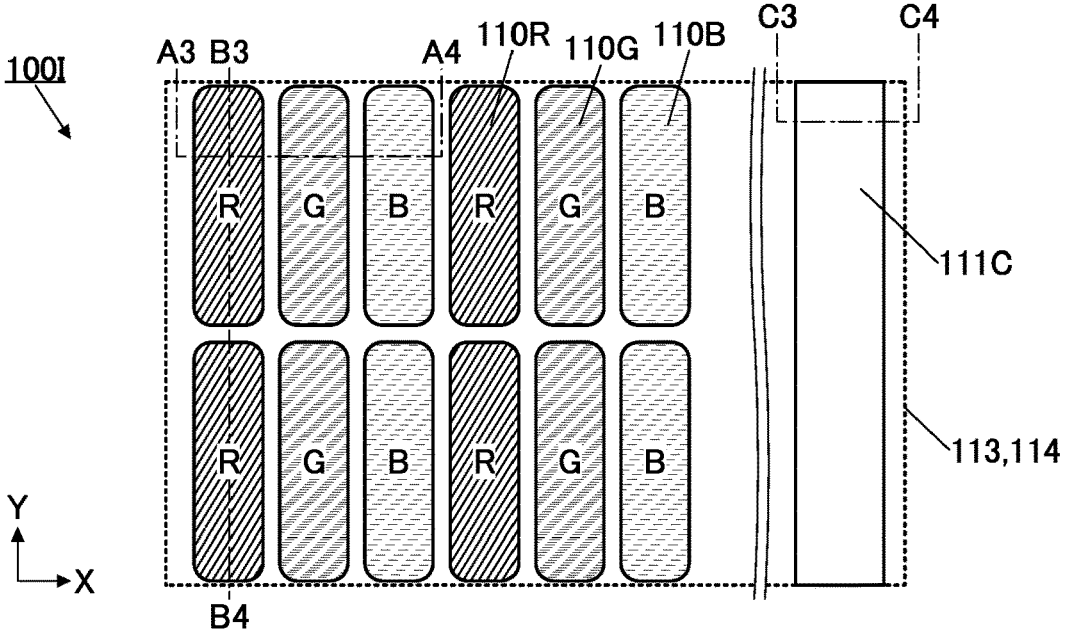
FIG. 15A to FIG. 15D are diagrams illustrating a structure example of a display device.
Figure 15B:
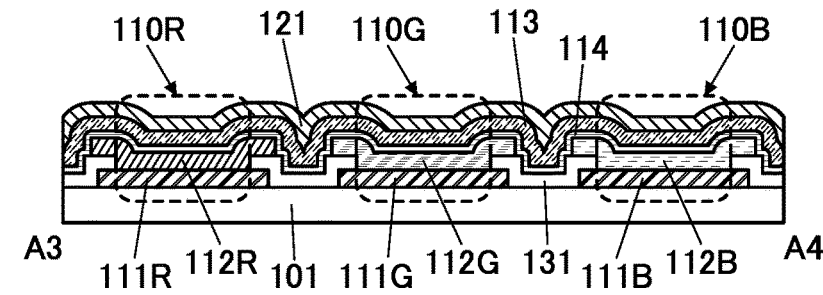
Figure 15C:
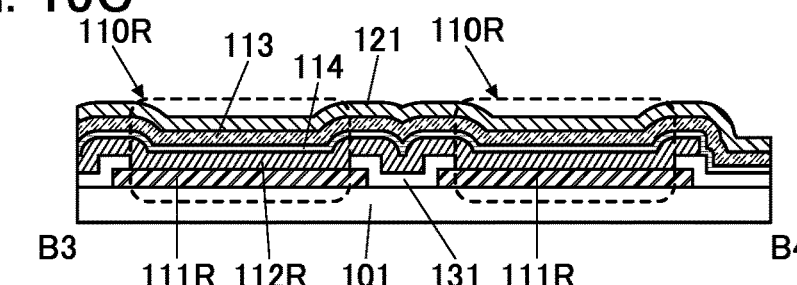
Figure 15D:
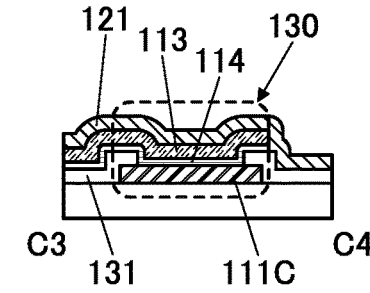

In addition, a display device 100H illustrated in FIG. 14C is an example where a microcavity structure is achieved by changing the thicknesses of the EL layers 112 of the display device 100A. FIG. 14C illustrates cross sections of three light-emitting elements 110 (the light-emitting element 110R, the light-emitting element 110G, and the light-emitting element 110B) arranged in the X direction.

Modification Example 3

A display device 100I illustrated in FIG. 15A to FIG. 15D is different from the display device 100 mainly in the shape of the insulating layer 131.

In the case where an inorganic insulating film is used as the insulating layer 131 covering end portions of the pixel electrode 111 and the end portions of the connection electrode 111C, the insulating layer 131 has a depressed portion in a region not overlapping with the pixel electrode 111 and the connection electrode 111C in some cases. In the case where an inorganic insulating film is used as the insulating layer 131, impurities are less likely to enter the light-emitting element as compared with the case where an organic insulating film is used; therefore, the reliability of the light-emitting element can be improved.

Modification Example 4

Figure 16A:
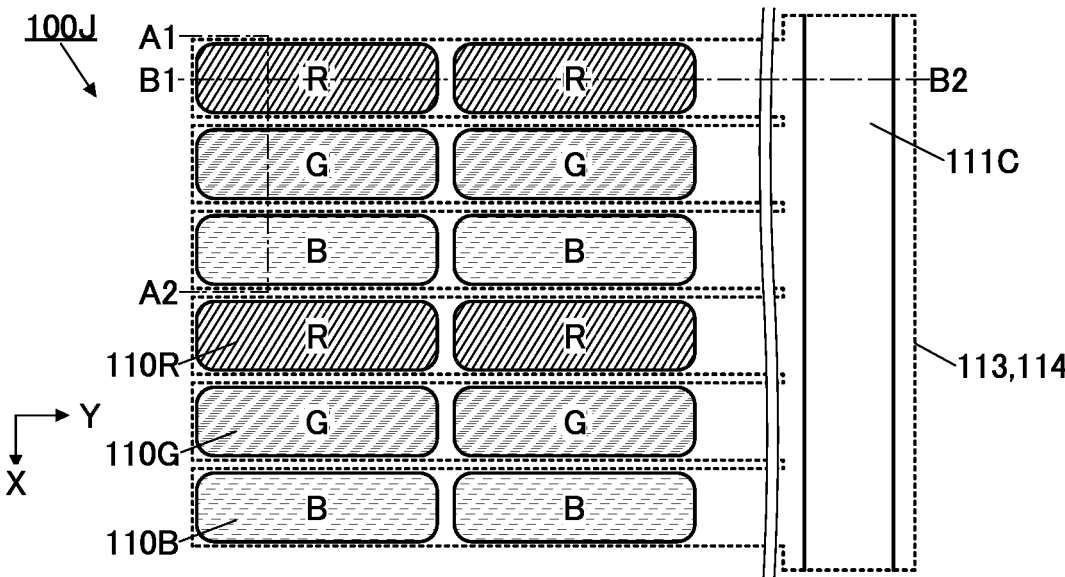
FIG. 16A to FIG. 16C are diagrams illustrating a structure example of a display device.
Figure 16B:
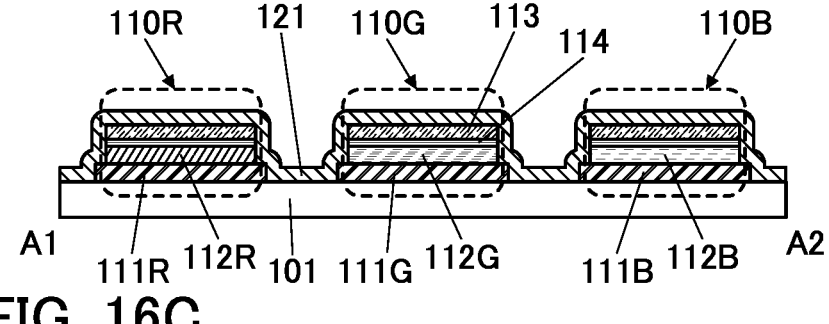
Figure 16C:
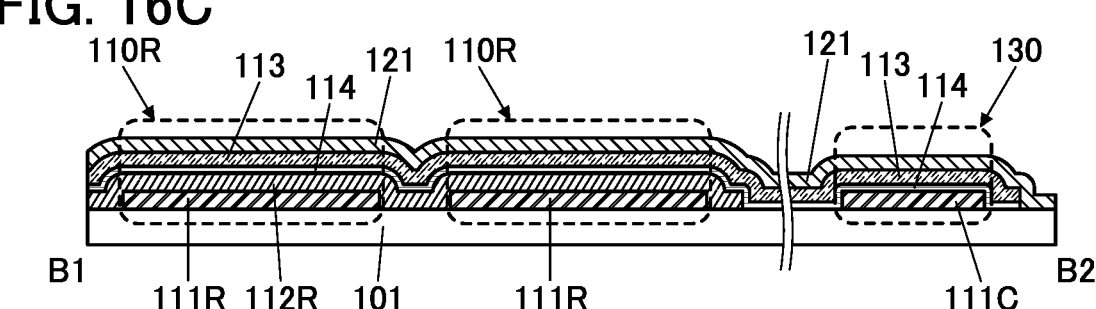

A display device 100J illustrated in FIG. 16A to FIG. 16C is different from the display device 100A mainly in that the insulating layer 131 is not included.

The aperture ratio can be sometimes increased without providing the insulating layer 131. Alternatively, the distance between light-emitting elements can be shortened and the resolution or the definition of the display device can be sometimes increased.

Modification Example 5

Figure 17A:
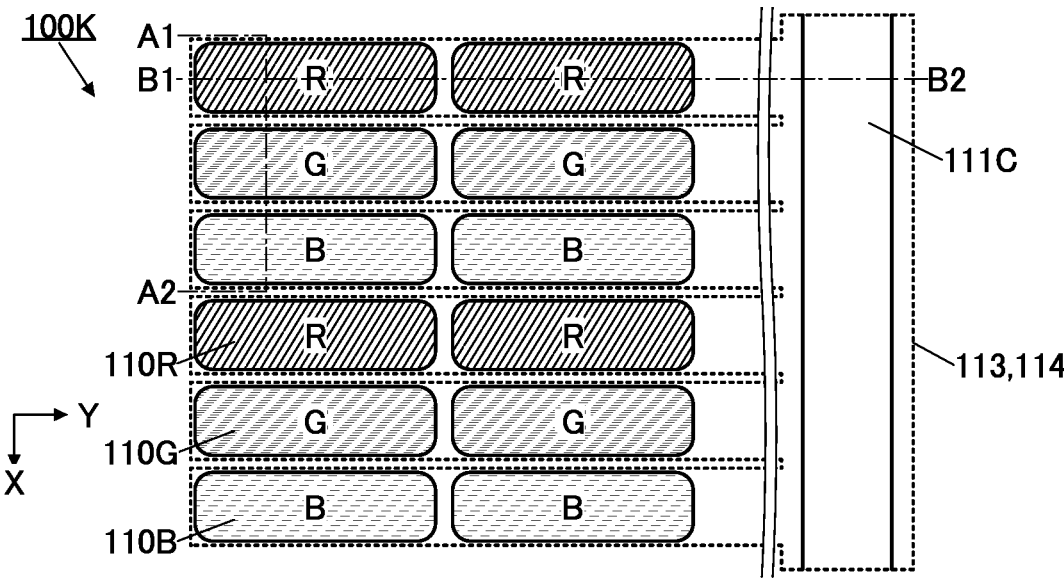
FIG. 17A to FIG. 17C are diagrams illustrating a structure example of a display device.
Figure 17B:
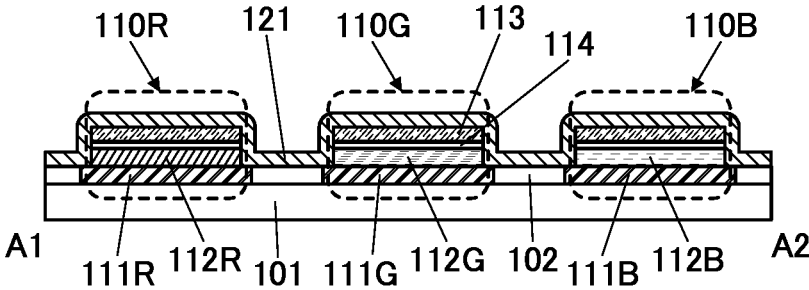
Figure 17C:
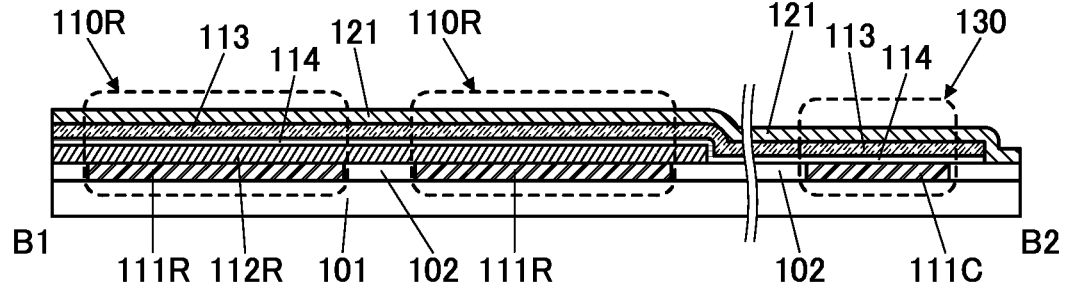

A display device 100K illustrated in FIG. 17A to FIG. 17C is different from the display device 100J mainly in that an insulating layer 102 is included and the structure of the pixel electrode 111 is different.

The display device 100K includes the insulating layer 102 over the substrate 101. In addition, the display device 100K has a structure in which the pixel electrode 111 is embedded in an opening provided in the insulating layer 102. That is, a top surface of the pixel electrode 111 and a top surface of the insulating layer 102 are substantially level with each other. With such a structure, the EL layer 112 can be formed on a flat surface, the coverage with the EL layer 112 can be improved.

Note that in this specification and the like, the expression "substantially level with" indicates a structure having the same level from a reference surface (e.g., a flat surface such as a substrate surface) in a cross-sectional view. For example, in a manufacturing process of the semiconductor device, planarization treatment (typically, CMP treatment) is performed, whereby the surface(s) of a single layer or a plurality of layers are exposed in some cases. In this case, the surfaces on which the CMP treatment is performed is at the same level from a reference surface. In addition, the expression "substantially level with" includes the case of being level with each other. Note that a plurality of layers are not level with each other in some cases, depending on a treatment apparatus, a treatment method, or a material of the treated surfaces on which the CMP treatment is performed. This case is also regarded as "substantially level with" in this specification and the like. For example, the expression "substantially level with" includes the case where two layers (here, given as a first layer and a second layer) having different two levels with respect to the reference surface are included, and the difference between the top-surface level of the first layer and the top-surface level of the second layer is less than or equal to 20 nm.

The above is the description of the modification example.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 2

In this embodiment, a structure example of a display device of one embodiment of the present invention is described.

The display device in this embodiment can be a high-resolution display device or large-sized display device. Accordingly, the display device of this embodiment can be used for display portions of electronic apparatuses such as a digital camera, a digital video camera, a digital photo frame, a mobile phone, a portable game console, a smart phone, a wristwatch terminal, a tablet terminal, a portable information terminal, and an audio reproducing device, in addition to display portions of electronic apparatuses with a relatively large screen, such as a television device, a desktop or laptop personal computer, a monitor of a computer or the like, digital signage, and a large game machine such as a pachinko machine.

[Display Device 400A]

Figure 18:
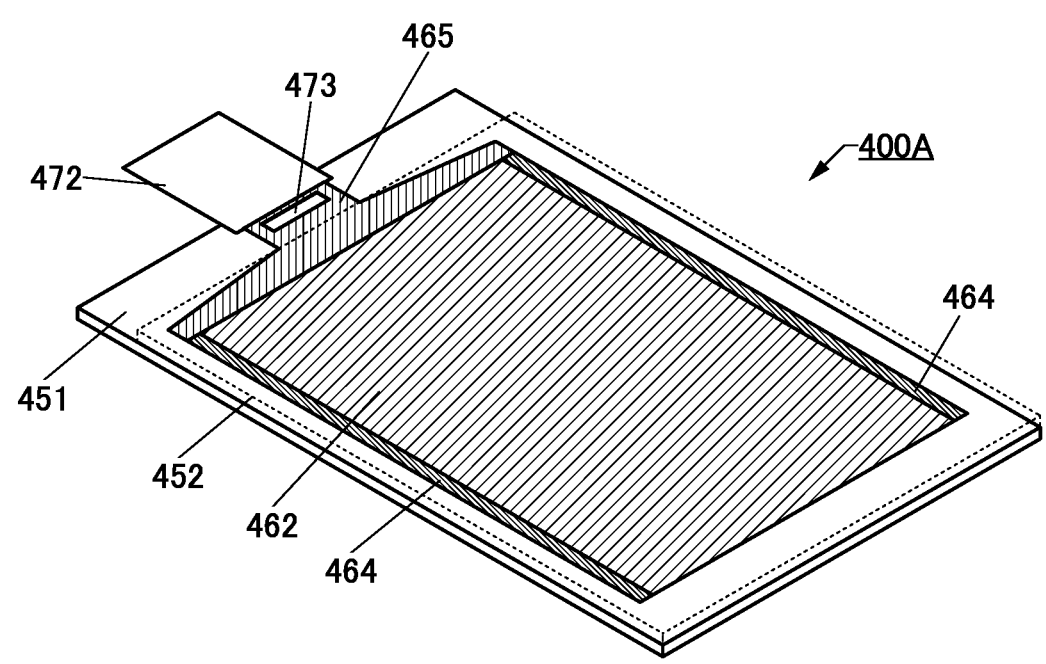
FIG. 18 is a perspective view illustrating an example of a display device.
Figures 19A, 19B:
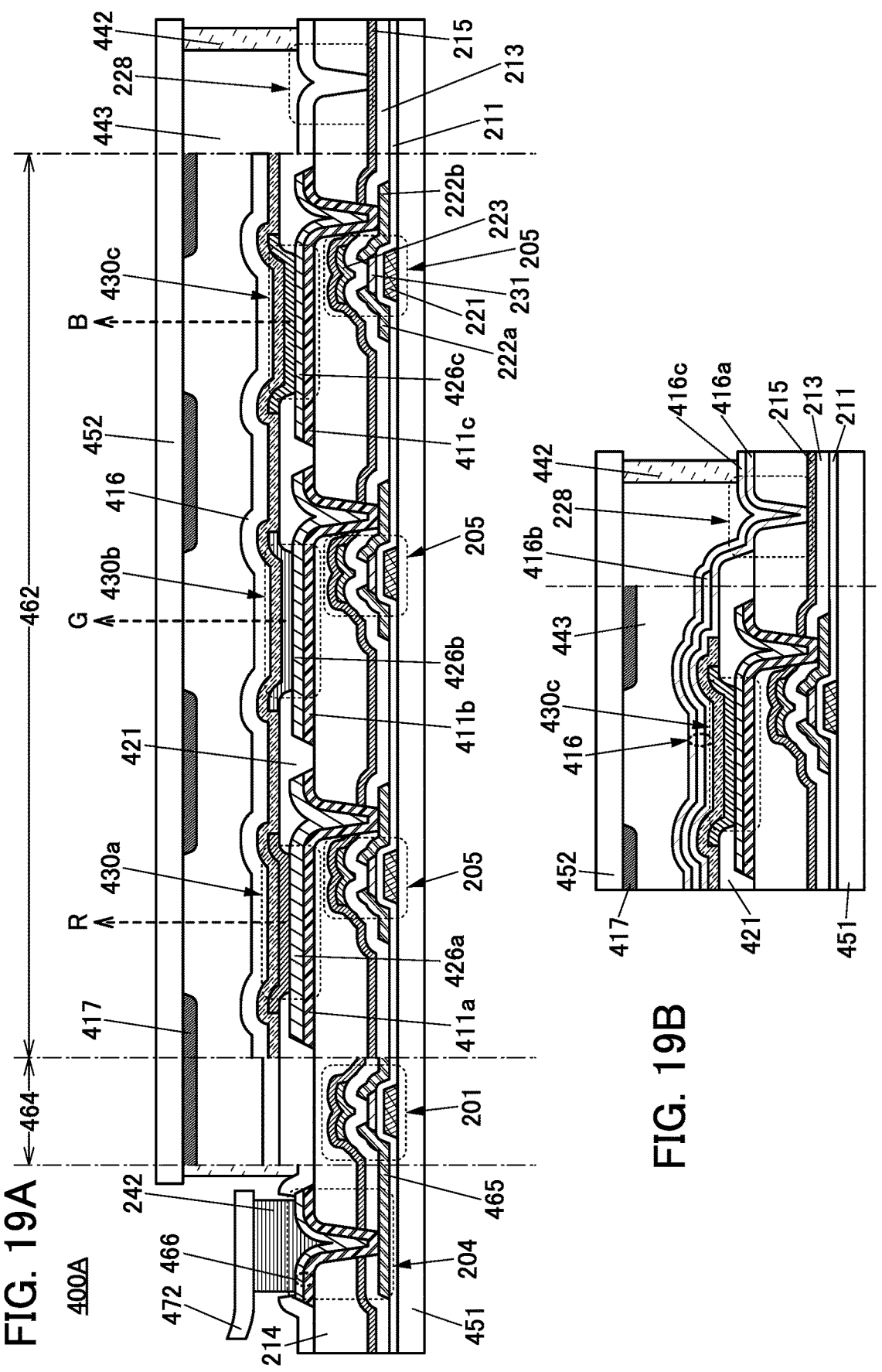
FIG. 19A and FIG. 19B are cross-sectional views illustrating an example of a display device.

FIG. 18 illustrates a perspective view of a display device 400A, and FIG. 19A illustrates a cross-sectional view of the display device 400A.

The display device 400A has a structure where a substrate 452 and a substrate 451 are bonded to each other. In FIG. 18, the substrate 452 is denoted by dashed line.

The display device 400A includes a display portion 462, a circuit 464, a wiring 465, and the like. FIG. 18 illustrates an example in which an integrated circuit (IC) 473 and an FPC 472 are implemented on the display device 400A. Thus, the structure illustrated in FIG. 18 can be regarded as a display module including the display device 400A, the IC, and the FPC.

As the circuit 464, a scan line driver circuit can be used, for example.

The wiring 465 has a function of supplying a signal and power to the display portion 462 and the circuit 464. The signal and power are input to the wiring 465 from the outside through the FPC 472 or input to the wiring 465 from the IC 473.

FIG. 18 illustrates an example in which the IC 473 is provided over the substrate 451 by a chip on glass (COG) method, a chip on film (COF) method, or the like. An IC including a scan line driver circuit, a signal line driver circuit, or the like can be used as the IC 473, for example. Note that the display device 400A and the display module are not necessarily provided with an IC. The IC may be mounted on the FPC by a COF method or the like.

FIG. 19A illustrates an example of cross sections of part of a region including the FPC 472, part of the circuit 464, part of the display portion 462, and part of a region including an end portion of the display device 400A.

The display device 400A illustrated in FIG. 19A includes a transistor 201, a transistor 205, a light-emitting element 430a which emits red light, a light-emitting element 430b which emits green light, a light-emitting element 430c which emits blue light, and the like between the substrate 451 and the substrate 452.

The light-emitting element described in Embodiment 1 can be employed for the light-emitting element 430a, the light-emitting element 430b, and the light-emitting element 430c.

Here, in the case where a pixel of the display device includes three kinds of subpixels including light-emitting elements emitting different colors from each other, the three subpixels can be subpixels of three colors of R, G, and B, subpixels of three colors of yellow (Y), cyan (C), and magenta (M), or the like. In the case where four subpixels are included, the four subpixels can be subpixels of four colors of R, G, B, and white (W), subpixels of four colors of R, G, B, and Y, or the like.

A protective layer 416 and the substrate 452 are bonded to each other with the adhesive layer 442. A solid sealing structure, a hollow sealing structure, or the like can be employed to seal the light-emitting elements. In FIG. 19A, a hollow sealing structure is employed in which a space 443 surrounded by the substrate 452, the adhesive layer 442, and the substrate 451 is filled with an inert gas (e.g., nitrogen or argon). The adhesive layer 442 may overlap with the light-emitting element. The space 443 surrounded by the substrate 452, the adhesive layer 442, and the substrate 451 may be filled with a resin different from that of the adhesive layer 442.

The light-emitting element 430a, the light-emitting element 430b, and the light-emitting element 430c each have an optical adjustment layer between the pixel electrode and the EL layer. The light-emitting element 430a includes an optical adjustment layer 426a, the light-emitting element 430b includes an optical adjustment layer 426b, and the light-emitting element 430c includes an optical adjustment layer 426c. Embodiment 1 can be referred to for the details of the light-emitting elements.

A pixel electrode 411a, a pixel electrode 411b, and a pixel electrode 411c are each connected to a conductive layer 222b included in the transistor 205 through an opening provided in an insulating layer 214.

End portions of the pixel electrode and the optical adjustment layer are covered with an insulating layer 421. The pixel electrode contains a material that reflects visible light, and the common electrode contains a material that transmits visible light.

Light emitted from the light-emitting element is emitted toward the substrate 452 side. For the substrate 452, a material having a high visible-light-transmitting property is preferably used.

The transistor 201 and the transistor 205 are formed over the substrate 451. These transistors can be formed using same material in the same step.

An insulating layer 211, an insulating layer 213, an insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may be either a single layer or two or more layers.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of the end portion of the display device 400A. This can inhibit entry of impurities from the end portion of the display device 400A through the organic insulating film. Alternatively, the organic insulating film may be formed so that an end portion of the organic insulating film is positioned on the inner side compared to the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 19A, an opening is formed in the insulating layer 214. This can inhibit entry of impurities into the display portion 462 from the outside through the insulating layer 214 even when an organic insulating film is used as the insulating layer 214. Consequently, the reliability of the display device 400A can be increased.

Each of the transistor 201 and the transistor 205 includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity, in which case deterioration of the transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display device of this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, InM:Zn=2:1:3 or a composition in the neighborhood thereof, In:M:Zn=3:1:2 or a composition in the neighborhood thereof, In:M:Zn=4:2:3 or a composition in the neighborhood thereof, InM:Zn=4:2:4.1 or a composition in the neighborhood thereof, In:M:Zn=5:1:3 or a composition in the neighborhood thereof, In:M:Zn=5:1:6 or a composition in the neighborhood thereof, InM:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, in the case of describing an atomic ratio of In:Ga:Zn=4:2:3 or a composition in the neighborhood thereof, the case is included in which with the atomic ratio of In being 4, the atomic ratio of Ga is greater than or equal to 1 and less than or equal to 3 and the atomic ratio of Zn is greater than or equal to 2 and less than or equal to 4. In the case of describing an atomic ratio of In:Ga:Zn=5:1:6 or a composition in the neighborhood thereof, the case is included in which with the atomic ratio of In being 5, the atomic ratio of Ga is greater than 0.1 and less than or equal to 2 and the atomic ratio of Zn is greater than or equal to 5 and less than or equal to 7. In the case of describing an atomic ratio of In:Ga:Zn=1:1:1 or a composition in the neighborhood thereof, the case is included in which with the atomic ratio of In being 1, the atomic ratio of Ga is greater than 0.1 and less than or equal to 2 and the atomic ratio of Zn is greater than 0.1 and less than or equal to 2.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 where the substrate 452 does not overlap. In the connection portion 204, the wiring 465 is electrically connected to the FPC 472 through a conductive layer 466 and a connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On a top surface of the connection portion 204, the conductive layer 466 is exposed. Thus, the connection portion 204 and the FPC 472 can be electrically connected to each other through the connection layer 242.

A light-blocking layer 417 is preferably provided on the surface of the substrate 452 on the substrate 451 side. A variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be arranged on the outer side of the substrate 452.

When the protective layer 416 covering the light-emitting element is provided, which inhibits an impurity such as water from entering the light-emitting element. As a result, the reliability of the light-emitting element can be enhanced.

In the region 228 in the vicinity of the end portion of the display device 400A, the insulating layer 215 and the protective layer 416 are preferably in contact with each other through an opening in the insulating layer 214. In particular, the inorganic insulating film included in the insulating layer 215 and the inorganic insulating film included in the protective layer 416 are preferably in contact with each other. This can inhibit entry of impurities into the display portion 462 from the outside through the organic insulating film. Consequently, the reliability of the display device 400A can be enhanced.

FIG. 19B illustrates an example in which the protective layer 416 has a three-layer structure. In FIG. 19B, the protective layer 416 includes an inorganic insulating layer 416a over the light-emitting element 430c, an organic insulating layer 416b over the inorganic insulating layer 416a, and an inorganic insulating layer 416c over the organic insulating layer 416b.

An end portion of the inorganic insulating layer 416a and an end portion of the inorganic insulating layer 416c extend beyond an end portion of the organic insulating layer 416b and are in contact with each other. The inorganic insulating layer 416a is in contact with the insulating layer 215 (inorganic insulating layer) through the opening in the insulating layer 214 (organic insulating layer). Accordingly, the light-emitting element can be surrounded by the insulating layer 215 and the protective layer 416, whereby the reliability of the light-emitting element can be increased.

As described above, the protective layer 416 may have a stacked-layer structure of an organic insulating film and an inorganic insulating film. In that case, an end portion of the inorganic insulating film preferably extend beyond an end portion of the organic insulating film.

For each of the substrate 451 and the substrate 452, glass, quartz, ceramics, sapphire, a resin, a metal, an alloy, a semiconductor, or the like can be used. The substrate on the side from which light from the light-emitting element is extracted is formed using a material which transmits the light. When the substrate 451 and the substrate 452 are formed using a flexible material, the flexibility of the display device can be increased. Furthermore, a polarizing plate may be used as the substrate 451 or the substrate 452.

For each of the substrate 451 and the substrate 452, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

Examples of materials used for the gates (gate terminals or gate electrodes), the sources (source terminals, source regions, or source electrodes), and the drains (drain terminals, drain regions, or drain electrodes) of transistors and conductive layers such as a variety of wirings and electrodes included in the display device include any of metals such as aluminum, titanium, chromium, nickel, copper, yttrium, zirconium, molybdenum, silver, tantalum, and tungsten, and an alloy containing any of these metals as its main component. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium, or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display device, and conductive layers (e.g., a conductive layer functioning as a pixel electrode or a common electrode) included in a light-emitting element.

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

[Display Device 400B]

Figures 20A, 20B:
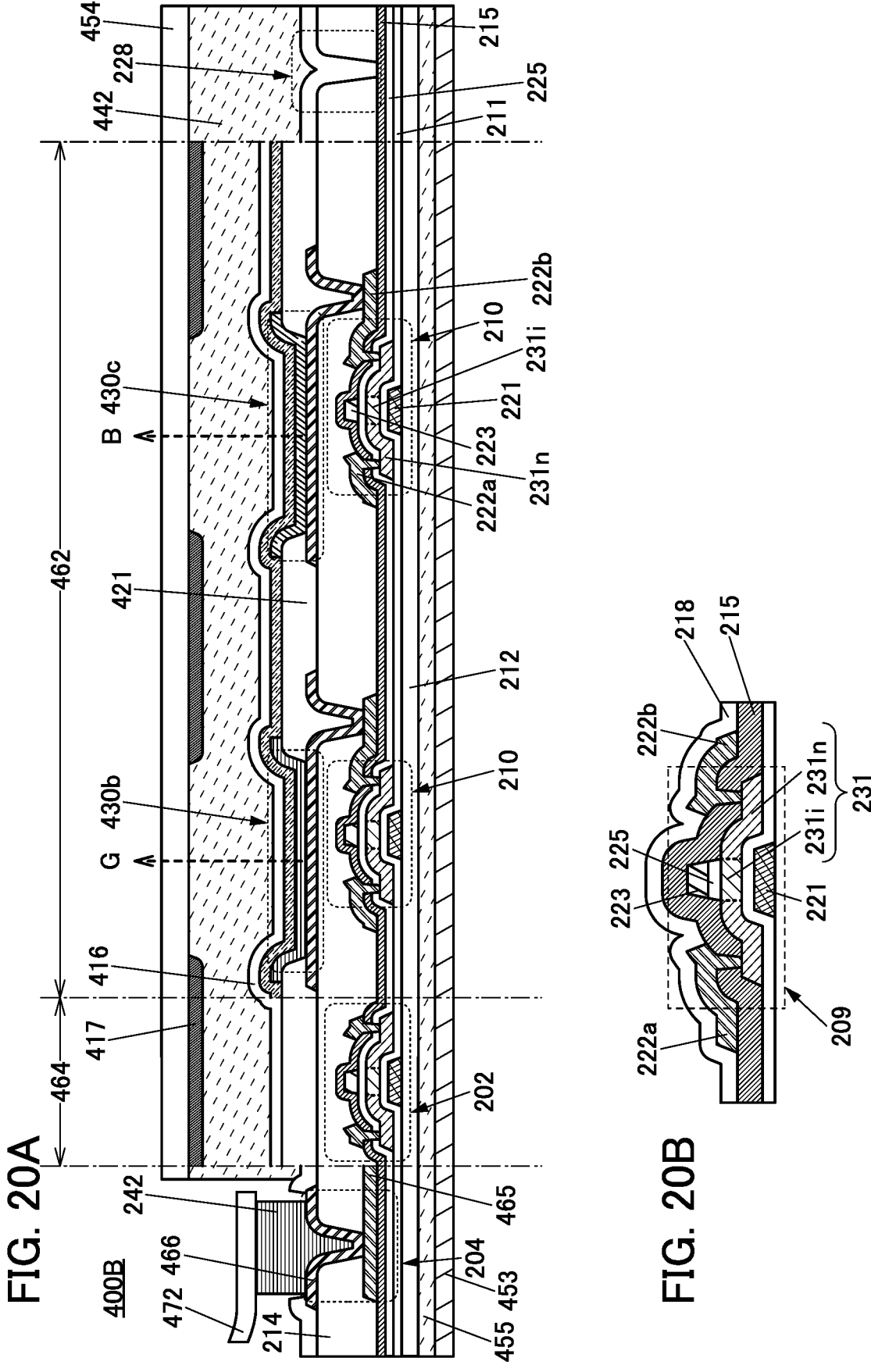
FIG. 20A is a cross-sectional view illustrating an example of a display device.
FIG. 20B is a cross-sectional view illustrating an example of a transistor.

FIG. 20A illustrates a cross-sectional view of a display device 400B. A perspective view of the display device 400B is similar to that of the display device 400A (FIG. 18). FIG. 20A illustrates an example of cross sections of part of a region including the FPC 472, part of the circuit 464, and part of the display portion 462 in the display device 400B. FIG. 20A specifically illustrates an example of a cross section of a region including the light-emitting element 430b, which emits green light, and the light-emitting element 430c, which emits blue light, in the display portion 462. Note that portions similar to those in the display device 400A are not described in some cases.

The display device 400B illustrated in FIG. 20A includes a transistor 202, transistors 210, the light-emitting element 430b, the light-emitting element 430c, and the like between the substrate 453 and the substrate 454.

The substrate 454 and the protective layer 416 are bonded to each other with the adhesive layer 442. The adhesive layer 442 is provided so as to overlap with the light-emitting element 430b and the light-emitting element 430c; that is, the display device 400B employs a solid sealing structure.

The substrate 453 and an insulating layer 212 are bonded to each other with an adhesive layer 455.

As a method for manufacturing the display device 400B, first, a formation substrate provided with the insulating layer 212, the transistors, the light-emitting elements, and the like and the substrate 454 provided with the light-blocking layer 417 are bonded to each other with the adhesive layer 442. Then, the substrate 453 is attached to a surface exposed by separation of the formation substrate, whereby the components formed over the formation substrate are transferred to the substrate 453. The substrate 453 and the substrate 454 are preferably flexible. Accordingly, the display device 400B can be highly flexible.

The inorganic insulating film that can be used as the insulating layer 211, the insulating layer 213, or the insulating layer 215 can be used as the insulating layer 212.

The pixel electrode is connected to the conductive layer 222b included in the transistor 210 through the opening provided in the insulating layer 214. The conductive layer 222b is connected to a low-resistance region 231n through an opening provided in the insulating layer 215 and an insulating layer 225. The transistor 210 has a function of controlling the driving of the light-emitting element.

An end portion of the pixel electrode is covered with the insulating layer 421.

Light emitted from the light-emitting element 430b and the light-emitting element 430c is emitted toward the substrate 454 side. For the substrate 454, a material having a high visible-light-transmitting property is preferably used.

The connection portion 204 is provided in a region of the substrate 453 where the substrate 454 does not overlap. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

The transistor 202 and the transistor 210 each include the conductive layer 221 functioning as a gate, the insulating layer 211 functioning as a gate insulating layer, a semiconductor layer including a channel formation region 231i and a pair of low-resistance regions 231n, the conductive layer 222a connected to one of the low-resistance regions 231n, the conductive layer 222b connected to the other low-resistance region 231n, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 215. One of the conductive layer 222a and the conductive layer 222b serves as a source, and the other serves as a drain.

FIG. 20A illustrates an example in which the insulating layer 225 covers a top surface and side surfaces of the semiconductor layer. The conductive layer 222a and the conductive layer 222b are each connected to the corresponding low-resistance region 231n through openings provided in the insulating layer 225 and the insulating layer 215.

In a transistor 209 illustrated in FIG. 20B, the insulating layer 225 overlaps with the channel formation region 231i of the semiconductor layer 231 and does not overlap with the low-resistance regions 231n. The structure illustrated in FIG. 20B is obtained by processing the insulating layer 225 with the conductive layer 223 as a mask, for example. In FIG. 20B, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer 218 covering the transistor may be provided.

At least part of the structure examples, the drawings corresponding thereto, and the like described in this embodiment as an example can be combined with any of the other structure examples, the other drawings, and the like as appropriate.

At least part of this embodiment can be implemented in combination with any of the other embodiments described in this specification, as appropriate.

Embodiment 3

In this embodiment, a structure example of a display device different from the above is described.

The display device in this embodiment can be a high-resolution display device. Thus, the display device in this embodiment can be used for display portions of information terminals (wearable devices) such as watch-type or bracelet-type information terminals and display portions of wearable devices capable of being worn on a head, such as a VR device such as a head mounted display and a glasses-type AR device.

[Display Module]

Figure 21A:
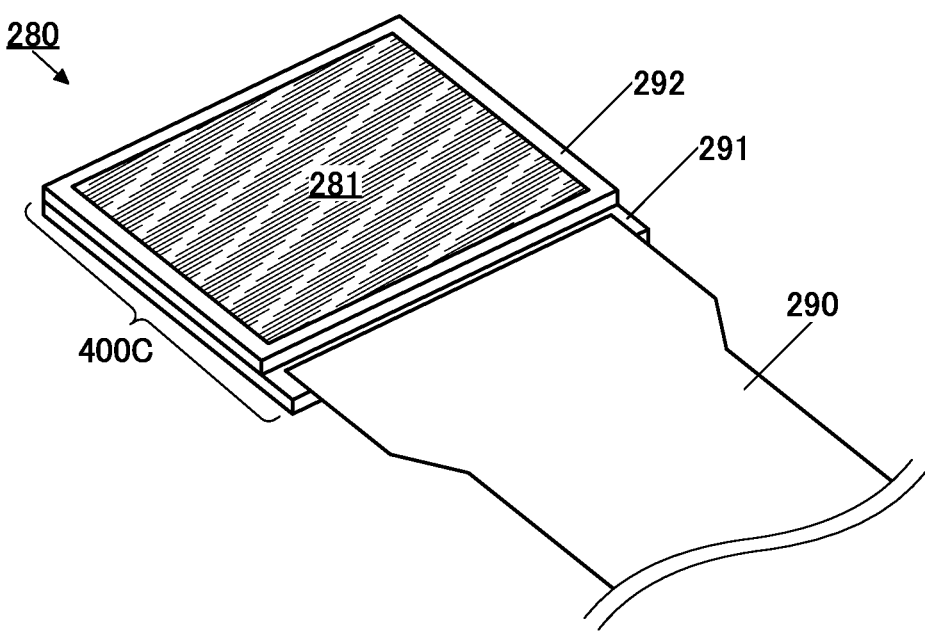
FIG. 21A and FIG. 21B are perspective views illustrating an example of a display module.

FIG. 21A is a perspective view of a display module 280. The display module 280 includes a display device 400C and an FPC 290. Note that the display device included in the display module 280 is not limited to the display device 400C and may be a display device 400D or a display device 400E described later.

The display module 280 includes a substrate 291 and a substrate 292. The display module 280 includes a display portion 281. The display portion 281 is a region of the display module 280 where an image is displayed and is a region where light emitted from pixels provided in a pixel portion 284 described later can be seen.

Figure 21B:
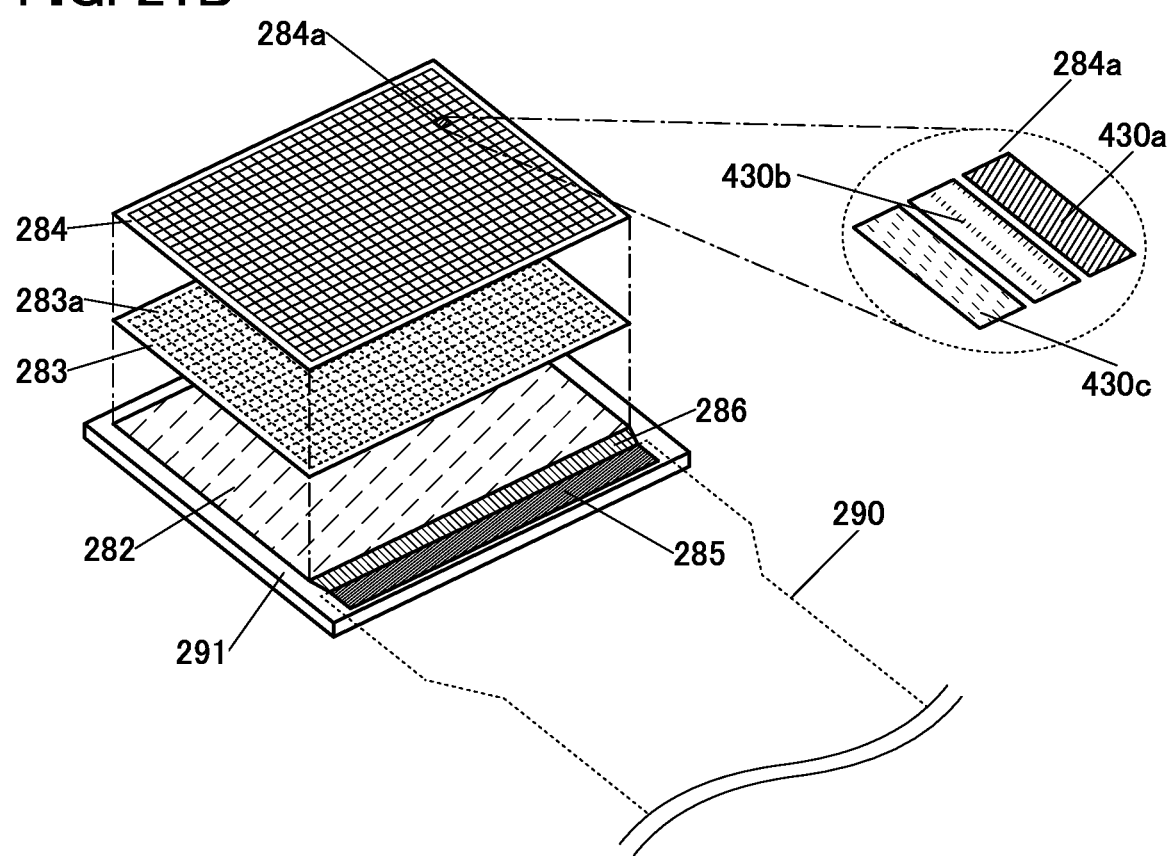

FIG. 21B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapping with the pixel portion 284 over the substrate 291. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side in FIG. 21B. The pixel 284a includes the light-emitting element 430a, the light-emitting element 430b, and the light-emitting element 430c whose emission colors are different from each other. The plurality of light-emitting elements may be arranged in a stripe pattern as illustrated in FIG. 21B. With the stripe pattern that enables high-density arrangement of pixel circuits, a high-resolution display device can be provided. Alternatively, a variety of arrangement methods, such as a delta pattern or a PenTile pattern can be employed.

The pixel circuit portion 283 includes a plurality of pixel circuits 283a arranged periodically.

One pixel circuit 283a is a circuit that controls light emission from three light-emitting elements included in one pixel 284a. One pixel circuit 283a may be provided with three circuits each of which controls light emission of one light-emitting element. For example, the pixel circuit 283a can include at least one selection transistor, one current control transistor (driving transistor), and a capacitor for one light-emitting element. A gate signal is input to a gate of the selection transistor, and a source signal is input to one of a source and a drain of the selection transistor. With such a structure, an active-matrix display device is achieved.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 serves as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have greatly high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a device for VR such as a head-mounted display or a glasses-type device for AR. For example, even in the case of a structure in which the display portion of the display module 280 is seen through a lens, pixels of the extremely-high-resolution display portion 281 included in the display module 280 are prevented from being seen when the display portion is enlarged by the lens, so that display providing a high sense of immersion can be performed. Without being limited thereto, the display module 280 can be suitably used for electronic apparatuses including a relatively small display portion. For example, the display module 280 can be favorably used in a display portion of a wearable electronic apparatus, such as a wrist watch.

[Display Device 400C]

Figure 22:
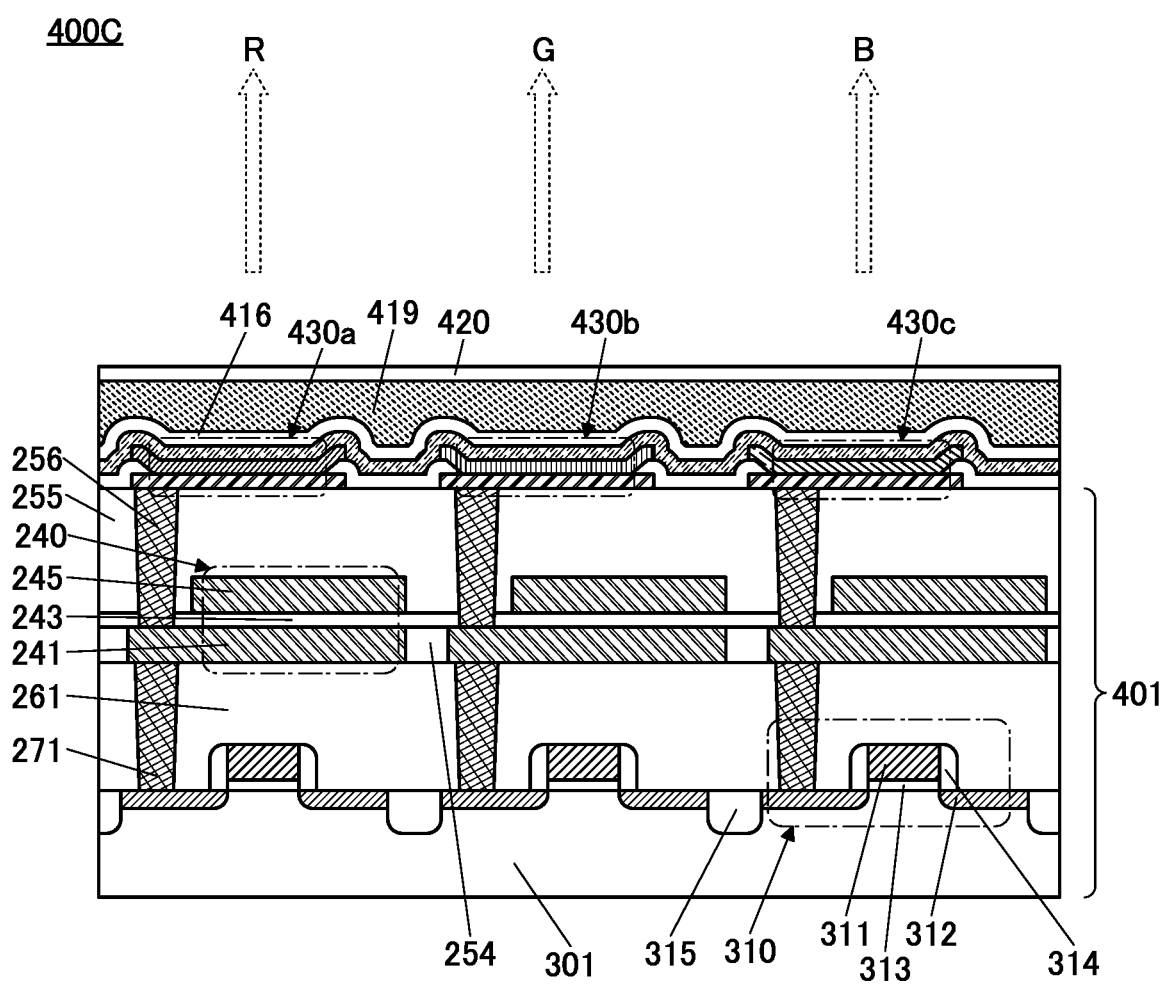
FIG. 22 is a cross-sectional view illustrating an example of a display device.

The display device 400C illustrated in FIG. 22 includes a substrate 301, the light-emitting element 430a, the light-emitting element 430b, the light-emitting element 430c, a capacitor 240, and a transistor 310.

The substrate 301 corresponds to the substrate 291 in FIG. 21A and FIG. 21B. A stacked-layer structure 401 from the substrate 301 up to the insulating layer 255 corresponds to the substrate 101 in Embodiment 1.

The transistor 310 is a transistor whose channel formation region is in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover a side surface of the conductive layer 311 and functions as an insulating layer.

An element isolation layer 315 is provided between two adjacent transistors 310 to be embedded in the substrate 301.

Furthermore, an insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of a source and a drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240, and the light-emitting element 430a, the light-emitting element 430b, the light-emitting element 430c, and the like are provided over the insulating layer 255. The protective layer 416 is provided over the light-emitting element 430a, the light-emitting element 430b, and the light-emitting element 430c, and a substrate 420 is bonded to a top surface of the protective layer 416 with a resin layer 419. The substrate 420 corresponds to the substrate 292 in FIG. 21A.

The pixel electrode of the light-emitting element is electrically connected to one of the source and the drain of the transistor 310 through a plug 256 embedded in the insulating layer 255, the conductive layer 241 embedded in the insulating layer 254, and the plug 271 embedded in the insulating layer 261.

[Display Device 400D]

Figure 23:
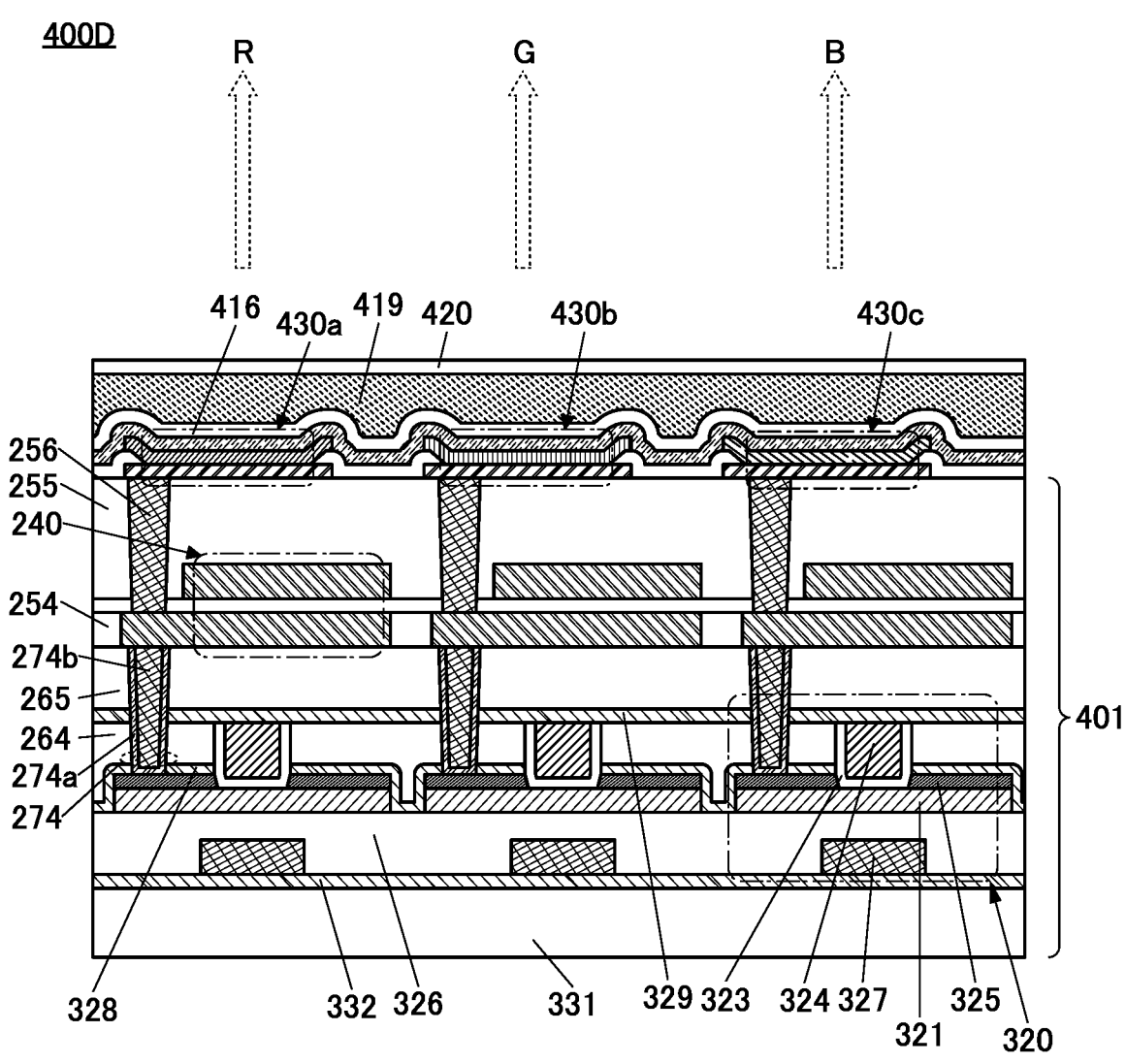
FIG. 23 is a cross-sectional view illustrating an example of a display device.

The display device 400D illustrated in FIG. 23 is different from the display device 400C mainly in a structure of the transistor. Note that portions similar to those in the display device 400C are not described in some cases.

A transistor 320 contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

The substrate 331 corresponds to the substrate 291 in FIG. 21A and FIG. 21B. The stacked-layer structure 401 from the substrate 331 to the insulating layer 255 corresponds to the substrate 101 in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, and a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. A top surface of the insulating layer 326 is preferably planarized.

The semiconductor layer 321 is provided over the insulating layer 326. The semiconductor layer 321 preferably includes a film of a metal oxide exhibiting semiconductor characteristics (also referred to as an oxide semiconductor). A material that can be suitably used for the semiconductor layer 321 is described in detail later.

The pair of conductive layers 325 is provided on and in contact with the semiconductor layer 321, and functions as a source electrode and a drain electrode.

An insulating layer 328 is provided to cover top surfaces and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The conductive layer 324 and the insulating layer 323 that is in contact with side surfaces of the insulating layer 264, the insulating layer 328, and the conductive layer 325 and a top surface of the semiconductor layer 321 are embedded in the opening. The conductive layer 324 functions as a second gate electrode, and the insulating layer 323 functions as a second gate insulating layer.

A top surface of the conductive layer 324, a top surface of the insulating layer 323, and a top surface of the insulating layer 264 are planarized so that they are substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 or the like to the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274b in contact with a top surface of the conductive layer 274a and a conductive layer 274a that covers side surfaces of openings formed in the insulating layer 265, the insulating layer 329, the insulating layer 264, and the insulating layer 328 and part of a top surface of the conductive layer 325. For the conductive layer 274a, a conductive material in which hydrogen and oxygen are less likely to diffuse is preferably used.

The structure from the insulating layer 254 to the substrate 420 in the display device 400D is similar to that of the display device 400C.

[Display Device 400E]

Figure 24:
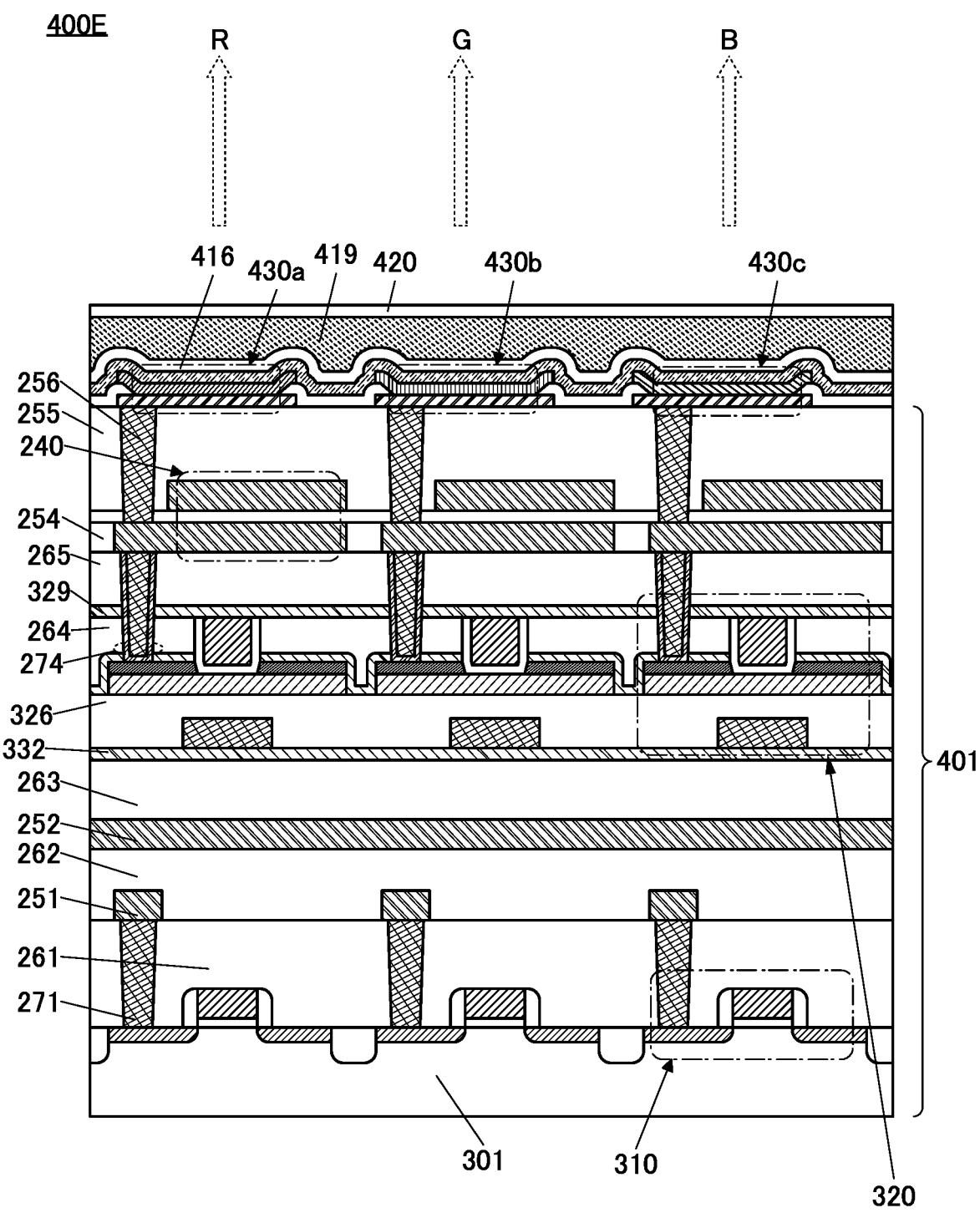
FIG. 24 is a cross-sectional view illustrating an example of a display device.

The display device 400E illustrated in FIG. 24 has a structure in which the transistor 310 whose channel is formed in the substrate 301 and the transistor 320 including a metal oxide in the semiconductor layer where the channel is formed are stacked. Note that portions similar to those of the display device 400C and the display device 400D are not described in some cases.

The insulating layer 261 is provided to cover the transistor 310, and a conductive layer 251 is provided over the insulating layer 261. The insulating layer 262 is provided so as to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in a pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit or the like can be formed directly under the light-emitting element; thus, the display device can be downsized as compared with the case where the driver circuit is provided around a display region At least part of the structure examples, the drawings corresponding thereto, and the like described in this embodiment can be combined with the other structure examples, the other drawings, and the like as appropriate.

At least part of this embodiment can be implemented in combination with the other embodiments described in this specification, as appropriate.

Embodiment 4

In this embodiment, light-emitting elements (also referred to as light-emitting devices) that can be used in a display device of one embodiment of the present invention are described.

<Structure Example of Light-Emitting Element>

Figures 25A, 25B, 25C, 25D:
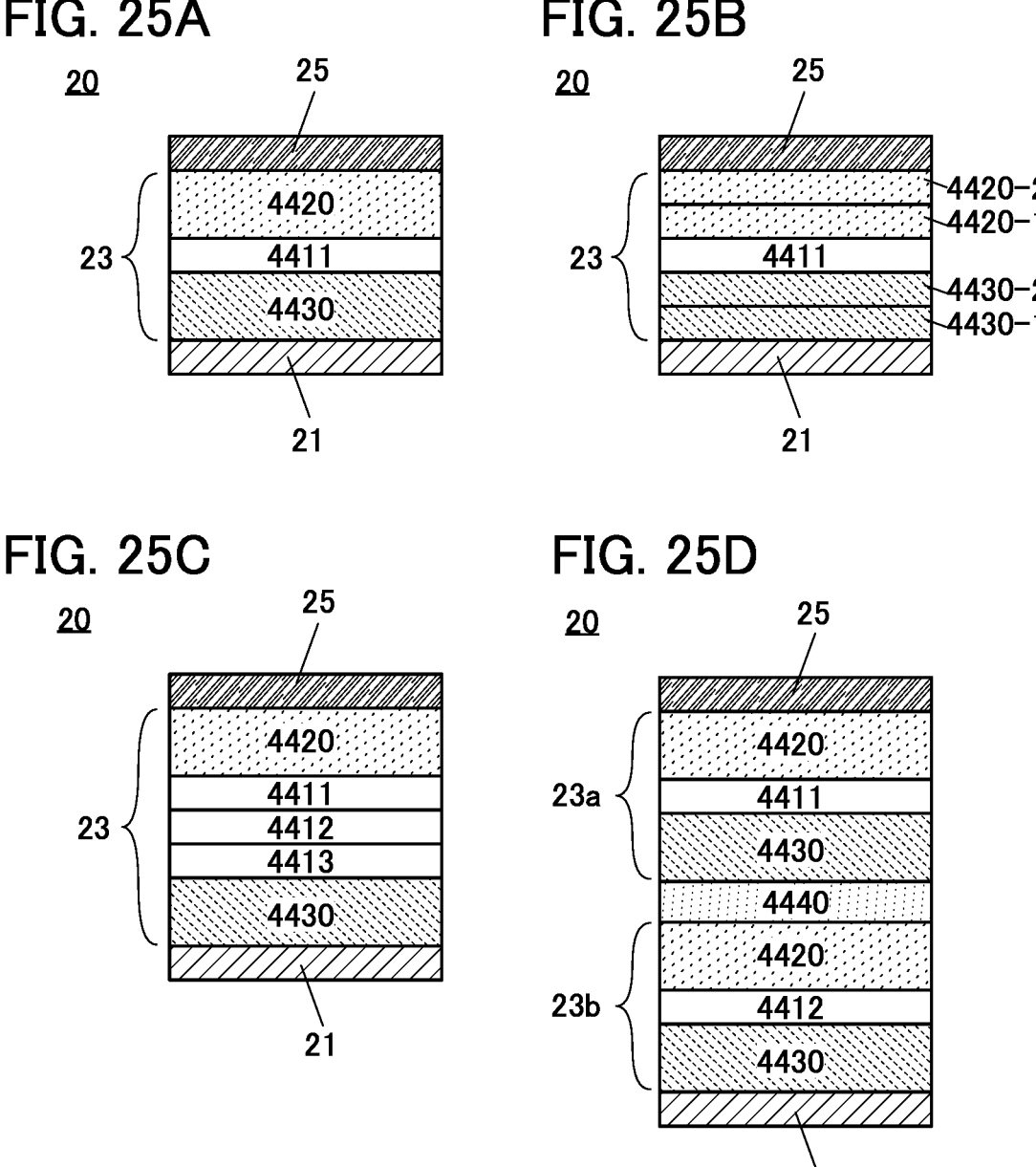
FIG. 25A to FIG. 25D are diagrams illustrating structure examples of a light-emitting element.

As illustrated in FIG. 25A, the light-emitting element includes an EL layer 23 between a pair of electrodes (a lower electrode 21 and an upper electrode 25). The EL layer 23 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can serve as one light-emitting unit, and the structure in FIG. 25A is referred to as a single structure in this specification.

FIG. 25B is a modification example of the EL layer 23 included in a light-emitting element 20 illustrated in FIG. 25A. Specifically, the light-emitting element 20 illustrated in FIG. 25B includes a layer 4430-1 over the lower electrode 21, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 25 over the layer 4420-2. For example, in the case where the lower electrode 21 functions as an anode and the upper electrode functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, in the case where the lower electrode 21 functions as a cathode and the upper electrode 25 functions as an anode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layer structure, carriers can be efficiently injected to the light-emitting layer 4411, and the efficiency of the recombination of carriers in the light-emitting layer 4411 can be enhanced.

Note that the structure in which a plurality of light-emitting layers (the light-emitting layer 4411, the light-emitting layer 4412, and the light-emitting layer 4413) are provided between the layer 4420 and the layer 4430 as illustrated in FIG. 25C is another variation of the single structure.

The structure in which a plurality of light-emitting units (an EL layer 23a and an EL layer 23b) are connected in series with an intermediate layer 4440 therebetween as illustrated in FIG. 25D is referred to as a tandem structure in this specification. Note that the intermediate layer 4440 is sometimes referred to as a charge-generation layer. In this specification and the like, the structure illustrated in FIG. 25D is referred to as a tandem structure; however, without being limited to this, the tandem structure may be referred to as a stack structure, for example. Note that the tandem structure enables a light-emitting element capable of high luminance light emission.

Note that also in FIG. 25C and FIG. 25D, the layer 4420 and the layer 4430 may each have a stacked-layer structure of two or more layers as illustrated in FIG. 25B.

The emission color of the light-emitting element can be red, green, blue, cyan, magenta, yellow, white, or the like depending on the material that constitutes the EL layer 23. Furthermore, the color purity can be further increased when the light-emitting element has a microcavity structure.

The light-emitting layer preferably contains two or more of light-emitting substances that emit light of R (red), G (green), B (blue), Y (yellow), O (orange), and the like. Alternatively, the light-emitting layer preferably contains two or more light-emitting substances that emit light containing two or more of spectral components of R, G, and B.

Here, a specific structure example of the light-emitting element is described.

The light-emitting element includes at least a light-emitting layer. The light-emitting element may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron- and hole-transport property), or the like.

Either a low molecular compound or a high molecular compound can be used for the light-emitting devices, and an inorganic compound may also be included. Each of the layers included in the light-emitting devices can be formed by a method such as an evaporation method (including a vacuum evaporation method), a transfer method, a printing method, an ink-jet method, a coating method, or the like.

For example, the light-emitting device can include one or more of a hole-injection layer, a hole-transport layer, a hole-blocking layer, an electron-blocking layer, an electron-transport layer, and an electron-injection layer.

The hole-injection layer is a layer that injects holes from an anode to the hole-transport layer and contains a material with a high hole-injection property. As the material with a high hole-injection property, an aromatic amine compound, a composite material containing a hole-transport material and an acceptor material (electron-accepting material), or the like can be given.

The hole-transport layer is a layer that transports holes, which are injected from the anode by the hole-injection layer, to the light-emitting layer. The hole-transport layer is a layer containing a hole-transport material. As the hole-transport material, a substance having a hole mobility greater than or equal to $1 \times 10^{-6}$ cm$^2$/Vs is preferable. Note that other substances can also be used as long as they have a property of transporting more holes than electrons. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferable. The electron-transport layer is a layer that transports electrons, which are injected from a cathode by the electron-injection layer, to the light-emitting layer. The electron-transport layer is a layer containing an electron-transport material. As the electron-transport material, a substance having an electron mobility greater than or equal to $1 \times 10^{-6}$ cm$^2$/Vs is preferable. Note that other substances can also be used as long as they have a property of transporting more electrons than holes. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate can be used.

Alternatively, a material with an electron-transport property can be used for the electron-injection layer. For example, a compound having an unshared electron pair and an electron deficient heteroaromatic ring can be used as the material with an electron-transport property. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to –3.6 eV and less than or equal to –2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino [2,3-a: 2',3'-c]phenazine (abbreviation: HATNA), 2,4,6-tris [3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

A conductive film that can be used for the cathode and the anode and transmits visible light can be formed using, for example, indium oxide, indium tin oxide, indium tin oxide containing silicon oxide (ITSO), indium zinc oxide, zinc oxide, or zinc oxide to which gallium is added. Alternatively, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride), or the like formed thin enough to have a light-transmitting property can be used. A stacked-layer film of any of the above materials can be used as a conductive layer. For example, a stacked-layer film of an alloy of silver and magnesium and indium tin oxide or indium tin oxide containing silicon is preferably used, in which case conductivity can be increased. Further alternatively, graphene or the like may be used.

The cathode or the anode is preferably formed using a conductive film that reflects visible light. For the conductive film, for example, a metal material such as aluminum, gold, platinum, silver, nickel, tungsten, chromium, molybdenum, iron, cobalt, copper, or palladium or an alloy containing any of these metal materials can be used. Silver is preferable because of its high reflectance of visible light. In addition, aluminum is preferable because an aluminum electrode is easily etched and thus is easily processed and aluminum has high reflectance of visible light and near-infrared light. Lanthanum, neodymium, germanium, or the like may be added to the above metal material or alloy. Alternatively, an alloy (an aluminum alloy) containing aluminum and titanium, nickel, or neodymium may be used. Alternatively, an alloy containing silver and copper, palladium, or magnesium may be used. An alloy containing silver and copper is preferable because of its high heat resistance.

The cathode or the anode may have a structure in which a conductive metal film or a metal oxide film is stacked over the conductive film reflecting visible light. With such a structure, oxidization, corrosion, or the like of the conductive film reflecting visible light can be inhibited. For example, when a metal film or a metal oxide film is stacked in contact with an aluminum film or an aluminum alloy film, oxidation can be inhibited. Examples of a material for the metal film or the metal oxide film include titanium and titanium oxide. Alternatively, the above conductive film that transmits visible light and a film containing a metal material may be stacked. For example, a stacked-layer film of silver and indium tin oxide or a stacked-layer film of an alloy of silver and magnesium and indium tin oxide can be used. Furthermore, the above metal film or the above metal oxide film may be provided under the conductive film that reflects visible light.

In the case where aluminum is used as the cathode or the anode, the thickness of aluminum is preferably greater than or equal to 40 nm, further preferably greater than or equal to 70 nm, in which case the reflectance of visible light or the like can be sufficiently increased. In the case where silver is used as the cathode or the anode, the thickness of silver is preferably greater than or equal to 70 nm, further preferably greater than or equal to 100 nm, in which case the reflectance of visible light or the like can be sufficiently increased.

As the conductive film having a light-transmitting property and a reflective property that can be used for the cathode or the anode, the conductive film reflecting visible light formed to be thin enough to transmit visible light can be used. In addition, with a stacked-layer structure of the conductive film and the conductive film transmitting visible light, the conductivity, the mechanical strength, or the like can be increased.

The conductive film having a light-transmitting property and a reflective property preferably has a reflectance with respect to visible light (e.g., the reflectance with respect to light having a predetermined wavelength within the range of 400 nm to 700 nm) of higher than or equal to 20% and lower than or equal to 80%, preferably higher than or equal to 40% and lower than or equal to 70%. The conductive film having a reflective property preferably has a reflectance with respect to visible light of higher than or equal to 40% and lower than or equal to 100%, further preferably higher than or equal to 70% and lower than or equal to 100%. The conductive film having a light-transmitting property preferably has a reflectance with respect to visible light of higher than or equal to 0% and lower than or equal to 40%, further preferably higher than or equal to 0% and lower than or equal to 30%.

The electrodes included in the light-emitting elements may each be formed by an evaporation method, a sputtering method, or the like. Alternatively, a discharging method such as an ink-jet method, a printing method such as a screen printing method, or a plating method may be used for the formation.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 5

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the maximum diameter of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution transmission electron microscope (TEM) image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using 0120 scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The ratio of the flow rate of the oxygen gas to the total flow rate of the deposition gas in deposition is preferably as low as possible, for example, the ratio of the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where the CAC-OS is used for a transistor, a switching function (On/Off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$), and excellent switching operation can be achieved.

A transistor using a CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with any of the other embodiments described in this specification, as appropriate.

Embodiment 6

In this embodiment, electronic apparatuses of embodiments of the present invention is described with reference to FIG. 26 to FIG. 29.

An electronic apparatus in this embodiment includes the display device of one embodiment of the present invention. For the display device of one embodiment of the present invention, increases in resolution, definition, and sizes are easily achieved. Thus, the display device of one embodiment of the present invention can be used for display portions of a variety of electronic apparatuses.

The display device of one embodiment of the present invention can be manufactured at low cost, which leads to a reduction in manufacturing cost of an electronic apparatus.

Examples of the electronic apparatuses include a digital camera, a digital video camera, a digital photo frame, a mobile phone, a portable game console, a portable information terminal, and an audio reproducing device, in addition to electronic apparatuses with a relatively large screen, such as a television device, a desktop or laptop personal computer, a monitor of a computer or the like, digital signage, and a large game machine such as a pachinko machine.

In particular, a display device of one embodiment of the present invention can have a high resolution, and thus can be favorably used for an electronic apparatus having a relatively small display portion. As such an electronic apparatus, a watch-type or bracelet-type information terminal device (wearable device); and a wearable device worn on a head, such as a device for VR such as a head mounted display and a glasses-type device for AR can be given, for example. Examples of wearable devices include a device for SR and a device for MR.

The resolution of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, resolution of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display device with high resolution and high definition, the electronic apparatus can have higher realistic sensation, sense of depth, and the like in personal use such as portable use and home use.

The electronic apparatus in this embodiment can be incorporated along a curved surface of an inside wall or an outside wall of a house or a building or the interior or the exterior of a car.

The electronic apparatus in this embodiment may include an antenna. With the antenna receiving a signal, the electronic apparatus can display an image, information, and the like on a display portion. When the electronic apparatus includes an antenna and a secondary battery, the antenna may be used for contactless power transmission.

The electronic apparatus in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic apparatus in this embodiment can have a variety of functions. For example, the electronic apparatus of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 26A:
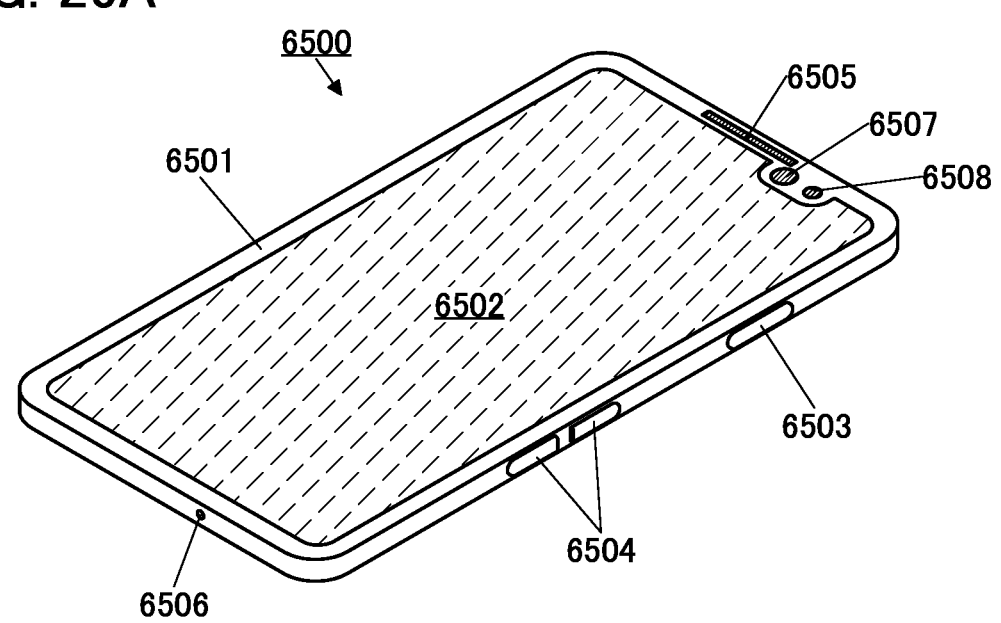
FIG. 26A and FIG. 26B are diagrams illustrating an example of an electronic apparatus.

An electronic apparatus 6500 in FIG. 26A is a portable information terminal that can be used as a smartphone.

The electronic apparatus 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 26B:
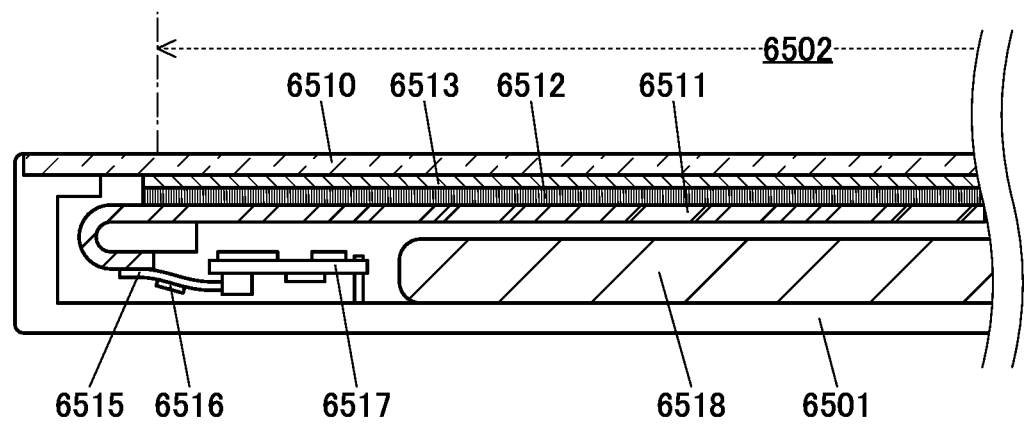

FIG. 26B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic apparatus can be achieved. Since the display panel 6511 is extremely thin, the battery 6518 with high capacity can be mounted without an increase in the thickness of the electronic apparatus. Moreover, part of the display panel 6511 is folded back so that a connection portion with the FPC 6515 is provided on the back side of the pixel portion, whereby an electronic apparatus with a narrow bezel can be achieved.

FIG. 27A illustrates an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 27A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 27B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

FIG. 27C and FIG. 27D illustrate examples of digital signage.

Digital signage 7300 illustrated in FIG. 27C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 27D is digital signage 7400 attached to a cylindrical pillar 7401. The digital signage 7400 includes the display portion 7000 provided along a curved surface of the pillar 7401.

The display device of one embodiment of the present invention can be used in the display portion 7000 illustrated in each of FIG. 27C and FIG. 27D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 27C and FIG. 27D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

FIG. 28A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video and the like received from the camera 8000 on the display portion 8102.

The button 8103 functions as a power supply button or the like.

A display device of one embodiment of the present invention can be used in the display portion 8002 of the camera 8000 and the display portion 8102 of the finder 8100. Note that a finder may be incorporated in the camera 8000.

FIG. 28B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing in the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

A display device of one embodiment of the present invention can be used in the display portion 8204.

FIG. 28C to FIG. 28E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. The display portion 8302 is preferably curved because the user can feel high realistic sensation. Another image displayed in another region of the display portion 8302 is viewed through the lenses 8305, so that three-dimensional display using parallax or the like can be performed. Note that the number of display portions 8302 provided is not limited to one; two display portions 8302 may be provided so that one display portion is provided for one eye of the user.

The display device of one embodiment of the present invention can be used for the display portion 8302. The display device of one embodiment of the present invention achieves extremely high resolution. For example, a pixel is not easily seen by the user even when the user sees display that is magnified by the use of the lenses 8305 as illustrated in FIG. 28E. In other words, a video with a strong sense of reality can be seen by the user with use of the display portion 8302.

FIG. 28F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. When the pair of display portions 8404 display different images, three-dimensional display using parallax can be performed.

A user can see display on the display portion 8404 through the lens 8405. The lens 8405 has a focus adjustment mechanism and the focus adjustment mechanism can adjust the position of the lens 8405 according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism to function as a bone conduction earphone. Thus, audio devices such as an earphone and a speaker are not necessarily provided separately, and the user can enjoy images and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic apparatuses illustrated in FIG. 29A to FIG. 29F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic apparatuses illustrated in FIG. 29A to FIG. 29F have a variety of functions. For example, the electronic apparatus can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic apparatuses are not limited thereto, and the electronic apparatuses can have a variety of functions. The electronic apparatuses may include a plurality of display portions. The electronic apparatuses may each be provided with a camera or the like and have a function of taking a still image or a moving image, a function of storing the taken image in a storage medium (an external storage medium or a storage medium incorporated in the camera), a function of displaying the taken image on the display portion, or the like.

The display device of one embodiment of the present invention can be used for the display portion 9001.

The electronic apparatuses illustrated in FIG. 29A to FIG. 29F are described in detail below.

FIG. 29A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 29A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

FIG. 29B is a perspective view illustrating a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

FIG. 29C is a perspective view illustrating a watch-type portable information terminal 9200. For example, the portable information terminal 9200 can be used as a Smart-watch (registered trademark). The display surface of the display portion 9001 is curved, and an image can be displayed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIG. 29D to FIG. 29F are perspective views illustrating a foldable portable information terminal 9201. FIG. 29D is a perspective view of an opened state of the portable information terminal 9201, FIG. 29F is a perspective view of a folded state thereof, and FIG. 29E is a perspective view of a state in the middle of change from one of FIG. 29D and FIG. 29F to the other. The portable information terminal 9201 is highly portable in the folded state and is highly browsable in the opened state because of a seamless large display region. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of any of the structure examples, the drawings corresponding thereto, and the like described in this embodiment can be combined with any of the other structure examples, the other drawings corresponding thereto, and the like as appropriate.

At least part of this embodiment can be implemented in combination with any of the other embodiments described in this specification, as appropriate.

Example

In this example, results of examining electric resistance between conductive layers through the EL layer 114 are shown.

In this example, nine kinds of samples (Sample A1 to Sample A6 and Sample B1 to Sample B3) were fabricated. Each sample includes a light-emitting element and a connection portion.

The light-emitting element included in each sample was formed in such a manner that a hole-injection layer, a hole-transport layer, a light-emitting layer, an electron-transport layer, an electron-injection layer, and a common electrode were sequentially formed over a pixel electrode formed over a glass substrate.

Figure 30:
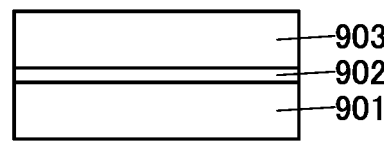
FIG. 30 is a diagram illustrating a structure of samples in Example.

FIG. 30 is a cross-sectional view of a structure of a connection portion 900 included in each sample. The connection portion 900 included in each sample includes a conductive layer 901 over a glass substrate (not illustrated), a layer 902 over the conductive layer 901, and a conductive layer 903 over the layer 902. The conductive layer 901 corresponds to the connection electrode 111C described in Embodiment 1, the layer 902 corresponds to the EL layer 114 described in Embodiment 1, and the conductive layer 903 corresponds to the common electrode 113 described in Embodiment 1. That is, each sample has the structure of the connection portion 130 described in Embodiment 1.

The conductive layer 901 was formed using materials that can be used for the connection electrode 111C. In this example, a stacked-layer structure including an alloy film of silver (Ag), palladium (Pd), and copper (Cu) (an Ag—Pd—Cu (APC) film) and a film of indium tin oxide containing silicon oxide (ITSO) over the APC film was used for the conductive layer 901. The film thickness of the APC film was set to be 100 nm, and the film thickness of the ITSO film was set to be 90 nm. Note that materials, thicknesses, film formation conditions, and the like of the conductive layer 901 were the same in Sample A1 to Sample A6 and Sample B1 to Sample B3.

The layer 902 was formed using materials that can be used for the EL layer 114. In this example, a lithium fluoride (LiF) film was formed as the layer 902. Note that all except for the film thicknesses (materials, film formation conditions, and the like) of the layer 902 were the same in Sample A1 to Sample A6 and Sample B1 to Sample B3.

Each sample has different film thicknesses of the layer 902. Specifically, the film thickness of the layer 902 was set to be 0.1 nm, 0.2 nm, 0.5 nm, 1.0 nm, and 2.0 nm in Sample A2, Sample A3, Sample A4, Sample A5 and Sample B2, and Sample A6 and Sample B3, respectively. Note that the layer 902 was not formed in Sample A1 and Sample B1.

The conductive layer 903 was formed using materials that can be used for the common electrode 113. In this example, a stacked-layer structure including an alloy film of silver and magnesium and an ITO film over the alloy film was used for the conductive layer 903. The film thickness of the alloy film was set to be 8 nm, and the film thickness of the ITO film was set to be 200 nm. Note that materials, thicknesses, film formation conditions, and the like of the conductive layer 903 were the same in Sample A1 to Sample A6 and Sample B1 to Sample B3.

Each sample has a different area of a region where the conductive layer 901 and the conductive layer 903 overlap with each other with the layer 902 therebetween in a top view. Specifically, the area of the region where the conductive layer 901 and the conductive layer 903 overlap with each other with the layer 902 therebetween in the top view is 10.6 μm×10.6 μm (=112.36 μm²=0.00011236 mm²) in Sample A1 to Sample A6, and 400 μm×100 μm (=40000 μm 2=0.04 mm²) in Sample B1 to Sample B3. Hereinafter, the area of the region where the conductive layer 901 and the conductive layer 903 overlap with each other with the layer 902 therebetween in the top view is referred to as the contact area in some cases.

[Measurement Results]

Electric resistance between the conductive layer 901 and the conductive layer 903 with the layer 902 therebetween was measured in Sample A1 to Sample A6 and Sample B1 to Sample B3. Note that the light-emitting element included in each sample exhibits favorable element characteristics.

Figure 31:
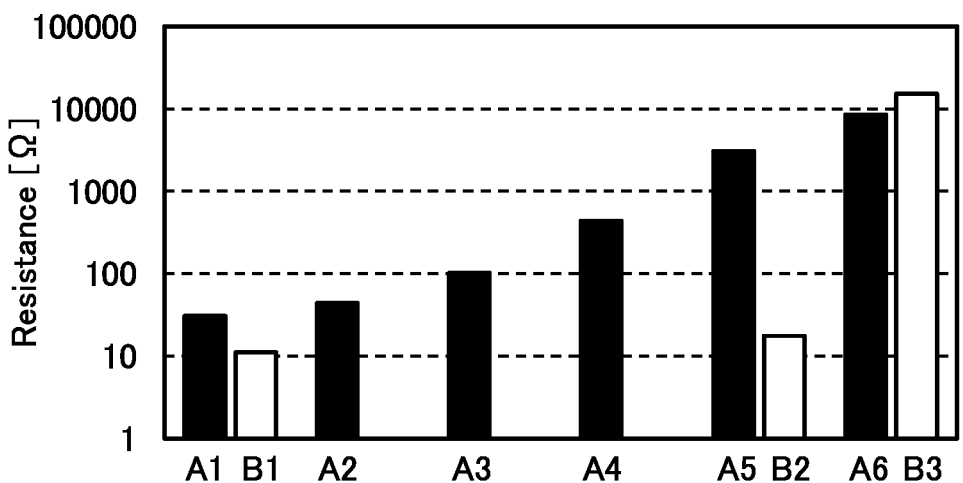
FIG. 31 shows measurement results in Example.

FIG. 31 shows measurement results of electric resistance. In FIG. 31, the horizontal axis represents the sample names, and the vertical axis represents resistance [Ω]. Electric resistance in the connection portion 900 included in each sample is 30.5 Ω, 43.8 Ω, 102 Ω, 437.3 Ω, 3080.3 Ω, 8519.5 Ω, 11 Ω, 17.5Ω, and 15225.8Ω in Sample A1, Sample A2, Sample A3, Sample A4, Sample A5, Sample A6, Sample B1, Sample B2, and Sample B3, respectively.

The electric resistance of Sample B2 is lower than the electric resistance of Sample A1. In addition, the electric resistance of Sample B2 and the electric resistance of Sample B1 are substantially the same. Thus, it can be confirmed that the electric resistance between the connection electrode 111C and the common electrode 113 with the EL layer 114 therebetween can be reduced by increasing the contact area.

As shown in FIG. 31, it is found that the electric resistance becomes smaller as the film thickness of the layer 902 becomes smaller. Thus, it can be confirmed that the electric resistance in the thickness direction of the EL layer 114 can be reduced by decreasing the film thickness of the EL layer 114. In particular, it can be confirmed that the electric resistance in the thickness direction of the EL layer 114 can be reduced in some cases as long as the film thickness of the EL layer 114 is less than 0.5 nm, preferably less than or equal to 0.2 nm even when the contact area is less than 40000 μm² (0.04 mm²).

In this example, Sample C1, in which lithium oxide (Lift$_x$) film was formed for the layer 902, was also prepared. The film thickness of the layer 902 was set to be 0.5 nm. Note that materials, thicknesses, film formation conditions, and the like of the conductive layer 901 in Sample C1 were the same in Sample A1 to Sample A6 and Sample B1 to Sample B3. Materials, thicknesses, film formation conditions, and the like of the conductive layer 903 in Sample C1 were the same in Sample A1 to Sample A6 and Sample B1 to Sample B3. The contact area of Sample C1 was set to be 10.6 μm×10.6 μm (=112.36 μm²=0.0106 mm×0.0106 mm=0.00011236 mm²).

Electric resistance of Sample C1 between the conductive layer 901 and the conductive layer 903 with the layer 902 therebetween was measured. The electric resistance in the connection portion 900 included in Sample C1 is 68.5Ω. A light-emitting element included in Sample C1 exhibits favorable element characteristics.

Therefore, in the case of using lithium oxide for the EL layer 114, it can be confirmed that the electric resistance in the thickness direction of the EL layer 114 can be reduced in some cases as long as the film thickness of the EL layer 114 is less than or equal to 0.5 nm even when the contact area is less than 40000 μm² (0.04 mm²).

REFERENCE NUMERALS

20: light-emitting element, 21: lower electrode, 23: EL layer, 23*a*: EL layer, 23*b*: EL layer, 25: upper electrode, 100: display device, 100A: display device, 100B: display device, 100C: display device, 100D: display device, 100E: display device, 100F: display device, 100G: display device, 100H: display device, 100I: display device, 100J: display device, 100K: display device, 101: substrate, 102: insulating layer, 105: display region, 110: light-emitting element, 110B: light-emitting element, 110G: light-emitting element, 110R: light-emitting element, 111: pixel electrode, 111B: pixel electrode, 111C: connection electrode, 111G: pixel electrode, 111R: pixel electrode, 112: EL layer, 112B: EL layer, 112G: EL layer, 112Gf: EL film, 112R: EL layer, 112Rf: EL film, 113: common electrode, 114: EL layer, 115B: optical adjustment layer, 115G: optical adjustment layer, 115R: optical adjustment layer, 121: protective layer, 122: gap, 130: connection portion, 131: insulating layer, 143a: resist mask, 143b: resist mask, 143d: resist mask, 144a: sacrificial film, 144b: sacrificial film, 145a: sacrificial layer, 145b: sacrificial layer, 145c: sacrificial layer, 146a: protective film, 146b: protective film, 147a: protective layer, 147b: protective layer, 201: transistor, 202: transistor, 204: connection portion, 205: transistor, 209: transistor, 210: transistor, 211: insulating layer, 212: insulating layer, 213: insulating layer, 214: insulating layer, 215: insulating layer, 218: insulating layer, 221: conductive layer, 222a: conductive layer, 222b: conductive layer, 223: conductive layer, 225: insulating layer, 228: region, 231: semiconductor layer, 231i: channel formation region, 231n: low-resistance region, 240: capacitor, 241: conductive layer, 242: connection layer, 243: insulating layer, 245: conductive layer, 251: conductive layer, 252: conductive layer, 254: insulating layer, 255: insulating layer, 256: plug, 261: insulating layer, 262: insulating layer, 263: insulating layer, 264: insulating layer, 265: insulating layer, 271: plug, 274: plug, 274a: conductive layer, 274b: conductive layer, 280: display module, 281: display portion, 282: circuit portion, 283: pixel circuit portion, 283a: pixel circuit, 284: pixel portion, 284a: pixel, 285: terminal portion, 286: wiring portion, 290: FPC, 291: substrate, 292: substrate, 301: substrate, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 400A: display device, 400B: display device, 400C: display device, 400D: display device, 400E: display device, 401: stacked-layer structure, 411a: pixel electrode, 411b: pixel electrode, 411c: pixel electrode, 416: protective layer, 416a: inorganic insulating layer, 416b: organic insulating layer, 416c: inorganic insulating layer, 417: light-blocking layer, 419: resin layer, 420: substrate, 421: insulating layer, 426a: optical adjustment layer, 426b: optical adjustment layer, 426c: optical adjustment layer, 430a: light-emitting element, 430b: light-emitting element, 430c: light-emitting element, 442: adhesive layer, 443: space, 451: substrate, 452: substrate, 453: substrate, 454: substrate, 455: adhesive layer, 462: display portion, 464: circuit, 465: wiring, 466: conductive layer, 472: FPC, 473: IC, 900: connection portion, 901: conductive layer, 902: layer, 903: conductive layer, 4411: light-emitting layer, 4412: light-emitting layer, 4413: light-emitting layer, 4420: layer, 4420-1: layer, 4420-2: layer, 4430: layer, 4430-1: layer, 4430-2: layer, 4440: intermediate layer, 6500: electronic apparatus, 6501: housing, 6502: display portion, 6503: power source button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:
a display portion comprising a first light-emitting element and a second light-emitting element arranged side by side; and
a connection portion outside the display portion,
wherein the first light-emitting element comprises a first pixel electrode, a first EL layer over the first pixel electrode, a second EL layer over the first EL layer, and a common electrode over the second EL layer,
wherein the second light-emitting element comprises a second pixel electrode, a third EL layer over the second pixel electrode, the second EL layer over the third EL layer, and the common electrode over the third EL layer,
wherein the connection portion comprises a connection electrode, the second EL layer over the connection electrode, and the common electrode over the second EL layer,
wherein the second EL layer comprises a region where a film thickness is greater than or equal to 0.5 nm and less than or equal to 1.5 nm,
wherein the second EL layer comprises a substance with a high electron-injection property, and
wherein in a plan view, the connection electrode comprises a region provided along the first pixel electrode and the second pixel electrode.

2. A display device comprising:
a display portion comprising a first light-emitting element and a second light-emitting element arranged side by side; and
a connection portion outside the display portion,
wherein the first light-emitting element comprises a first pixel electrode, an insulating layer over the first pixel electrode, a first EL layer over the first pixel electrode and over the insulating layer, a second EL layer over the first EL layer, and a common electrode over the second EL layer, wherein the second light-emitting element comprises a second pixel electrode, the insulating layer over the second pixel electrode, a third EL layer over the second pixel electrode, the second EL layer over the third EL layer, and the common electrode over the third EL layer, wherein the connection portion comprises a connection electrode, the insulating layer over the connection electrode, the second EL layer over the connection electrode and over the insulating layer, and the common electrode over the second EL layer, wherein the second EL layer comprises a region where a film thickness is greater than or equal to 0.5 nm and less than or equal to 1.5 nm, wherein the second EL layer comprises a substance with a high electron-injection property, and wherein in a plan view, the connection electrode comprises a region provided along at least two sides of an outer periphery of the display portion.

3. The display device according to claim 2, wherein the first EL layer comprises a region in contact with the first pixel electrode through an opening included in the insulating layer.

4. The display device according to claim 1, wherein the first EL layer comprises a light-emitting compound, and wherein the second EL layer comprises lithium fluoride.

5. The display device according to claim 1, wherein the connection portion comprises a top-surface shape with a comb-like shape or a slit.

6. The display device according to claim 2, wherein the first EL layer comprises a light-emitting compound, and wherein the second EL layer comprises lithium fluoride.

7. The display device according to claim 2, wherein the connection portion comprises a top-surface shape with a comb-like shape or a slit.

8. The display device according to claim 1, wherein an area of a region where the second EL layer is in contact with a top surface of the connection electrode and a bottom surface of the common electrode is greater than or equal to 40000 $\mu m^2$.

9. The display device according to claim 2, wherein an area of a region where the second EL layer is in contact with a top surface of the connection electrode and a bottom surface of the common electrode is greater than or equal to 40000 $\mu m^2$.

* * * * *